United States Patent
Yamazaki et al.

(10) Patent No.: US 11,963,374 B2
(45) Date of Patent: *Apr. 16, 2024

(54) SEMICONDUCTOR DEVICE

(71) Applicant: Semiconductor Energy Laboratory Co., Ltd., Atsugi (JP)

(72) Inventors: Shunpei Yamazaki, Tokyo (JP); Jun Koyama, Kanagawa (JP); Kiyoshi Kato, Kanagawa (JP)

(73) Assignee: Semiconductor Energy Laboratory Co., Ltd., Atsugi (JP)

(*) Notice: Subject to any disclaimer, the term of this patent is extended or adjusted under 35 U.S.C. 154(b) by 0 days.

This patent is subject to a terminal disclaimer.

(21) Appl. No.: 17/582,092

(22) Filed: Jan. 24, 2022

(65) Prior Publication Data

US 2022/0149045 A1  May 12, 2022

Related U.S. Application Data

(60) Continuation of application No. 16/944,289, filed on Jul. 31, 2020, now Pat. No. 11,322,498, which is a
(Continued)

(30) Foreign Application Priority Data

Oct. 30, 2009 (JP) ................................. 2009-251261

(51) Int. Cl.
*H10B 99/00* (2023.01)
*G11C 11/405* (2006.01)
(Continued)

(52) U.S. Cl.
CPC ............ *H10B 99/00* (2023.02); *G11C 11/405* (2013.01); *G11C 16/0433* (2013.01);
(Continued)

(58) Field of Classification Search
CPC .............. H01L 27/1225; H01L 27/124; H01L 27/1255; H01L 29/16; H01L 29/24;
(Continued)

(56) References Cited

U.S. PATENT DOCUMENTS

| 4,466,081 A | 8/1984 | Masuoka |
| 4,902,637 A | 2/1990 | Kondou et al. |

(Continued)

FOREIGN PATENT DOCUMENTS

| CN | 001389927 A | 1/2003 |
| CN | 001930691 A | 3/2007 |

(Continued)

OTHER PUBLICATIONS

International Search Report (Application No. PCT/JP2010/068647) dated Dec. 28, 2010.
(Continued)

*Primary Examiner* — Thanh Y. Tran
(74) *Attorney, Agent, or Firm* — Fish & Richardson P.C.

(57) ABSTRACT

An object is to provide a semiconductor device with a novel structure. The semiconductor device includes a first wiring; a second wiring; a third wiring; a fourth wiring; a first transistor having a first gate electrode, a first source electrode, and a first drain electrode; and a second transistor having a second gate electrode, a second source electrode, and a second drain electrode. The first transistor is provided in a substrate including a semiconductor material. The second transistor includes an oxide semiconductor layer.

15 Claims, 27 Drawing Sheets

Related U.S. Application Data continuation of application No. 16/558,386, filed on Sep. 3, 2019, now Pat. No. 10,811,417, which is a continuation of application No. 15/615,873, filed on Jun. 7, 2017, now Pat. No. 10,510,757, which is a continuation of application No. 15/175,190, filed on Jun. 7, 2016, now Pat. No. 9,685,447, which is a continuation of application No. 14/804,478, filed on Jul. 21, 2015, now Pat. No. 9,373,640, which is a continuation of application No. 14/336,107, filed on Jul. 21, 2014, now Pat. No. 9,105,511, which is a division of application No. 12/914,672, filed on Oct. 28, 2010, now Pat. No. 8,896,042.

(51) Int. Cl.
| | |
|---|---|
| *G11C 16/04* | (2006.01) |
| *H01L 27/105* | (2023.01) |
| *H01L 27/118* | (2006.01) |
| *H01L 27/12* | (2006.01) |
| *H01L 29/16* | (2006.01) |
| *H01L 29/24* | (2006.01) |
| *H01L 29/786* | (2006.01) |
| *H10B 41/20* | (2023.01) |
| *H10B 41/70* | (2023.01) |
| *H10B 69/00* | (2023.01) |
| *H01L 21/822* | (2006.01) |
| *H01L 27/06* | (2006.01) |
| *H01L 29/78* | (2006.01) |
| *H10B 12/00* | (2023.01) |

(52) U.S. Cl.
CPC ...... *H01L 27/105* (2013.01); *H01L 27/11803* (2013.01); *H01L 27/1207* (2013.01); *H01L 27/1225* (2013.01); *H01L 27/124* (2013.01); *H01L 27/1255* (2013.01); *H01L 29/16* (2013.01); *H01L 29/24* (2013.01); *H01L 29/247* (2013.01); *H01L 29/7869* (2013.01); *H01L 29/78693* (2013.01); *H01L 29/78696* (2013.01); *H10B 41/20* (2023.02); *H10B 41/70* (2023.02); *H10B 69/00* (2023.02); *G11C 2211/4016* (2013.01); *H01L 21/8221* (2013.01); *H01L 27/0688* (2013.01); *H01L 29/7833* (2013.01); *H10B 12/00* (2023.02)

(58) Field of Classification Search
CPC .......... H01L 29/7869; H01L 29/78696; H01L 27/0688; H01L 29/7833
See application file for complete search history.

(56) References Cited

U.S. PATENT DOCUMENTS

| | | | |
|---|---|---|---|
| 5,349,366 | A | 9/1994 | Yamazaki et al. |
| 5,366,922 | A | 11/1994 | Aoki et al. |
| 5,731,856 | A | 3/1998 | Kim et al. |
| 5,744,864 | A | 4/1998 | Cillessen et al. |
| 5,796,650 | A | 8/1998 | Wik et al. |
| 5,815,436 | A | 9/1998 | Tanaka et al. |
| 5,851,866 | A | 12/1998 | Son |
| 5,936,881 | A | 8/1999 | Kawashima et al. |
| 5,943,270 | A | 8/1999 | Borkar |
| 6,046,926 | A | 4/2000 | Tanaka et al. |
| 6,266,269 | B1 | 7/2001 | Karp et al. |
| 6,294,274 | B1 | 9/2001 | Kawazoe et al. |
| 6,314,016 | B1 | 11/2001 | Takasu |
| 6,314,017 | B1 | 11/2001 | Emori et al. |
| 6,353,553 | B1 | 3/2002 | Tamada et al. |
| 6,563,174 | B2 | 5/2003 | Kawasaki et al. |
| 6,570,206 | B1 | 5/2003 | Sakata et al. |
| 6,621,130 | B2 | 9/2003 | Kurokawa et al. |
| 6,628,551 | B2 | 9/2003 | Jain |
| 6,727,522 | B1 | 4/2004 | Kawasaki et al. |
| 6,765,825 | B1 | 7/2004 | Scott |
| 6,787,835 | B2 | 9/2004 | Atwood et al. |
| 6,808,971 | B2 | 10/2004 | Bhattacharyya |
| 6,873,009 | B2 | 3/2005 | Hisamoto et al. |
| 6,949,782 | B2 | 9/2005 | Atwood et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al. |
| 7,230,601 | B2 | 6/2007 | Yamazaki et al. |
| 7,268,387 | B2 | 9/2007 | Kurokawa et al. |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,375,399 | B2 | 5/2008 | Ishii et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,411,236 | B2 | 8/2008 | Matsuzawa |
| 7,453,065 | B2 | 11/2008 | Saito et al. |
| 7,453,087 | B2 | 11/2008 | Iwasaki |
| 7,459,743 | B2 | 12/2008 | Mandelman et al. |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,573,083 | B2 | 8/2009 | Kijima et al. |
| 7,598,520 | B2 | 10/2009 | Hirao et al. |
| 7,601,984 | B2 | 10/2009 | Sano et al. |
| 7,623,372 | B2 | 11/2009 | Kouno |
| 7,674,650 | B2 | 3/2010 | Akimoto et al. |
| 7,687,331 | B2 | 3/2010 | Kim et al. |
| 7,732,819 | B2 | 6/2010 | Akimoto et al. |
| 7,732,847 | B2 | 6/2010 | Tanaka et al. |
| 7,741,644 | B2 | 6/2010 | Lyu et al. |
| 7,790,530 | B2 | 9/2010 | Mandelman et al. |
| 7,791,074 | B2 | 9/2010 | Iwasaki |
| 7,847,287 | B2 | 12/2010 | Kim et al. |
| 7,884,360 | B2 | 2/2011 | Takechi et al. |
| 7,935,582 | B2 | 5/2011 | Iwasaki |
| 7,956,361 | B2 | 6/2011 | Iwasaki |
| 7,993,964 | B2 | 8/2011 | Hirao et al. |
| 8,137,594 | B2 | 3/2012 | Imanishi et al. |
| 8,154,024 | B2 | 4/2012 | Iwasaki |
| 8,158,978 | B2 | 4/2012 | Kim et al. |
| 8,202,365 | B2 | 6/2012 | Umeda et al. |
| 8,212,248 | B2 | 7/2012 | Itagaki et al. |
| 8,232,598 | B2 | 7/2012 | Yamazaki et al. |
| 8,314,420 | B2 | 11/2012 | Hoffman et al. |
| 8,319,218 | B2 | 11/2012 | Yamazaki et al. |
| 8,324,628 | B2 | 12/2012 | Kim et al. |
| 8,363,452 | B2 | 1/2013 | Yamazaki et al. |
| 8,384,077 | B2 | 2/2013 | Yano et al. |
| 8,420,442 | B2 | 4/2013 | Takechi et al. |
| 8,604,547 | B2 | 12/2013 | Yukawa et al. |
| 8,664,035 | B2 | 3/2014 | Yukawa et al. |
| 8,704,217 | B2 | 4/2014 | Yano et al. |
| 8,889,480 | B2 | 11/2014 | Takechi et al. |
| 8,896,042 | B2 | 11/2014 | Yamazaki et al. |
| 9,105,511 | B2 | 8/2015 | Yamazaki et al. |
| 9,209,026 | B2 | 12/2015 | Takechi et al. |
| 9,373,640 | B2 * | 6/2016 | Yamazaki ......... H01L 27/11803 |
| 10,510,757 | B2 * | 12/2019 | Yamazaki ........... H01L 29/7869 |
| 11,322,498 | B2 * | 5/2022 | Yamazaki ......... H01L 29/78696 |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2002/0158829 | A1 | 10/2002 | Yamazaki et al. |
| 2002/0182756 | A1 | 12/2002 | Kang |
| 2003/0016555 | A1 | 1/2003 | Kubota et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0073871 | A1 | 4/2005 | Luk et al. |

(56) References Cited

U.S. PATENT DOCUMENTS

| | | |
|---|---|---|
| 2005/0185474 A1 | 8/2005 | Atwood et al. |
| 2005/0199959 A1 | 9/2005 | Chiang et al. |
| 2005/0237786 A1 | 10/2005 | Atwood et al. |
| 2005/0280000 A1 | 12/2005 | Ishii et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0047293 A1 | 3/2007 | Mandelman et al. |
| 2007/0052025 A1 | 3/2007 | Yabuta |
| 2007/0054507 A1 | 3/2007 | Kaji et al. |
| 2007/0081380 A1 | 4/2007 | Atwood et al. |
| 2007/0090365 A1 | 4/2007 | Hayashi et al. |
| 2007/0108446 A1 | 5/2007 | Akimoto |
| 2007/0126042 A1 | 6/2007 | Kijima et al. |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0170028 A1 | 7/2008 | Yoshida |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0315193 A1 | 12/2008 | Kim et al. |
| 2009/0002590 A1 | 1/2009 | Kimura |
| 2009/0008638 A1 | 1/2009 | Kang et al. |
| 2009/0020753 A1 | 1/2009 | Jeong et al. |
| 2009/0045397 A1 | 2/2009 | Iwasaki |
| 2009/0047756 A1 | 2/2009 | Mandelman et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0155940 A1 | 6/2009 | Lee et al. |
| 2009/0166616 A1 | 7/2009 | Uchiyama |
| 2009/0189153 A1 | 7/2009 | Iwasaki et al. |
| 2009/0242992 A1 | 10/2009 | Kim et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0097838 A1 | 4/2010 | Tanaka et al. |
| 2010/0109002 A1 | 5/2010 | Itagaki et al. |
| 2010/0109004 A1 | 5/2010 | Arai |
| 2010/0140614 A1 | 6/2010 | Uchiyama et al. |
| 2010/0193785 A1 | 8/2010 | Kimura |
| 2010/0276685 A1 | 11/2010 | Itagaki et al. |
| 2010/0276689 A1 | 11/2010 | Iwasaki |
| 2010/0279462 A1 | 11/2010 | Iwasaki |
| 2011/0089417 A1 | 4/2011 | Yamazaki et al. |
| 2011/0101332 A1 | 5/2011 | Yamazaki et al. |
| 2011/0101334 A1 | 5/2011 | Yamazaki et al. |
| 2011/0101351 A1 | 5/2011 | Yamazaki |
| 2011/0101352 A1 | 5/2011 | Hosono et al. |
| 2011/0122670 A1 | 5/2011 | Yamazaki et al. |
| 2011/0201162 A1 | 8/2011 | Hosono et al. |
| 2012/0012838 A1 | 1/2012 | Hosono et al. |
| 2013/0062601 A1 | 3/2013 | Yamazaki et al. |
| 2013/0140558 A1 | 6/2013 | Yamazaki et al. |
| 2013/0292671 A1 | 11/2013 | Yamazaki et al. |
| 2014/0175437 A1 | 6/2014 | Uchiyama |

FOREIGN PATENT DOCUMENTS

| | | |
|---|---|---|
| CN | 101258607 A | 9/2008 |
| EP | 1737044 A | 12/2006 |
| EP | 1883109 A | 1/2008 |
| EP | 2017881 A | 1/2009 |
| EP | 2226847 A | 9/2010 |
| EP | 2246894 A | 11/2010 |
| EP | 2339639 A | 6/2011 |
| EP | 2413366 A | 2/2012 |
| JP | 57-105889 A | 7/1982 |
| JP | 60-198861 A | 10/1985 |
| JP | 62-203359 A | 9/1987 |
| JP | 62-274773 A | 11/1987 |
| JP | 63-070558 A | 3/1988 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-119298 A | 5/1993 |
| JP | 05-251705 A | 9/1993 |
| JP | 08-264794 A | 10/1996 |
| JP | 10-284696 A | 10/1998 |
| JP | 11-505377 | 5/1999 |
| JP | 2000-044236 A | 2/2000 |
| JP | 2000-150900 A | 5/2000 |
| JP | 2001-028443 A | 1/2001 |
| JP | 2001-053167 A | 2/2001 |
| JP | 2001-093988 A | 4/2001 |
| JP | 2002-076356 A | 3/2002 |
| JP | 2002-093924 A | 3/2002 |
| JP | 2002-289859 A | 10/2002 |
| JP | 2002-319682 A | 10/2002 |
| JP | 2002-328617 A | 11/2002 |
| JP | 2002-368226 A | 12/2002 |
| JP | 2003-017591 A | 1/2003 |
| JP | 2003-037249 A | 2/2003 |
| JP | 2003-086000 A | 3/2003 |
| JP | 2003-086808 A | 3/2003 |
| JP | 2004-014094 A | 1/2004 |
| JP | 2004-103957 A | 4/2004 |
| JP | 2004-265944 A | 9/2004 |
| JP | 2004-273614 A | 9/2004 |
| JP | 2004-273732 A | 9/2004 |
| JP | 2005-093633 A | 4/2005 |
| JP | 2006-012878 A | 1/2006 |
| JP | 2006-502597 | 1/2006 |
| JP | 2006-066489 A | 3/2006 |
| JP | 2006-066490 A | 3/2006 |
| JP | 2006-165532 A | 6/2006 |

(56) References Cited

FOREIGN PATENT DOCUMENTS

| | | |
|---|---|---|
| JP | 2007-027393 A | 2/2007 |
| JP | 2007-042172 A | 2/2007 |
| JP | 2007-103918 A | 4/2007 |
| JP | 2007-157982 A | 6/2007 |
| JP | 2007-220820 A | 8/2007 |
| JP | 2007-250044 A | 9/2007 |
| JP | 2008-042088 A | 2/2008 |
| JP | 2008-216529 A | 9/2008 |
| JP | 2008-270259 A | 11/2008 |
| JP | 2008-277665 A | 11/2008 |
| JP | 2009-010348 A | 1/2009 |
| JP | 2009-016844 A | 1/2009 |
| JP | 2009-021536 A | 1/2009 |
| JP | 2009-033145 A | 2/2009 |
| JP | 2009-506526 | 2/2009 |
| JP | 2009-057605 A | 3/2009 |
| JP | 2009-094492 A | 4/2009 |
| JP | 2009-135350 A | 6/2009 |
| JP | 2009-158663 A | 7/2009 |
| JP | 2009-164393 A | 7/2009 |
| JP | 2009-167087 A | 7/2009 |
| JP | 2009-182194 A | 8/2009 |
| JP | 2009-528670 | 8/2009 |
| JP | 2009-212443 A | 9/2009 |
| JP | 2011-100979 A | 5/2011 |
| JP | 2011-109079 A | 6/2011 |
| JP | 2011-129888 A | 6/2011 |
| KR | 2009-0103610 A | 10/2009 |
| TW | 200717776 | 5/2007 |
| TW | 200826280 | 6/2008 |
| TW | 200941727 | 10/2009 |
| WO | WO-2000/070683 | 11/2000 |
| WO | WO-2001/073846 | 10/2001 |
| WO | WO-2004/075297 | 9/2004 |
| WO | WO-2004/114391 | 12/2004 |
| WO | WO-2005/088726 | 9/2005 |
| WO | WO-2005/093846 | 10/2005 |
| WO | WO-2006/085633 | 8/2006 |
| WO | WO-2007/023011 | 3/2007 |
| WO | WO-2007/029844 | 3/2007 |
| WO | WO-2007/142167 | 12/2007 |
| WO | WO-2009/034953 | 3/2009 |
| WO | WO-2009/087943 | 7/2009 |
| WO | WO-2011/043176 | 4/2011 |
| WO | WO-2011/048929 | 4/2011 |
| WO | WO-2011/055660 | 5/2011 |

OTHER PUBLICATIONS

Written Opinion (Application No. PCT/JP2010/068647) dated Dec. 28, 2010.

Ishii.T et al., "A Poly-Silicon TFT With a Sub-5-nm Thick Channel for Low-Power Gain Cell Memory in Mobile Applications", IEEE Transactions On Electron Devices, Nov. 1, 2004, vol. 51, No. 11, pp. 1805-1810.

Atwood .B et al., "SESO Memory: A CMOS compatible high density embedded memory technology for mobile applications", 2002 Symposium On VLSI Circuits Digest of Technical Papers , Jun. 13, 2002, pp. 154-155.

Kameshiro.N et al., "A Fully Logic-Process-Compatible, 3-Transistor, SESO-memory Cell Featuring 0.1-FIT/Mb Soft Error, 100-MHz Random Cycle, and 100-ms Retention", 2008 Symposium on VLSI Circuits Digest of Technical Papers, Aug. 1, 2008, pp. 122-123.

Asakuma.N et al., "Crystallization and Reduction of Sol-Gel-Derived Zinc Oxide Films By Irradiation With Ultraviolet Lamp", Journal of Sol-Gel Science and Technology, 2003, vol. 26, pp. 181-184.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions On Electron Devices, Jul. 1, 1995, vol. 42, No. 7, pp. 1240-1246.

Cho.D et al., "21.2:AL and SN-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition: the "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RRCPUS On Glass and Plastic Substrates Fabricated By TFT Transfer Technology", IEDM 05: Technical Digest of International Electron Devices Meeting, Dec. 5, 2005, pp. 1067-1069.

Fortunato.E et al., "Wide-Bandgap High-Mobility Zno Thin-Film Transistors Produced At Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga-Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis On Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Hirao.T et al., "Novel Top-Gate Zinc Oxide Thin-Film Transistors (Zno TFTS) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects In ZnO", Phys. Rev. B (Physical Review. B), Oct. 4, 2007, vol. 76, No. 16, pp. 165202-1-165202-22.

Janotti.A et al., "Oxygen Vacancies In ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5') Flexible Full Color Top Emission AMOLED Display On Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

(56) References Cited

OTHER PUBLICATIONS

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimuzuka.N et al., "Spinel, YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu, or Zn] At Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa. Y et al., "UHF RFCPUS On Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status Of, Challenges To, and Perspective View of AM-OLED ", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors By DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics On Their Way To Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3-Ga2ZnO4-ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", Nirim Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

NomuraA.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of Zno Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTS With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTS and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure To Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors By Ar Plasma Treatment", Appl. Phys. Lett. (Applied Physics Letters) , Jun. 26, 2007, vol. 90, No. 26, pp. 262106-1-262106-3.

Park.S et al., "Challenge To Future Displays: Transparent AM-OLED Driven By Peald Grown Zno TFT", IMID '07 Digest, 2007, pp. 1249-1252.

Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

(56) References Cited

OTHER PUBLICATIONS

Sakata.J et al., "Development of 4.0-In. AMOLED Display With Driver Circuit Using Amorphous In—Ga—Zn-Oxide TFTS", IDW '09 : Proceedings of the 16th International Display Workshops, 2009, pp. 689-692.

Son.K et al., "42.4L: Late-News Paper: 4 Inch QVGA AMOLED Driven By the Threshold Voltage Controlled Amorphous Gizo (Ga2O3-In2O3-ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor On SrTiO3 With Sputtered Al2O3 Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Chinese Office Action (Application No. 201080041924.6) dated Mar. 25, 2014.

European Search Report (Application No. 10826620.6) dated Apr. 28, 2014.

Ito.M, "Evaluate oxide semiconductor TFT. Basic technology was established, application is a key of practical use.", Nikkei Microdevices, Apr. 1, 2009, No. 286, pp. 53-58.

Chinese Office Action (Application No. 201080041924.6) dated Dec. 2, 2014.

Taiwanese Office Action (Application No. 099136940) dated Apr. 1, 2015.

Korean Office Action (Application No. 2012-7010574) dated Oct. 17, 2016.

\* cited by examiner

SEMICONDUCTOR DEVICE

CROSS-REFERENCE TO RELATED APPLICATIONS

This application is a continuation of U.S. application Ser. No. 16/944,289, filed Jul. 31, 2020, now allowed, which is a continuation of U.S. application Ser. No. 16/558,386, filed Sep. 3, 2019, now U.S. Pat. No. 10,811,417, which is a continuation of U.S. application Ser. No. 15/615,873, filed Jun. 7, 2017, now U.S. Pat. No. 10,510,757, which is a continuation of U.S. application Ser. No. 15/175,190, filed Jun. 7, 2016, now U.S. Pat. No. 9,685,447, which is a continuation of U.S. application Ser. No. 14/804,478, filed Jul. 21, 2015, now U.S. Pat. No. 9,373,640, which is a continuation of U.S. application Ser. No. 14/336,107, filed Jul. 21, 2014, now U.S. Pat. No. 9,105,511, which is a divisional of U.S. application Ser. No. 12/914,672, filed Oct. 28, 2010, now U.S. Pat. No. 8,896,042, which claims the benefit of a foreign priority application filed in Japan as Serial No. 2009-251261 on Oct. 30, 2009, all of which are incorporated by reference.

TECHNICAL FIELD

The invention disclosed herein relates to a semiconductor device using a semiconductor element and a method for manufacturing the semiconductor device.

BACKGROUND ART

Storage devices using semiconductor elements are broadly classified into two categories: a volatile device that loses stored data when power supply stops, and a non-volatile device that retains stored data even when power is not supplied.

A typical example of a volatile storage device is a DRAM (dynamic random access memory). A DRAM stores data in such a manner that a transistor included in a storage element is selected and electric charge is stored in a capacitor.

When data is read from a DRAM, electric charge in a capacitor is lost on the above-described principle; thus, another writing operation is necessary every time data is read out. Moreover, a transistor included in a storage element has a leakage current and electric charge flows into or out of a capacitor even when the transistor is not selected, so that the data holding time is short. For that reason, another writing operation (refresh operation) is necessary at predetermined intervals, and it is difficult to sufficiently reduce power consumption. Furthermore, since stored data is lost when power supply stops, an additional storage device using a magnetic material or an optical material is needed in order to hold the data for a long time.

Another example of a volatile storage device is an SRAM (static random access memory). An SRAM retains stored data by using a circuit such as a flip-flop and thus does not need refresh operation. This means that an SRAM has an advantage over a DRAM. However, cost per storage capacity is increased because a circuit such as a flip-flop is used. Moreover, as in a DRAM, stored data in an SRAM is lost when power supply stops.

A typical example of a non-volatile storage device is a flash memory. A flash memory includes a floating gate between a gate electrode and a channel formation region in a transistor and stores data by holding electric charge in the floating gate. Therefore, a flash memory has advantages in that the data holding time is extremely long (almost permanent) and refresh operation which is necessary in a volatile storage device is not needed (e.g., see Patent Document 1).

However, a gate insulating layer included in a storage element deteriorates by tunneling current generated in writing, so that the storage element stops its function after a predetermined number of writing operations. In order to reduce adverse effects of this problem, a method in which the numbers of writing operations for storage elements are equalized is employed, for example. However, a complicated peripheral circuit is needed to realize this method. Moreover, employing such a method does not solve the fundamental problem of lifetime. In other words, a flash memory is not suitable for applications in which data is frequently rewritten.

In addition, high voltage is necessary for holding electric charge in the floating gate or removing the electric charge. Further, it takes a relatively long time to hold or remove electric charge, and it is not easy to perform writing and erasing at higher speed.

REFERENCE

Patent Document 1: Japanese Published Patent Application No. S57-105889

DISCLOSURE OF INVENTION

In view of the foregoing problems, an object of one embodiment of the invention disclosed herein is to provide a semiconductor device with a novel structure in which stored data can be retained even when power is not supplied, and there is no limitation on the number of writing.

One embodiment of the present invention is a semiconductor device having a layered structure of a transistor formed using an oxide semiconductor and a transistor formed using a material other than the oxide semiconductor. The following structures can be employed, for example.

According to one embodiment of the present invention, a semiconductor device includes a first wiring, a second wiring, a third wiring, a fourth wiring, a fifth wiring, and a plurality of storage elements connected in parallel between the first wiring and the second wiring. One of the plurality of storage elements includes a first transistor having a first gate electrode, a first source electrode, and a first drain electrode; a second transistor having a second gate electrode, a second source electrode, and a second drain electrode; and a third transistor having a third gate electrode, a third source electrode, and a third drain electrode. The first transistor is provided in a substrate including a semiconductor material. The second transistor includes an oxide semiconductor layer. The first gate electrode and one of the second source electrode and the second drain electrode are electrically connected to each other. The first wiring and the first source electrode are electrically connected to each other. The first drain electrode and the third source electrode are electrically connected to each other. The second wiring and the third drain electrode are electrically connected to each other. The third wiring and the other of the second source electrode and the second drain electrode are electrically connected to each other. The fourth wiring and the second gate electrode are electrically connected to each other. The fifth wiring and the third gate electrode are electrically connected to each other.

According to one embodiment of the present invention, a semiconductor device includes a first wiring, a second wiring, a third wiring, a fourth wiring, a fifth wiring, and a plurality of storage elements connected in parallel between the first wiring and the second wiring. One of the plurality of storage elements includes a first transistor having a first gate electrode, a first source electrode, and a first drain electrode; a second transistor having a second gate electrode, a second source electrode, and a second drain electrode; and a capacitor. The first transistor is provided in a substrate including a semiconductor material. The second transistor includes an oxide semiconductor layer. The first gate electrode, one of the second source electrode and the second drain electrode, and one of electrodes of the capacitor are electrically connected to each other. The first wiring and the first source electrode are electrically connected to each other. The second wiring and the first drain electrode are electrically connected to each other. The third wiring and the other of the second source electrode and the second drain electrode are electrically connected to each other. The fourth wiring and the second gate electrode are electrically connected to each other. The fifth wiring and the other of the electrodes of the capacitor are electrically connected to each other.

In any of the above structures, the first transistor may include a channel formation region provided in the substrate including the semiconductor material, impurity regions provided so as to sandwich the channel formation region, a first gate insulating layer over the channel formation region, the first gate electrode over the first gate insulating layer, and the first source electrode and the first drain electrode electrically connected to the impurity regions.

In any of the above structures, the second transistor may include the second gate electrode over the substrate including the semiconductor material, a second gate insulating layer over the second gate electrode, the oxide semiconductor layer over the second gate insulating layer, and the second source electrode and the second drain electrode electrically connected to the oxide semiconductor layer.

In any of the above structures, the third transistor may include a channel formation region provided in the substrate including the semiconductor material, impurity regions provided so as to sandwich the channel formation region, a third gate insulating layer over the channel formation region, the third gate electrode over the third gate insulating layer, and the third source electrode and the third drain electrode electrically connected to the impurity regions.

In any of the above structures, a single crystal semiconductor substrate or an SOI substrate is preferably used as the substrate including the semiconductor material. In particular, silicon is preferably used as the semiconductor material.

In any of the above structures, the oxide semiconductor layer is preferably formed using an In—Ga—Zn—O-based oxide semiconductor material. More preferably, the oxide semiconductor layer includes a crystal of $In_2Ga_2ZnO_7$. Moreover, the concentration of hydrogen in the oxide semiconductor layer is preferably $5 \times 10^{19}/cm^3$ or less. The off-state current of the second transistor is preferably $1 \times 10^{-13}$ A or less.

In any of the above structures, the second transistor can be provided in a region overlapping with the first transistor.

Note that in this specification and the like, the term such as "over" or "below" does not necessarily mean that a component is placed "directly on" or "directly under" another component. For example, the expression "a first gate electrode over a gate insulating layer" does not exclude the case where a component is placed between the gate insulating layer and the gate electrode. Moreover, the terms such as "over" and "below" are only used for convenience of description and can include the case where the relation of components is reversed, unless otherwise specified.

In addition, in this specification and the like, the term such as "electrode" or "wiring" does not limit a function of a component. For example, an "electrode" is sometimes used as part of a "wiring", and vice versa. Furthermore, the term "electrode" or "wiring" can include the case where a plurality of "electrodes" or "wirings" are formed in an integrated manner.

Functions of a "source" and a "drain" are sometimes replaced with each other when a transistor of opposite polarity is used or when the direction of current flowing is changed in circuit operation, for example. Therefore, the terms "source" and "drain" can be replaced with each other in this specification and the like.

Note that in this specification and the like, the term "electrically connected" includes the case where components are connected through an object having any electric function. There is no particular limitation on an object having any electric function as long as electric signals can be transmitted and received between components that are connected through the object.

Examples of an object having any electric function are a switching element such as a transistor, a resistor, an inductor, a capacitor, and an element with a variety of functions as well as an electrode and a wiring.

In general, the term "SOI substrate" means a substrate where a silicon semiconductor layer is provided on an insulating surface. In this specification and the like, the term "SOI substrate" also includes a substrate where a semiconductor layer formed using a material other than silicon is provided over an insulating surface in its category. That is, a semiconductor layer included in the "SOI substrate" is not limited to a silicon semiconductor layer. A substrate in the "SOI substrate" is not limited to a semiconductor substrate such as a silicon wafer and can be a non-semiconductor substrate such as a glass substrate, a quartz substrate, a sapphire substrate, or a metal substrate. In other words, the "SOI substrate" also includes a conductive substrate or an insulating substrate provided with a layer formed of a semiconductor material in its category. In addition, in this specification and the like, the term "semiconductor substrate" means not only a substrate formed using only a semiconductor material but also all substrates including a semiconductor material. That is, in this specification and the like, the "SOI substrate" is also included in the category of the "semiconductor substrate".

One embodiment of the present invention provides a semiconductor device in which a transistor including a material other than an oxide semiconductor is placed in a lower portion and a transistor including an oxide semiconductor is placed in an upper portion.

Since the off-state current of a transistor including an oxide semiconductor is extremely low, stored data can be retained for an extremely long time by using the transistor. In other words, power consumption can be adequately reduced because refresh operation becomes unnecessary or the frequency of refresh operation can be extremely low. Moreover, stored data can be retained for a long time even when power is not supplied.

Further, high voltage is not needed to write data, and deterioration of the element does not become a problem. Furthermore, data is written depending on the on state and the off state of the transistor, whereby high-speed operation can be easily realized. In addition, there is no need of operation for erasing data.

Since a transistor including a material other than an oxide semiconductor can operate at sufficiently high speed, stored data can be read out at high speed by using the transistor.

A semiconductor device with a novel feature can be realized by including both the transistor including a material other than an oxide semiconductor and the transistor including an oxide semiconductor.

BEST MODE FOR CARRYING OUT THE INVENTION

Figure 1:
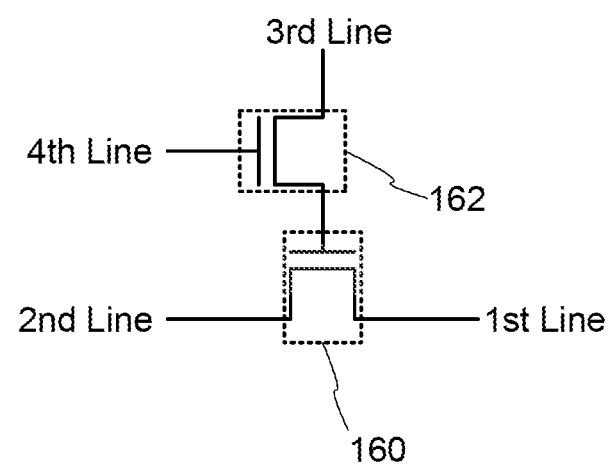
FIG. 1 is a circuit diagram of a semiconductor device.

Examples of embodiments of the present invention will be described below with reference to the accompanying drawings. Note that the present invention is not limited to the following description, and it is easily understood by those skilled in the art that modes and details disclosed herein can be modified in various ways without departing from the spirit and the scope of the present invention. Therefore, the present invention is not to be construed as being limited to the content of the embodiments included herein.

Note that the position, the size, the range, or the like of each structure illustrated in drawings and the like is not accurately represented in some cases for easy understanding. Therefore, embodiments of the present invention are not necessarily limited to such a position, size, range, or the like disclosed in the drawings and the like.

In this specification and the like, ordinal numbers such as "first", "second", and "third" are used in order to avoid confusion among components, and the terms do not mean limitation of the number of components.

Embodiment 1

In this embodiment, a structure and a manufacturing method of a semiconductor device according to one embodiment of the invention disclosed herein will be described with reference to FIG. 1, FIGS. 2A and 2B, FIGS. 3A to 3H, FIGS. 4A to 4G, FIGS. 5A to 5D, FIG. 6, FIGS. 7A and 7B, FIGS. 8A and 8B, and FIGS. 9A and 9B.

<Circuit Configuration of Semiconductor Device>

FIG. 1 illustrates an example of a circuit configuration of a semiconductor device. The semiconductor device includes a transistor 160 formed using a material other than an oxide semiconductor, and a transistor 162 formed using an oxide semiconductor.

Here, a gate electrode of the transistor 160 is electrically connected to one of a source electrode and a drain electrode of the transistor 162. A first wiring (a 1st line, also referred to as a source line) is electrically connected to a source electrode of the transistor 160. A second wiring (a 2nd line, also referred to as a bit line) is electrically connected to a drain electrode of the transistor 160. A third wiring (a 3rd line, also referred to as a first signal line) is electrically connected to the other of the source electrode and the drain electrode of the transistor 162. A fourth wiring (a 4th line, also referred to as a second signal line) is electrically connected to a gate electrode of the transistor 162.

Since the transistor 160 including a material other than an oxide semiconductor can operate at sufficiently high speed, stored data can be read out at high speed by using the transistor 160. Moreover, the transistor 162 including an oxide semiconductor has extremely low off-state current. For that reason, a potential of the gate electrode of the transistor 160 can be held for an extremely long time by turning off the transistor 162.

Writing, holding, and reading of data can be performed in the following manner, using the advantage that the potential of the gate electrode can be held.

Firstly, writing and holding of data will be described. First, a potential of the fourth wiring is set to a potential at which the transistor 162 is turned on, and the transistor 162 is turned on. Thus, a potential of the third wiring is supplied to the gate electrode of the transistor 160 (writing). After that, the potential of the fourth wiring is set to a potential at which the transistor 162 is turned off, and the transistor 162 is turned off, whereby the potential of the gate electrode of the transistor 160 is held (holding).

Since the off-state current of the transistor 162 is extremely low, the potential of the gate electrode of the transistor 160 is held for a long time. For example, when the potential of the gate electrode of the transistor 160 is a potential at which the transistor 160 is turned on, the on state of the transistor 160 is kept for a long time. Moreover, when the potential of the gate electrode of the transistor 160 is a potential at which the transistor 160 is turned off, the off state of the transistor 160 is kept for a long time.

Secondly, reading of data will be described. When a predetermined potential (a low potential) is supplied to the first wiring in a state where the on state or the off state of the transistor 160 is kept as described above, a potential of the second wiring varies depending on the on state or the off state of the transistor 160. For example, when the transistor 160 is on, the potential of the second wiring becomes lower than the potential of the first wiring. In contrast, when the transistor 160 is off, the potential of the second wiring is not changed.

In such a manner, the potential of the second wiring and a predetermined potential are compared with each other in a state where data is held, whereby the data can be read out.

Thirdly, rewriting of data will be described. Rewriting of data is performed in a manner similar to that of the writing and holding of data. That is, the potential of the fourth wiring is set to a potential at which the transistor 162 is turned on, and the transistor 162 is turned on. Thus, a potential of the third wiring (a potential for new data) is supplied to the gate electrode of the transistor 160. After that, the potential of the fourth wiring is set to a potential at which the transistor 162 is turned off, and the transistor 162 is turned off, whereby the new data is stored.

In the semiconductor device according to the invention disclosed herein, data can be directly rewritten by another writing of data as described above. For that reason, erasing operation which is necessary for a flash memory or the like is not needed, so that a reduction in operation speed because of erasing operation can be prevented. In other words, high-speed operation of the semiconductor device can be realized.

Note that an n-channel transistor in which electrons are majority carriers is used in the above description; it is needless to say that a p-channel transistor in which holes are majority carriers can be used instead of the n-channel transistor.

<Planar Structure and Cross-Sectional Structure of Semiconductor Device>

Figure 2A:
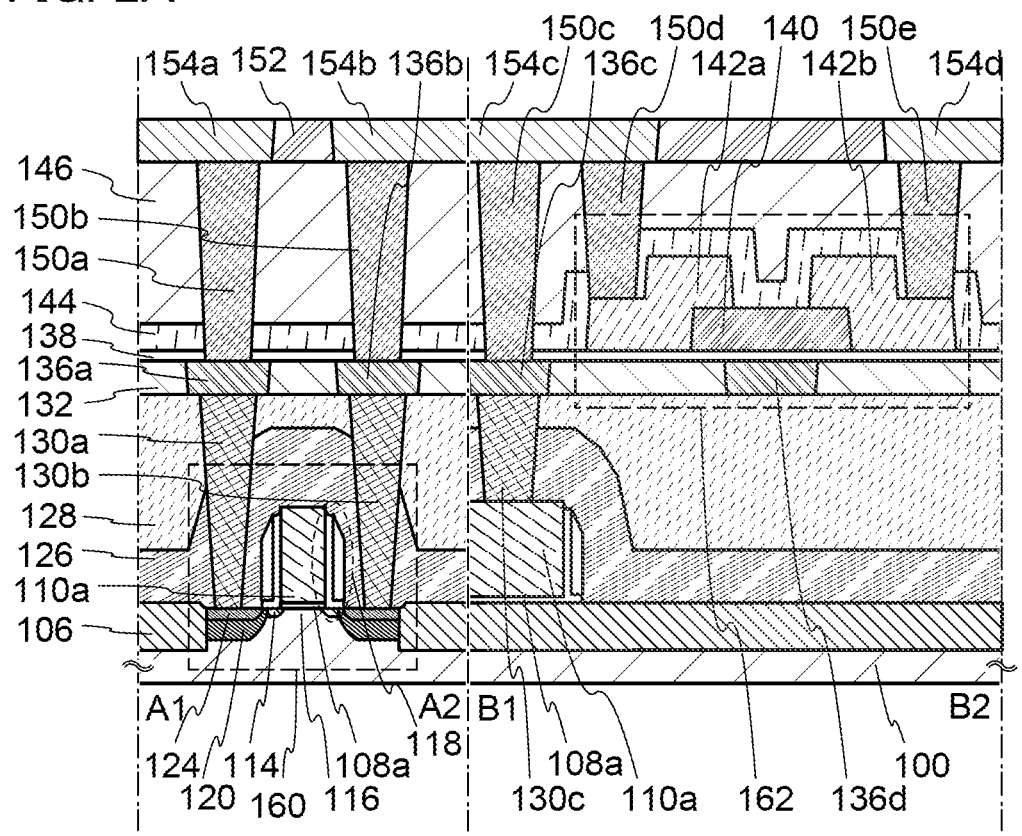
FIGS. 2A and 2B are a cross-sectional view and a plan view for illustrating a semiconductor device.
Figure 2B:
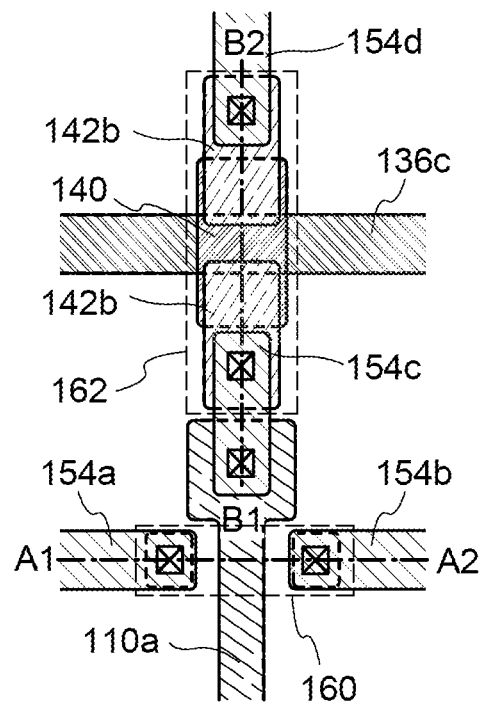

FIGS. 2A and 2B illustrate an example of a structure of the semiconductor device. FIG. 2A illustrates a cross section of the semiconductor device, and FIG. 2B illustrates a plan view of the semiconductor device. Here, FIG. 2A corresponds to a cross section along line A1-A2 and line B1-B2 in FIG. 2B. The semiconductor device illustrated in FIGS. 2A and 2B includes the transistor 160 including a material other than an oxide semiconductor in a lower portion, and the transistor 162 including an oxide semiconductor in an upper portion. Note that the transistors 160 and 162 are n-channel transistors here; alternatively, a p-channel transistor may be used. In particular, it is easy to use a p-channel transistor as the transistor 160.

The transistor 160 includes a channel formation region 116 provided in a substrate 100 including a semiconductor material, impurity regions 114 and high-concentration impurity regions 120 (these regions can be collectively referred to simply as impurity regions) provided so as to sandwich the channel formation region 116, a gate insulating layer 108a provided over the channel formation region 116, a gate electrode 110a provided over the gate insulating layer 108a, and a source electrode or drain electrode (hereinafter referred to as a source/drain electrode) 130a and a source/drain electrode 130b electrically connected to the impurity regions 114.

A sidewall insulating layer 118 is provided on a side surface of the gate electrode 110a. The high-concentration impurity region 120 is placed in a region of the substrate 100 that does not overlap with the sidewall insulating layer 118 when seen in the cross-sectional view. A metal compound region 124 is placed over the high-concentration impurity region 120. An element isolation insulating layer 106 is provided over the substrate 100 so as to surround the transistor 160. An interlayer insulating layer 126 and an interlayer insulating layer 128 are provided so as to cover the transistor 160. Each of the source/drain electrode 130a and the source/drain electrode 130b is electrically connected to the metal compound region 124 through an opening formed in the interlayer insulating layers 126 and 128. That is, each of the source/drain electrodes 130a and 130b is electrically connected to the high-concentration impurity region 120 and the impurity region 114 through the metal compound region 124. An electrode 130c that is formed in a manner similar to that of the source/drain electrodes 130a and 130b is electrically connected to the gate electrode 110a.

The transistor 162 includes a gate electrode 136d provided over the interlayer insulating layer 128, a gate insulating layer 138 provided over the gate electrode 136d, an oxide semiconductor layer 140 provided over the gate insulating layer 138, and a source/drain electrode 142a and a source/drain electrode 142b that are provided over the oxide semiconductor layer 140 and electrically connected to the oxide semiconductor layer 140.

Here, the gate electrode 136d is provided so as to be embedded in an insulating layer 132 formed over the interlayer insulating layer 128. Like the gate electrode 136d, an electrode 136a, an electrode 136b, and an electrode 136c are formed in contact with the source/drain electrode 130a, the source/drain electrode 130b, and the electrode 130c, respectively.

A protective insulating layer 144 is provided over the transistor 162 so as to be in contact with part of the oxide semiconductor layer 140. An interlayer insulating layer 146 is provided over the protective insulating layer 144. Openings that reach the source/drain electrode 142a and the source/drain electrode 142b are formed in the protective insulating layer 144 and the interlayer insulating layer 146. An electrode 150d and an electrode 150e are formed in contact with the source/drain electrode 142a and the source/drain electrode 142b, respectively, through the respective openings. Like the electrodes 150d and 150e, an electrode 150a, an electrode 150b, and an electrode 150c are formed in contact with the electrode 136a, the electrode 136b, and the electrode 136c, respectively, through openings provided in the gate insulating layer 138, the protective insulating layer 144, and the interlayer insulating layer 146.

Here, the oxide semiconductor layer 140 is preferably a highly purified oxide semiconductor layer from which impurities such as hydrogen are sufficiently removed. Specifically, the concentration of hydrogen in the oxide semiconductor layer 140 is $5 \times 10^{19}/cm^3$ or less, preferably $5 \times 10^{18}/cm^3$ or less, more preferably $5 \times 10^{17}/cm^3$ or less. Moreover, the oxide semiconductor layer 140 which is highly purified by a sufficient reduction in hydrogen concentration has a carrier concentration of $5 \times 10^{14}/cm^3$ or less, preferably $5 \times 10^{12}/cm^3$ or less. The transistor 162 with excellent off-state current characteristics can be obtained with the use of such an oxide semiconductor that is highly purified by a sufficient reduction in hydrogen concentration and becomes intrinsic or substantially intrinsic. For example, when the drain voltage Vd is +1 V or +10 V and the gate voltage Vg is in the range of −5 V to −20 V, the off-state current is $1 \times 10^{-13}$ A or less. The oxide semiconductor layer 140 which is highly purified by a sufficient reduction in hydrogen concentration is used so that the off-state current of the transistor 162 is reduced, whereby a semiconductor device with a novel structure can be realized. Note that the concentration of hydrogen in the oxide semiconductor layer 140 is measured by secondary ion mass spectrometry (SIMS).

An insulating layer 152 is provided over the interlayer insulating layer 146. An electrode 154a, an electrode 154b, an electrode 154c, and an electrode 154d are provided so as to be embedded in the insulating layer 152. The electrode 154a is in contact with the electrode 150a. The electrode 154b is in contact with the electrode 150b. The electrode 154c is in contact with the electrode 150c and the electrode 150d. The electrode 154d is in contact with the electrode 150e.

That is, in the semiconductor device illustrated in FIGS. 2A and 2B, the gate electrode 110a of the transistor 160 and the source/drain electrode 142a of the transistor 162 are electrically connected through the electrodes 130c, 136c, 150c, 154c, and 150d.

<Method for Manufacturing Semiconductor Device>

Next, an example of a method for manufacturing the semiconductor device will be described. First, a method for manufacturing the transistor 160 in the lower portion will be described below with reference to FIGS. 3A to 3H, and then a method for manufacturing the transistor 162 in the upper portion will be described with reference to FIGS. 4A to 4G and FIGS. 5A to 5D.

<Method for Manufacturing Lower Transistor>

Figure 3A:
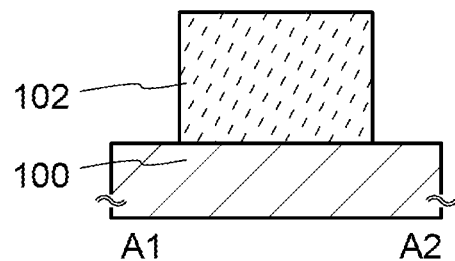
FIGS. 3A to 3H are cross-sectional views illustrating steps for manufacturing a semiconductor device.
Figure 3E:
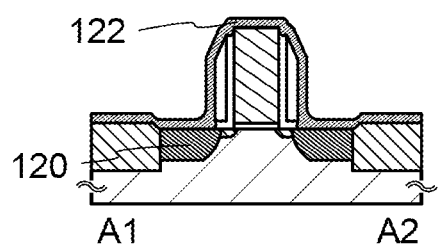

First, the substrate 100 including a semiconductor material is prepared (see FIG. 3A). As the substrate 100 including a semiconductor material, a single crystal semiconductor substrate or a polycrystalline semiconductor substrate made of silicon, silicon carbide, or the like; a compound semiconductor substrate made of silicon germanium or the like; an SOI substrate; or the like can be used. Here, an example of using a single crystal silicon substrate as the substrate 100 including a semiconductor material is described. Note that in general, the term "SOI substrate" means a substrate where a silicon semiconductor layer is provided on an insulating surface. In this specification and the like, the term "SOI substrate" also includes a substrate where a semiconductor layer formed using a material other than silicon is provided over an insulating surface in its category. That is, a semiconductor layer included in the "SOI substrate" is not limited to a silicon semiconductor layer. Moreover, the SOI substrate can be a substrate having a structure in which a semiconductor layer is provided over an insulating substrate such as a glass substrate, with an insulating layer therebetween.

A protective layer 102 serving as a mask for forming an element isolation insulating layer is formed over the substrate 100 (see FIG. 3A). As the protective layer 102, an insulating layer formed using silicon oxide, silicon nitride, silicon nitride oxide, or the like can be used, for example Note that before or after this step, an impurity element imparting n-type conductivity or an impurity element imparting p-type conductivity may be added to the substrate 100 in order to control the threshold voltage of the transistor. When the semiconductor material included in the substrate 100 is silicon, phosphorus, arsenic, or the like can be used as the impurity imparting n-type conductivity. Boron, aluminum, gallium, or the like can be used as the impurity imparting p-type conductivity.

Next, part of the substrate 100 in a region that is not covered with the protective layer 102 (i.e., in an exposed region) is removed by etching, using the protective layer 102 as a mask. Thus, an isolated semiconductor region 104 is formed (see FIG. 3B). As the etching, dry etching is preferably performed, but wet etching may be performed. An etching gas and an etchant can be selected as appropriate depending on a material of a layer to be etched.

Figure 3B:
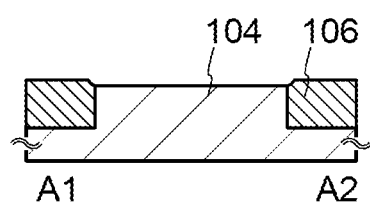
Figure 3F:
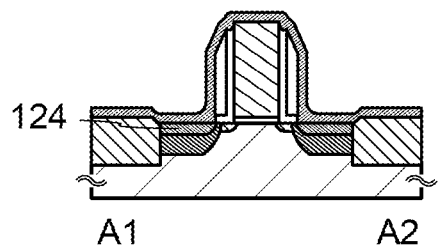

Then, an insulating layer is formed so as to cover the semiconductor region 104, and the insulating layer in a region overlapping with the semiconductor region 104 is selectively removed, so that element isolation insulating layers 106 are formed (see FIG. 3B). The insulating layer is formed using silicon oxide, silicon nitride, silicon nitride oxide, or the like. As a method for removing the insulating layer, any of etching treatment and polishing treatment such as CMP can be employed. Note that the protective layer 102 is removed after the formation of the semiconductor region 104 or after the formation of the element isolation insulating layers 106.

Next, an insulating layer is formed over the semiconductor region 104, and a layer including a conductive material is formed over the insulating layer.

Because the insulating layer serves as a gate insulating layer later, the insulating layer preferably has a single-layer structure or a layered structure using a film containing silicon oxide, silicon nitride oxide, silicon nitride, hafnium oxide, aluminum oxide, tantalum oxide, or the like formed by a CVD method, a sputtering method, or the like. Alternatively, the insulating layer may be formed in such a manner that a surface of the semiconductor region 104 is oxidized or nitrided by high-density plasma treatment or thermal oxidation treatment. The high-density plasma treatment can be performed using, for example, a mixed gas of a rare gas such as He, Ar, Kr, or Xe and a gas such as oxygen, nitrogen oxide, ammonia, nitrogen, or hydrogen. There is no particular limitation on the thickness of the insulating layer; the insulating layer can have a thickness of 1 nm to 100 nm inclusive, for example.

The layer including a conductive material can be formed using a metal material such as aluminum, copper, titanium, tantalum, or tungsten. The layer including a conductive material may be formed using a semiconductor material such as polycrystalline silicon containing a conductive material. There is no particular limitation on the method for forming the layer containing a conductive material, and a variety of film formation methods such as an evaporation method, a CVD method, a sputtering method, or a spin coating method can be employed. Note that this embodiment shows an example of the case where the layer containing a conductive material is formed using a metal material.

Figure 3C:
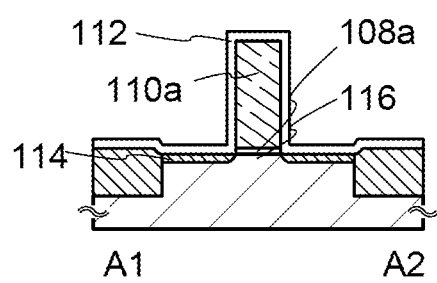

After that, the insulating layer and the layer including a conductive material are selectively etched, so that the gate insulating layer 108a and the gate electrode 110a are formed (see FIG. 3C).

Next, an insulating layer 112 that covers the gate electrode 110a is formed (see FIG. 3C). Then, the impurity regions 114 with a shallow junction depth are formed by adding phosphorus (P), arsenic (As), or the like to the semiconductor region 104 (see FIG. 3C). Note that phosphorus or arsenic is added here in order to form an n-channel transistor; an impurity element such as boron (B) or aluminum (Al) may be added in the case of forming a p-channel transistor. With the formation of the impurity regions 114, the channel formation region 116 is formed in the semiconductor region 104 below the gate insulating layer 108a (see FIG. 3C). Here, the concentration of the impurity added can be set as appropriate; the concentration is preferably increased when the size of a semiconductor element is extremely decreased. The step in which the impurity regions 114 are formed after the formation of the insulating layer 112 is employed here; alternatively, the insulating layer 112 may be formed after the formation of the impurity regions 114.

Figure 3G:
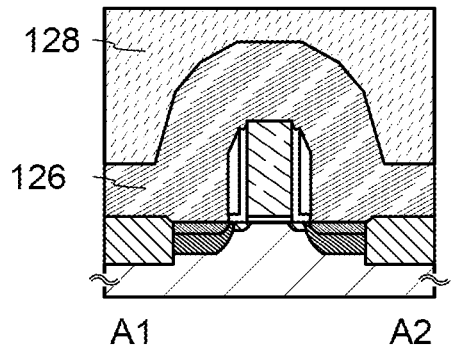
Figure 3D:
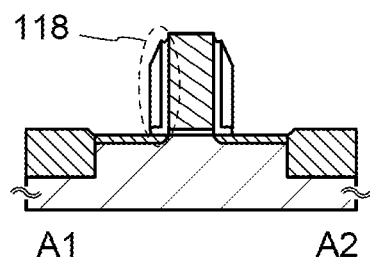

Next, the sidewall insulating layers 118 are formed (see FIG. 3D). An insulating layer is formed so as to cover the insulating layer 112 and then subjected to highly anisotropic etching, whereby the sidewall insulating layers 118 can be formed in a self-aligned manner. At this time, it is preferable to partly etch the insulating layer 112 so that a top surface of the gate electrode 110a and top surfaces of the impurity regions 114 are exposed.

Then, an insulating layer is formed so as to cover the gate electrode 110a, the impurity regions 114, the sidewall insulating layers 118, and the like. Next, phosphorus (P), arsenic (As), or the like is added to regions in contact with the impurity regions 114, so that the high-concentration impurity regions 120 are formed (see FIG. 3E). After that, the insulating layer is removed, and a metal layer 122 is formed so as to cover the gate electrode 110a, the sidewall insulating layers 118, the high-concentration impurity regions 120, and the like (see FIG. 3E). A variety of film formation methods such as a vacuum evaporation method, a sputtering method, or a spin coating method can be employed for forming the metal layer 122. The metal layer 122 is preferably formed using a metal material that reacts with a semiconductor material included in the semiconductor region 104 to be a low-resistance metal compound. Examples of such a metal material are titanium, tantalum, tungsten, nickel, cobalt, and platinum.

Next, heat treatment is performed so that the metal layer 122 reacts with the semiconductor material. Thus, the metal compound regions 124 that are in contact with the high-concentration impurity regions 120 are formed (see FIG. 3F). Note that when the gate electrode 110a is formed using polycrystalline silicon or the like, a metal compound region is also formed in a region of the gate electrode 110a in contact with the metal layer 122.

As the heat treatment, irradiation with a flash lamp can be employed, for example Although it is needless to say that another heat treatment method may be used, a method by which heat treatment for an extremely short time can be achieved is preferably used in order to improve the controllability of chemical reaction in formation of the metal compound. Note that the metal compound regions are formed by reaction of the metal material and the semiconductor material and have sufficiently high conductivity. The formation of the metal compound regions can properly reduce the electric resistance and improve element characteristics. Note that the metal layer 122 is removed after the metal compound regions 124 are formed.

Then, the interlayer insulating layer 126 and the interlayer insulating layer 128 are formed so as to cover the components formed in the above steps (see FIG. 3G). The interlayer insulating layers 126 and 128 can be formed using an inorganic insulating material such as silicon oxide, silicon nitride oxide, silicon nitride, hafnium oxide, aluminum oxide, or tantalum oxide. Moreover, the interlayer insulating layers 126 and 128 can be formed using an organic insulating material such as polyimide or acrylic. Note that a two-layer structure of the interlayer insulating layer 126 and the interlayer insulating layer 128 is employed here; however, the structure of an interlayer insulating layer is not limited to this structure. After the formation of the interlayer insulating layer 128, a surface of the interlayer insulating layer 128 is preferably planarized with CMP, etching, or the like.

Figure 3H:
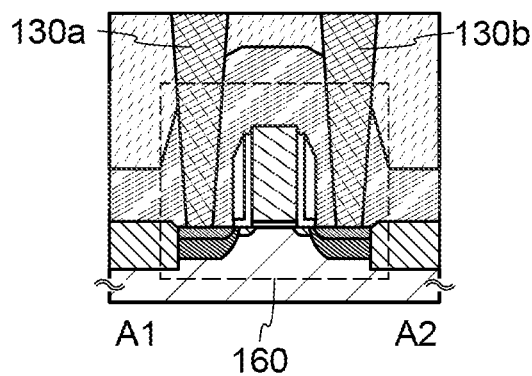

Then, openings that reach the metal compound regions 124 are formed in the interlayer insulating layers, and the source/drain electrode 130a and the source/drain electrode 130b are formed in the openings (see FIG. 3H). The source/drain electrodes 130a and 130b can be formed in such a manner, for example, that a conductive layer is formed in a region including the openings by a PVD method, a CVD method, or the like and then part of the conductive layer is removed by etching, CMP, or the like.

Note that in the case where the source/drain electrodes 130a and 130b are formed by removing part of the conductive layer, the process is preferably performed so that the surfaces are planarized. For example, when a thin titanium film or a thin titanium nitride film is formed in a region including the openings and then a tungsten film is formed so as to be embedded in the openings, excess tungsten, titanium, titanium nitride, or the like is removed and the planarity of the surface can be improved by subsequent CMP. The surface including the source/drain electrodes 130a and 130b is planarized in such a manner, so that an electrode, a wiring, an insulating layer, a semiconductor layer, and the like can be favorably formed in later steps.

Note that only the source/drain electrodes 130a and 130b in contact with the metal compound regions 124 are shown here; however, an electrode that is in contact with the gate electrode 110a (e.g., the electrode 130c in FIG. 2A) and the like can also be formed in this step. There is no particular limitation on a material used for the source/drain electrodes 130a and 130b, and a variety of conductive materials can be used. For example, a conductive material such as molybdenum, titanium, chromium, tantalum, tungsten, aluminum, copper, neodymium, or scandium can be used.

Through the above steps, the transistor 160 using the substrate 100 including a semiconductor material is formed. Note that an electrode, a wiring, an insulating layer, or the like may be further formed after the above step. When the wirings have a multi-layer structure of a layered structure including an interlayer insulating layer and a conductive layer, a highly integrated semiconductor device can be provided.

<Method for Manufacturing Upper Transistor>

Next, steps for manufacturing the transistor 162 over the interlayer insulating layer 128 will be described with reference to FIGS. 4A to 4G and FIGS. 5A to 5D. Note that FIGS. 4A to 4G and FIGS. 5A to 5D illustrate steps for manufacturing electrodes, the transistor 162, and the like over the interlayer insulating layer 128; therefore, the transistor 160 and the like placed below the transistor 162 are omitted.

Figure 4A:
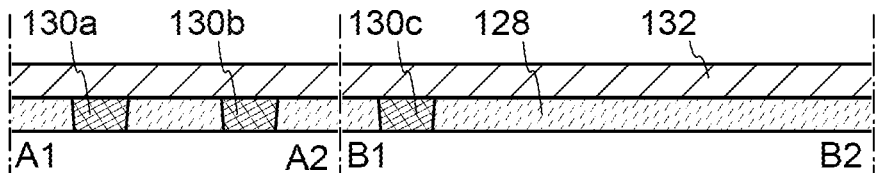
FIGS. 4A to 4G are cross-sectional views illustrating steps for manufacturing a semiconductor device.
Figure 4B:
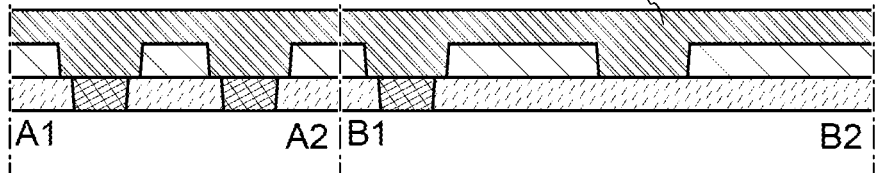

First, the insulating layer 132 is formed over the interlayer insulating layer 128, the source/drain electrodes 130a and 130b, and the electrode 130c (see FIG. 4A). The insulating layer 132 can be formed by a PVD method, a CVD method, or the like. The insulating layer 132 can be formed using an inorganic insulating material such as silicon oxide, silicon nitride oxide, silicon nitride, hafnium oxide, aluminum oxide, or tantalum oxide.

Next, openings that reach the source/drain electrodes 130a and 130b and the electrode 130c are formed in the insulating layer 132. At this time, an opening is also formed in a region where the gate electrode 136d is to be formed later. Then, a conductive layer 134 is formed so as to be embedded in the openings (see FIG. 4B). The openings can be formed by a method such as etching using a mask. The mask can be formed by a method such as light exposure using a photomask. Either wet etching or dry etching may be used as the etching; dry etching is preferably used in terms of microfabrication. The conductive layer 134 can be formed by a film formation method such as a PVD method or a CVD method. The conductive layer 134 can be formed using a conductive material such as molybdenum, titanium, chromium, tantalum, tungsten, aluminum, copper, neodymium, or scandium or an alloy or a compound (e.g., a nitride) of any of these materials, for example.

Specifically, it is possible to employ a method, for example, in which a thin titanium film is formed in a region including the openings by a PVD method and a thin titanium nitride film is formed by a CVD method, and then, a tungsten film is formed so as to be embedded in the openings. Here, the titanium film formed by a PVD method has a function of reducing an oxide film at the interface with the insulating layer 132 to decrease the contact resistance with lower electrodes (here, the source/drain electrodes 130a and 130b, the electrode 130c, and the like). The titanium nitride film formed after the formation of the titanium film has a barrier function of preventing diffusion of the conductive material. A copper film may be formed by a plating method after the formation of the barrier film of titanium, titanium nitride, or the like.

Figure 4C:
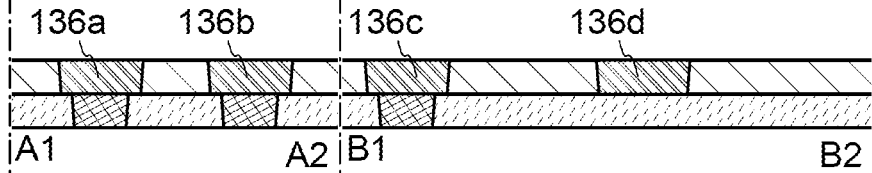

After the conductive layer 134 is formed, part of the conductive layer 134 is removed by etching, CMP, or the like, so that the insulating layer 132 is exposed and the electrodes 136a, 136b, and 136c and the gate electrode 136d are formed (see FIG. 4C). Note that when the electrodes 136a, 136b, and 136c and the gate electrode 136d are formed by removing part of the conductive layer 134, the process is preferably performed so that the surfaces are planarized. The surfaces of the insulating layer 132, the electrodes 136a, 136b, and 136c, and the gate electrode 136d are planarized in such a manner, whereby an electrode, a wiring, an insulating layer, a semiconductor layer, and the like can be favorably formed in later steps.

Figure 4D:
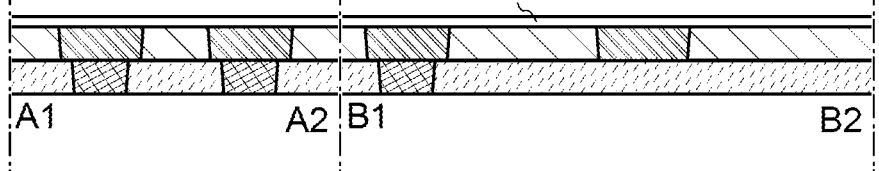

Next, the gate insulating layer 138 is formed so as to cover the insulating layer 132, the electrodes 136a, 136b, and 136c, and the gate electrode 136d (see FIG. 4D). The gate insulating layer 138 can be formed by a CVD method, a sputtering method, or the like. The gate insulating layer 138 is preferably formed using silicon oxide, silicon nitride, silicon oxynitride, silicon nitride oxide, aluminum oxide, hafnium oxide, tantalum oxide, or the like. Note that the gate insulating layer 138 may have a single-layer structure or a layered structure. For example, the gate insulating layer 138 made of silicon oxynitride can be formed by a plasma CVD method using silane ($SiH_4$), oxygen, and nitrogen as a source gas. There is no particular limitation on the thickness of the gate insulating layer 138; the gate insulating layer 138 can have a thickness of 10 nm to 500 nm inclusive, for example In the case of employing a layered structure, for example, the gate insulating layer 138 is preferably a stack of a first gate insulating layer having a thickness of 50 nm to 200 nm inclusive, and a second gate insulating layer with a thickness of 5 nm to 300 nm inclusive over the first gate insulating layer.

Note that an oxide semiconductor that becomes intrinsic or substantially intrinsic by removal of impurities (a highly purified oxide semiconductor) is quite susceptible to the interface level and the interface charge; therefore, when such an oxide semiconductor is used for an oxide semiconductor layer, the interface with the gate insulating layer is important. In other words, the gate insulating layer 138 that is to be in contact with a highly purified oxide semiconductor layer needs to have high quality.

For example, the gate insulating layer 138 is preferably formed by a high-density plasma CVD method using a microwave (2.45 GHz) because the gate insulating layer 138 can be dense and have high withstand voltage and high quality. When a highly purified oxide semiconductor layer and a high-quality gate insulating layer are in close contact with each other, the interface level can be reduced and interface characteristics can be favorable.

It is needless to say that, even when a highly purified oxide semiconductor layer is used, another method such as a sputtering method or a plasma CVD method can be employed as long as a high-quality insulating layer can be formed as a gate insulating layer. Moreover, it is possible to use an insulating layer whose quality and interface characteristics are improved with heat treatment performed after the formation of the insulating layer. In any case, an insulating layer that has favorable film quality as the gate insulating layer 138 and can reduce interface level density with an oxide semiconductor layer to form a favorable interface is formed as the gate insulating layer 138.

In a gate bias-temperature stress test (BT test) at 85° C. with $2\times10^6$ V/cm for 12 hours, if an impurity is added to an oxide semiconductor, a bond between the impurity and a main component of the oxide semiconductor is broken by a high electric field (B: bias) and high temperature (T: temperature), and a dangling bond generated causes a drift of the threshold voltage (Vth).

In contrast, impurities of an oxide semiconductor, particularly hydrogen and water, are reduced to a minimum and interface characteristics between the oxide semiconductor and the gate insulating layer are made favorable as described above, whereby a transistor that is stable through the BT test can be obtained.

Figure 4E:
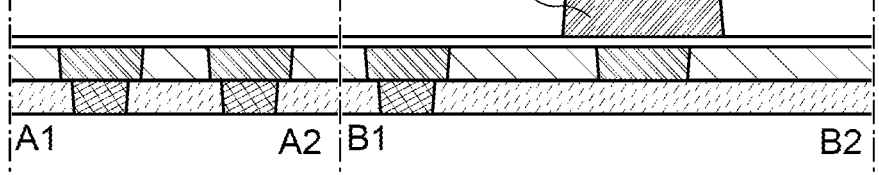

Next, an oxide semiconductor layer is formed over the gate insulating layer 138 and processed by a method such as etching using a mask, so that the island-shaped oxide semiconductor layer 140 is formed (see FIG. 4E).

As the oxide semiconductor layer, it is preferable to use an In—Ga—Zn—O-based oxide semiconductor layer, an In—Sn—Zn—O-based oxide semiconductor layer, an In—Al—Zn—O-based oxide semiconductor layer, a Sn—Ga—Zn—O-based oxide semiconductor layer, an Al—Ga—Zn—O-based oxide semiconductor layer, a Sn—Al—Zn—O-based oxide semiconductor layer, an In—Zn—O-based oxide semiconductor layer, a Sn—Zn—O-based oxide semiconductor layer, an Al—Zn—O-based oxide semiconductor layer, an In—O-based oxide semiconductor layer, a Sn—O-based oxide semiconductor layer, or a Zn—O-based oxide semiconductor layer, which is preferably amorphous in particular. In this embodiment, as the oxide semiconductor layer, an amorphous oxide semiconductor layer is formed by a sputtering method using a target for depositing an In—Ga—Zn—O-based oxide semiconductor. Note that since crystallization of an amorphous oxide semiconductor layer can be suppressed by adding silicon to the amorphous oxide semiconductor layer, an oxide semiconductor layer may be formed, for example, using a target containing $SiO_2$ of 2 wt % to 10 wt % inclusive.

As a target used for forming an oxide semiconductor layer by a sputtering method, a metal oxide target containing zinc oxide as its main component can be used, for example. Moreover, a target for depositing an oxide semiconductor containing In, Ga, and Zn (a composition ratio of $In_2O_3$:$Ga_2O_3$:ZnO=1:1:1 [mol %] and In:Ga:Zn=1:1:0.5 [atom %]) can be used, for example. Furthermore, a target for depositing an oxide semiconductor containing In, Ga, and Zn (a composition ratio of In:Ga:Zn=1:1:1 [atom %] or a composition ratio of In:Ga:Zn=1:1:2 [atom %]) may be used. The filling rate of a target for depositing an oxide semiconductor is 90% to 100% inclusive, preferably greater than or equal to 95% (e.g., 99.9%). A dense oxide semiconductor layer is formed using a target for depositing an oxide semiconductor with a high filling rate.

The atmosphere in which the oxide semiconductor layer is formed is preferably a rare gas (typically argon) atmosphere, an oxygen atmosphere, or a mixed atmosphere containing a rare gas (typically argon) and oxygen. Specifically, it is preferable to use a high-purity gas, for example, from which an impurity such as hydrogen, water, a hydroxyl group, or hydride is removed so that the concentration is in the ppm range (preferably the ppb range).

In forming the oxide semiconductor layer, the substrate is held in a treatment chamber that is maintained at reduced pressure and the substrate temperature is set to 100° C. to 600° C. inclusive, preferably 200° C. to 400° C. inclusive. The oxide semiconductor layer is formed while the substrate is heated, so that the impurity concentration of the oxide semiconductor layer can be reduced. Moreover, damage due to sputtering is reduced. Then, a sputtering gas from which hydrogen and water are removed is introduced into the treatment chamber from which remaining moisture is being removed, and the oxide semiconductor layer is formed using metal oxide as a target. An entrapment vacuum pump is preferably used in order to remove moisture remaining in the treatment chamber. For example, a cryopump, an ion pump, or a titanium sublimation pump can be used. An evacuation unit may be a turbo pump provided with a cold trap. In the deposition chamber that is evacuated with the cryopump, a hydrogen atom and a compound containing a hydrogen atom such as water ($H_2O$) (and preferably also a compound containing a carbon atom), for example, are removed, whereby the impurity concentration of the oxide semiconductor layer formed in the deposition chamber can be reduced.

The oxide semiconductor layer can be formed under the following conditions, for example: the distance between the substrate and the target is 100 mm; the pressure is 0.6 Pa; the direct-current (DC) power supply is 0.5 kW; and the atmosphere is oxygen (the flow rate ratio of oxygen is 100%). Note that it is preferable to use a pulse direct current (DC) power supply because powder substances (also referred to as particles or dust) generated in film deposition can be reduced and the thickness distribution is uniform. The thickness of the oxide semiconductor layer is 2 nm to 200 nm inclusive, preferably 5 nm to 30 nm inclusive. Note that an appropriate thickness differs depending on an oxide semiconductor material, and the thickness is set as appropriate depending on the material to be used.

Note that before the oxide semiconductor layer is formed by a sputtering method, dust on a surface of the gate insulating layer 138 is preferably removed by reverse sputtering in which an argon gas is introduced and plasma is generated. Here, the reverse sputtering is a method by which ions collide with a surface to be processed so that the surface is modified, in contrast to normal sputtering by which ions collide with a sputtering target. An example of a method for making ions collide with a surface to be processed is a method in which high-frequency voltage is applied to the surface in an argon atmosphere so that plasma is generated near a substrate. Note that an atmosphere of nitrogen, helium, oxygen, or the like may be used instead of an argon atmosphere.

As an etching method for the oxide semiconductor layer, either dry etching or wet etching may be employed. It is needless to say that dry etching and wet etching can be used in combination. The etching conditions (e.g., an etching gas or an etching solution, etching time, and temperature) are set as appropriate depending on the material so that the oxide semiconductor layer can be etched into a desired shape.

An example of an etching gas used for dry etching is a gas containing chlorine (a chlorine-based gas such as chlorine ($Cl_2$), boron chloride ($BCl_3$), silicon chloride ($SiCl_4$), or carbon tetrachloride ($CCl_4$)). Moreover, a gas containing fluorine (a fluorine-based gas such as carbon tetrafluoride ($CF_4$), sulfur fluoride (SF), nitrogen fluoride ($NF_3$), or trifluoromethane ($CHF_3$)), hydrogen bromide (HBr), oxygen ($O_2$), any of these gases to which a rare gas such as helium (He) or argon (Ar) is added, or the like may be used.

As the dry etching method, a parallel plate RIE (reactive ion etching) method or an ICP (inductively coupled plasma) etching method can be used. In order to etch the oxide semiconductor layer into a desired shape, etching conditions (e.g., the amount of electric power applied to a coiled electrode, the amount of electric power applied to an electrode on the substrate side, and the electrode temperature on the substrate side) are set as appropriate.

As an etchant used for wet etching, a mixed solution of phosphoric acid, acetic acid, and nitric acid, an ammonia peroxide mixture (hydrogen peroxide solution of 31 wt %:ammonia solution of 28 wt %:water=5:2:2), or the like can be used. An etchant such as ITO07N (produced by KANTO CHEMICAL CO., INC.) may also be used.

Then, first heat treatment is preferably performed on the oxide semiconductor layer. The oxide semiconductor layer can be dehydrated or dehydrogenated with the first heat treatment. The temperature of the first heat treatment is greater than or equal to 300° C. and less than or equal to 750° C., preferably greater than or equal to 400° C. and less than the strain point of the substrate. For example, the substrate is introduced into an electric furnace in which a resistance heating element or the like is used and the oxide semiconductor layer 140 is subjected to heat treatment at 450° C. for one hour in a nitrogen atmosphere. The oxide semiconductor layer 140 is not exposed to the air during the heat treatment so that entry of water and hydrogen can be prevented.

The heat treatment apparatus is not limited to the electric furnace and can be an apparatus for heating an object by thermal radiation or thermal conduction from a medium such as a heated gas. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas that does not react with an object by heat treatment, for example, nitrogen or a rare gas such as argon is used.

For example, as the first heat treatment, a GRTA process may be performed as follows. The substrate is put in an inert gas that has been heated to a high temperature of 650° C. to 700° C., heated for several minutes, and taken out of the inert gas. The GRTA process enables high-temperature heat treatment for a short time. Moreover, the GRTA process can be employed even when the temperature exceeds the strain point of the substrate because it is heat treatment for a short time.

Note that the first heat treatment is preferably performed in an atmosphere that contains nitrogen or a rare gas (e.g., helium, neon, or argon) as its main component and does not contain water, hydrogen, or the like. For example, the purity of nitrogen or a rare gas such as helium, neon, or argon introduced into a heat treatment apparatus is greater than or equal to 6 N (99.9999%), preferably greater than or equal to 7 N (99.99999%) (i.e., the impurity concentration is less than or equal to 1 ppm, preferably less than or equal to 0.1 ppm).

Depending on the conditions of the first heat treatment or the material of the oxide semiconductor layer, the oxide semiconductor layer is sometimes crystallized to be microcrystalline or polycrystalline. For example, the oxide semiconductor layer sometimes becomes a microcrystalline oxide semiconductor layer having a degree of crystallization of 90% or more, or 80% or more. Further, depending on the conditions of the first heat treatment or the material of the oxide semiconductor layer, the oxide semiconductor layer may be an amorphous oxide semiconductor layer containing no crystalline component.

Furthermore, in the oxide semiconductor layer, a microcrystal (the grain size is 1 nm to 20 nm inclusive, typically 2 nm to 4 nm inclusive) is sometimes mixed in an amorphous oxide semiconductor (e.g., a surface of the oxide semiconductor layer).

The electrical characteristics of the oxide semiconductor layer can be changed by aligning microcrystals in an amorphous semiconductor. For example, when the oxide semiconductor layer is formed using a target for depositing In—Ga—Zn—O-based oxide semiconductor, the electrical characteristics of the oxide semiconductor layer can be changed by formation of a microcrystalline portion in which crystal grains of $In_2Ga_2ZnO_7$ with electrical anisotropy are aligned.

Specifically, for example, when the crystal grains are arranged so that the c-axis of $In_2Ga_2ZnO_7$ is perpendicular to a surface of the oxide semiconductor layer, the conductivity in the direction parallel to the surface of the oxide semiconductor layer can be improved and insulating properties in the direction perpendicular to the surface of the oxide semiconductor layer can be improved. Furthermore, such a microcrystalline portion has a function of suppressing entry of an impurity such as water or hydrogen into the oxide semiconductor layer.

Note that the oxide semiconductor layer including the microcrystalline portion can be formed by heating the surface of the oxide semiconductor layer by a GRTA process. Further, the oxide semiconductor layer can be formed in a more preferred manner by using a sputtering target in which the amount of Zn is smaller than that of In or Ga.

The first heat treatment for the oxide semiconductor layer 140 can be performed on the oxide semiconductor layer that has not yet been processed into the island-shaped oxide semiconductor layer 140. In that case, after the first heat treatment, the substrate is taken out of the heating apparatus and a photolithography step is performed.

Note that the above-described heat treatment can be referred to as dehydration treatment, dehydrogenation treatment, or the like because of its effect of dehydration or dehydrogenation on the oxide semiconductor layer 140. Such dehydration treatment or dehydrogenation treatment can be performed, for example, after the oxide semiconductor layer is formed, after a source electrode and a drain electrode are stacked over the oxide semiconductor layer 140, or after a protective insulating layer is formed over the source and drain electrodes. Such dehydration treatment or dehydrogenation treatment may be performed once or plural times.

Figure 4F:
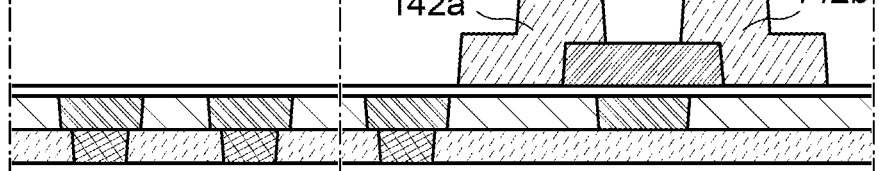

Next, the source/drain electrode 142a and the source/drain electrode 142b are formed in contact with the oxide semiconductor layer 140 (see FIG. 4F). The source/drain electrodes 142a and 142b can be formed in such a manner that a conductive layer is formed so as to cover the oxide semiconductor layer 140 and then is selectively etched.

The conductive layer can be formed by a PVD method such as a sputtering method, or a CVD method such as a plasma CVD method. As a material for the conductive layer, an element selected from aluminum, chromium, copper, tantalum, titanium, molybdenum, or tungsten; an alloy containing any of these elements as a component; or the like can be used. Moreover, one or more materials selected from manganese, magnesium, zirconium, beryllium, or thorium may be used. Aluminum combined with one or more of elements selected from titanium, tantalum, tungsten, molybdenum, chromium, neodymium, or scandium may be used. The conductive layer can have a single-layer structure or a layered structure including two or more layers. For example, the conductive layer can have a single-layer structure of an aluminum film containing silicon, a two-layer structure in which a titanium film is stacked over an aluminum film, or a three-layer structure in which a titanium film, an aluminum film, and a titanium film are stacked in this order.

Here, ultraviolet light, KrF laser light, or ArF laser light is preferably used for light exposure in forming a mask used for etching.

The channel length (L) of the transistor is determined by a distance between a lower edge portion of the source/drain electrode 142a and a lower edge portion of the source/drain electrode 142b. Note that for light exposure in the case where the channel length (L) is less than 25 nm, light exposure for forming a mask is performed with extreme ultraviolet rays whose wavelength is several nanometers to several hundreds of nanometers, which is extremely short. The resolution of light exposure with extreme ultraviolet rays is high and the depth of focus is large. For these reasons, the channel length (L) of the transistor to be formed later can be in the range of 10 nm to 1000 nm, and the circuit can operate at higher speed. Moreover, the off-state current is extremely low, which prevents power consumption from increasing.

The materials and etching conditions of the conductive layer and the oxide semiconductor layer 140 are adjusted as appropriate so that the oxide semiconductor layer 140 is not removed in etching of the conductive layer. Note that in some cases, the oxide semiconductor layer 140 is partly etched in the etching step and thus has a groove portion (a recessed portion) depending on the materials and the etching conditions.

An oxide conductive layer may be formed between the oxide semiconductor layer 140 and the source/drain electrode 142a and between the oxide semiconductor layer 140 and the source/drain electrode 142b. The oxide conductive layer and a metal layer for forming the source/drain electrodes 142a and 142b can be successively formed. The oxide conductive layer can function as a source region and a drain region. The placement of such an oxide conductive layer can reduce the resistance of the source region and the drain region, so that the transistor can operate at high speed.

In order to reduce the number of masks to be used and reduce the number of steps, an etching step may be performed with the use of a resist mask formed using a multi-tone mask which is a light-exposure mask through which light is transmitted to have a plurality of intensities. A resist mask formed with the use of a multi-tone mask has a plurality of thicknesses (has a stair-like shape) and further can be changed in shape by ashing; therefore, the resist mask can be used in a plurality of etching steps for processing into different patterns. That is, a resist mask corresponding to at least two kinds of different patterns can be formed by using a multi-tone mask. Thus, the number of light-exposure masks can be reduced and the number of corresponding photolithography steps can also be reduced, whereby a process can be simplified.

Note that plasma treatment is preferably performed with the use of a gas such as $N_2O$, $N_2$, or Ar after the above step. This plasma treatment removes water or the like attached on an exposed surface of the oxide semiconductor layer. Plasma treatment may be performed using a mixed gas of oxygen and argon.

Figure 4G:
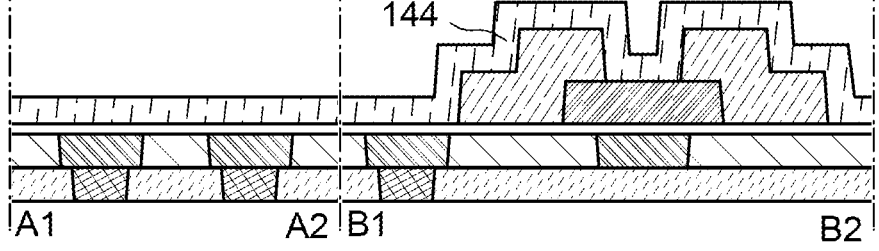

Next, the protective insulating layer 144 is formed in contact with part of the oxide semiconductor layer 140 without exposure to the air (see FIG. 4G).

The protective insulating layer 144 can be formed by a method by which impurities such as water and hydrogen are prevented from being mixed to the protective insulating layer 144, such as a sputtering method, as appropriate. The protective insulating layer 144 has a thickness of at least 1 nm. The protective insulating layer 144 can be formed using silicon oxide, silicon nitride, silicon oxynitride, silicon nitride oxide, or the like. The protective insulating layer 144 can have a single-layer structure or a layered structure. The substrate temperature in forming the protective insulating layer 144 is preferably higher than or equal to room temperature and lower than or equal to 300° C. The atmosphere for forming the protective insulating layer 144 is preferably a rare gas (typically argon) atmosphere, an oxygen atmosphere, or a mixed atmosphere containing a rare gas (typically argon) and oxygen.

If hydrogen is contained in the protective insulating layer 144, the hydrogen may enter the oxide semiconductor layer or extract oxygen in the oxide semiconductor layer, whereby the resistance of the oxide semiconductor layer on the backchannel side might be decreased and a parasitic channel might be formed. Therefore, it is important not to use hydrogen in forming the protective insulating layer 144 so that the oxide insulating layer 144 contains hydrogen as little as possible.

Moreover, the protective insulating layer 144 is preferably formed while water left in the treatment chamber is removed, in order that hydrogen, a hydroxyl group, or moisture is not contained in the oxide semiconductor layer 140 and the protective insulating layer 144.

An entrapment vacuum pump is preferably used in order to remove moisture remaining in the treatment chamber. For example, a cryopump, an ion pump, or a titanium sublimation pump is preferably used. An evacuation unit may be a turbo pump provided with a cold trap. In the deposition chamber that is evacuated with the cryopump, a hydrogen atom and a compound containing a hydrogen atom, such as water ($H_2O$), are removed, for example; thus, the impurity concentration of the protective insulating layer 144 formed in the deposition chamber can be reduced.

As a sputtering gas used for forming the protective insulating layer 144, it is preferable to use a high-purity gas from which an impurity such as hydrogen, water, a hydroxyl group, or hydride is removed so that the concentration is in the ppm range (preferably the ppb range).

Next, second heat treatment is preferably performed in an inert gas atmosphere or an oxygen gas atmosphere (at 200° C. to 400° C. inclusive, for example, at 250° C. to 350° C. inclusive). For example, the second heat treatment is performed at 250° C. for one hour in a nitrogen atmosphere. The second heat treatment can reduce variation in electric characteristics of the transistor.

Furthermore, heat treatment may be performed at 100° C. to 200° C. for one hour to 30 hours in the air. This heat treatment may be performed at a fixed heating temperature; alternatively, the following change in the heating temperature may be conducted plural times repeatedly: the heating temperature is increased from room temperature to a temperature of 100° C. to 200° C. and then decreased to room temperature. This heat treatment may be performed under a reduced pressure before the protective insulating layer is formed. The heat treatment time can be shortened under the reduced pressure. This heat treatment may be performed instead of the second heat treatment or may be performed before or after the second heat treatment, for example.

Figure 5A:
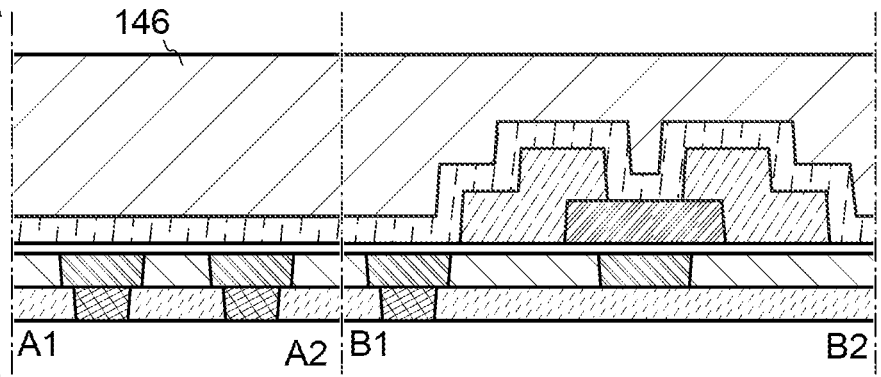
FIGS. 5A to 5D are cross-sectional views illustrating steps for manufacturing a semiconductor device.
Figure 5B:
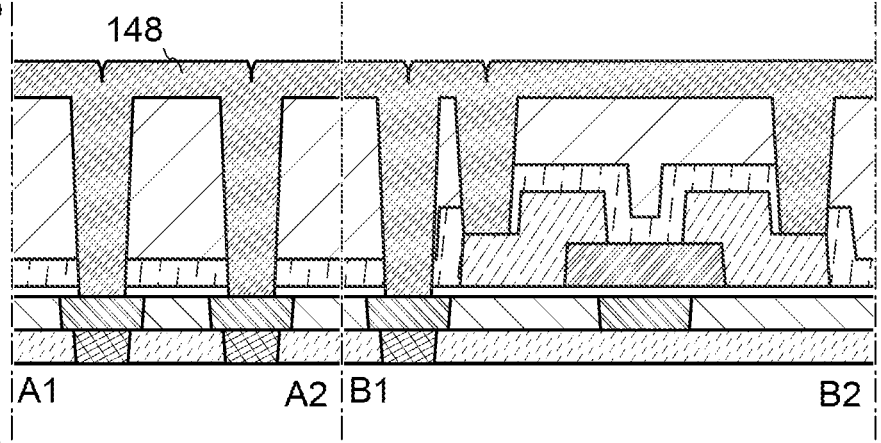

Next, the interlayer insulating layer 146 is formed over the protective insulating layer 144 (see FIG. 5A). The interlayer insulating layer 146 can be formed by a PVD method, a CVD method, or the like. The interlayer insulating layer 146 can be formed using an inorganic insulating material such as silicon oxide, silicon nitride oxide, silicon nitride, hafnium oxide, aluminum oxide, or tantalum oxide. After the formation of the interlayer insulating layer 146, a surface of the interlayer insulating layer 146 is preferably planarized with CMP, etching, or the like.

Next, openings that reach the electrodes 136a, 136b, and 136c and the source/drain electrodes 142a and 142b are formed in the interlayer insulating layer 146, the protective insulating layer 144, and the gate insulating layer 138. Then, a conductive layer 148 is formed so as to be embedded in the openings (see FIG. 5B). The openings can be formed by a method such as etching using a mask. The mask can be formed by a method such as light exposure using a photomask. Either wet etching or dry etching may be used as the etching; dry etching is preferably used in terms of microfabrication. The conductive layer 148 can be formed by a film formation method such as a PVD method or a CVD method. The conductive layer 148 can be formed using a conductive material such as molybdenum, titanium, chromium, tantalum, tungsten, aluminum, copper, neodymium, or scandium or an alloy or a compound (e.g., a nitride) of any of these materials, for example.

Specifically, it is possible to employ a method, for example, in which a thin titanium film is formed in a region including the openings by a PVD method and a thin titanium nitride film is formed by a CVD method, and then, a tungsten film is formed so as to be embedded in the openings. Here, the titanium film formed by a PVD method has a function of reducing an oxide film at the interface with the interlayer insulating layer 146 to decrease the contact resistance with lower electrodes (here, the electrodes 136a, 136b, and 136c and the source/drain electrodes 142a and 142b). The titanium nitride film formed after the formation of the titanium film has a barrier function of preventing diffusion of the conductive material. A copper film may be formed by a plating method after the formation of the barrier film of titanium, titanium nitride, or the like.

Figure 5C:
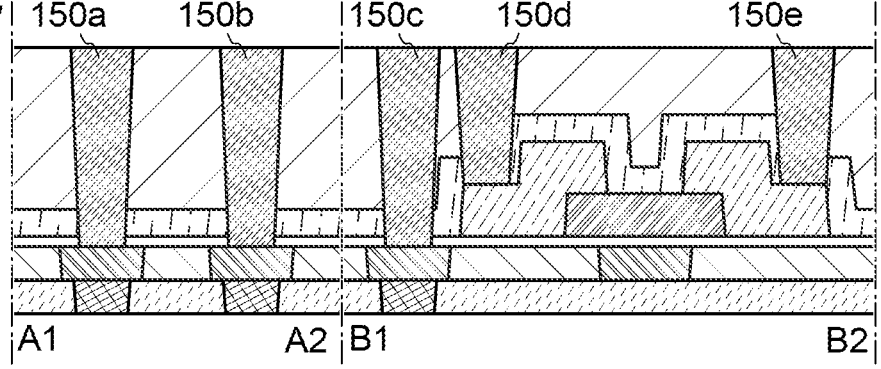
Figure 5D:
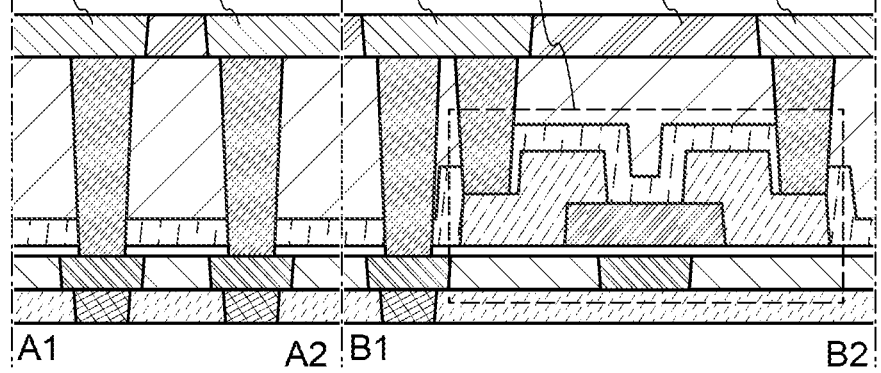

After the conductive layer 148 is formed, part of the conductive layer 148 is removed by etching, CMP, or the like, so that the interlayer insulating layer 146 is exposed and the electrodes 150a, 150b, 150c, 150d, and 150e are formed (see FIG. 5C). Note that when the electrodes 150a, 150b, 150c, 150d, and 150e are formed by removing part of the conductive layer 148, the process is preferably performed so that the surfaces are planarized. The surfaces of the interlayer insulating layer 146 and the electrodes 150a, 150b, 150c, 150d, and 150e are planarized in such a manner, whereby an electrode, a wiring, an insulating layer, a semiconductor layer, and the like can be favorably formed in later steps.

Then, the insulating layer 152 is formed, and openings that reach the electrodes 150a, 150b, 150c, 150d, and 150e are formed in the insulating layer 152. After a conductive layer is formed so as to be embedded in the openings, part of the conductive layer is removed by etching, CMP, or the like. Thus, the insulating layer 152 is exposed and the electrodes 154a, 154b, 154c, and 154d are formed (see FIG. 5D). This step is similar to the step of forming the electrode 150a and the like; therefore, the detailed description is not repeated.

In the case where the transistor 162 is formed by the above-described method, the hydrogen concentration of the oxide semiconductor layer 140 is $5 \times 10^{19}/cm^3$ or less and the off-state current of the transistor 162 is $1 \times 10^{-13}$ A or less. The transistor 162 with excellent characteristics can be obtained by the application of the oxide semiconductor layer 140 that is highly purified by a sufficient reduction in hydrogen concentration as described above. Moreover, it is possible to manufacture a semiconductor device that has excellent characteristics and includes the transistor 160 formed using a material other than an oxide semiconductor in the lower portion and the transistor 162 formed using an oxide semiconductor in the upper portion.

Note that silicon carbide (e.g., 4H—SiC) is a semiconductor material that can be compared to an oxide semiconductor. An oxide semiconductor and 4H—SiC have some things in common. One example is carrier density. Using the Femi-Dirac distribution at room temperature, the density of minority carriers in the oxide semiconductor is estimated to be approximately $1 \times 10^{-7}/cm^3$, which is as extremely low as $6.7 \times 10^{-11}/cm^3$ of 4H—SiC. When the minority carrier density of the oxide semiconductor is compared with the intrinsic carrier density of silicon (approximately $1.4 \times 10^{10}/cm^3$), it is easy to understand that the minority carrier density of the oxide semiconductor is significantly low.

In addition, the energy band gap of the oxide semiconductor is 3.0 eV to 3.5 eV and that of 4H—SiC is 3.26 eV, which means that both the oxide semiconductor and silicon carbide are wide bandgap semiconductors.

In contrast, there is a major difference between the oxide semiconductor and silicon carbide, that is, the process temperature. Heat treatment for activation at 1500° C. to 2000° C. is usually needed in a semiconductor process using silicon carbide, so that it is difficult to form a stack of silicon carbide and a semiconductor element formed using a semiconductor material other than silicon carbide. This is because a semiconductor substrate, a semiconductor element, and the like are damaged by such high temperature. On the other hand, the oxide semiconductor can be formed with heat treatment at 300° C. to 500° C. (at a temperature equal to or lower than the glass transition temperature, approximately 700° C. at the maximum); therefore, a semiconductor element can be formed using an oxide semiconductor after an integrated circuit is formed using another semiconductor material.

The oxide semiconductor has an advantage over silicon carbide in that a low heat-resistant substrate such as a glass substrate can be used. Moreover, the oxide semiconductor also has an advantage in that energy costs can be sufficiently reduced as compared to silicon carbide because heat temperature at high temperature is not necessary.

Note that considerable research has been done on properties of oxide semiconductors, such as the density of states (DOS); however, the research does not include the idea of sufficiently reducing the DOS itself. According to one embodiment of the invention disclosed herein, a highly purified oxide semiconductor is manufactured by removing water and hydrogen which might affect the DOS from the oxide semiconductor. This is based on the idea of sufficiently reducing the DOS itself. Thus, excellent industrial products can be manufactured.

Further, it is also possible to realize a more highly purified (i-type) oxide semiconductor in such a manner that oxygen is supplied to metal dangling bonds generated by oxygen vacancy so that the DOS due to oxygen vacancy is reduced. For example, an oxide film containing an excessive amount of oxygen is formed in close contact with a channel formation region and oxygen is supplied from the oxide film, whereby the DOS due to oxygen vacancy can be reduced.

A defect of the oxide semiconductor is said to be attributed to a shallow level of 0.1 eV to 0.2 eV below the conduction band due to excessive hydrogen, a deep level due to shortage of oxygen, or the like. The technical idea that hydrogen is drastically reduced and oxygen is adequately supplied in order to eliminate such a defect would be right.

An oxide semiconductor is generally considered as an n-type semiconductor; however, according to one embodiment of the invention disclosed herein, an i-type semiconductor is realized by removing impurities, particularly water and hydrogen. In this respect, it can be said that one embodiment of the invention disclosed herein includes a novel technical idea because it is different from an i-type semiconductor such as silicon added with an impurity.

Note that this embodiment shows a bottom-gate structure as the structure of the transistor 162; however, one embodiment of the present invention is not limited to this. For example, the transistor 162 can have a top-gate structure. Alternatively, the transistor 162 can have a dual-gate structure in which two gate electrode layers are provided above and below a channel formation region with gate insulating layers therebetween.

<Electrical Conduction Mechanism of Transistor Including Oxide Semiconductor>

An electrical conduction mechanism of a transistor including an oxide semiconductor will be described with reference to FIG. 24, FIGS. 25A and 25B, FIGS. 26A and 26B, and FIG. 27. Note that the following description is just a consideration and does not deny the validity of the invention.

Figure 24:
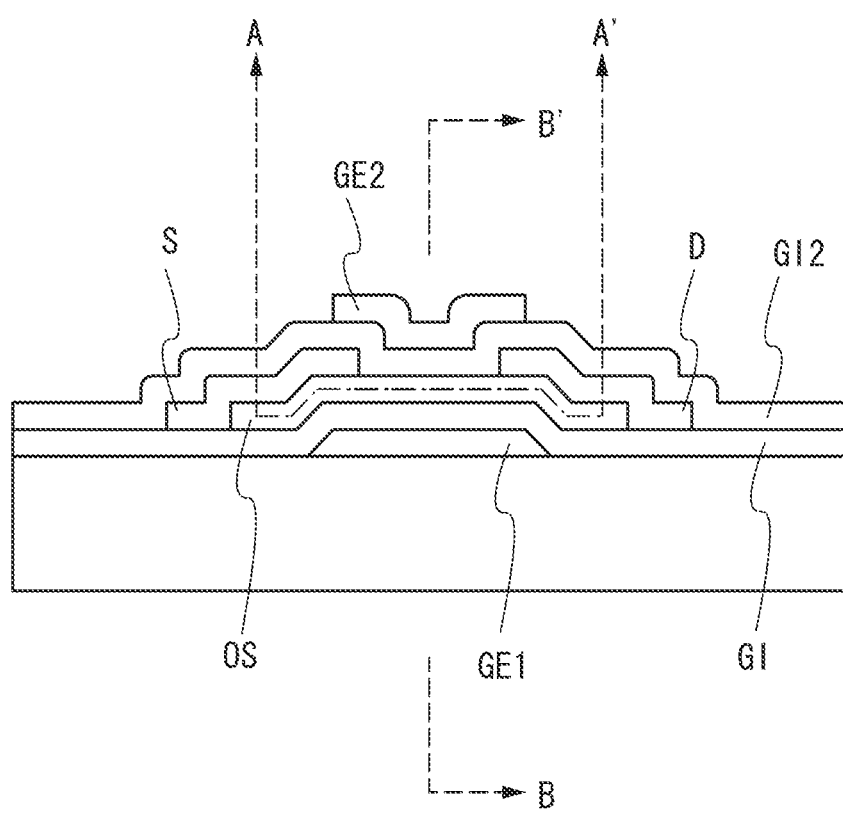
FIG. 24 is a cross-sectional view of an inverted staggered transistor including an oxide semiconductor.

FIG. 24 is a cross-sectional view of a dual-gate transistor (thin film transistor) including an oxide semiconductor. An oxide semiconductor layer (OS) is provided over a gate electrode layer (GE1) with a gate insulating layer (GI1) therebetween, and a source electrode (S) and a drain electrode (D) are formed thereover. Moreover, a gate insulating layer (GI2) is provided so as to cover the oxide semiconductor layer (OS), the source electrode (S), and the drain electrode (D). A gate electrode (GE2) is provided over the oxide semiconductor layer (OS) with the gate insulating layer (GI2) therebetween.

Figure 25A:
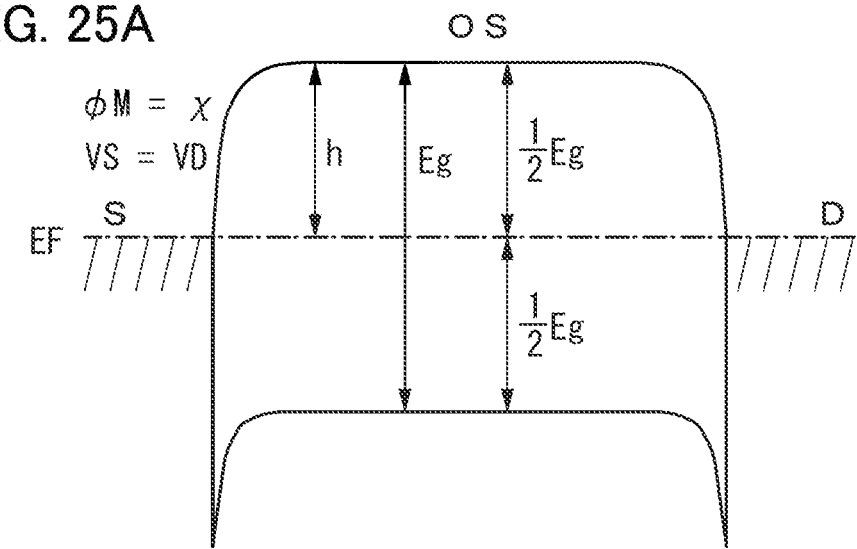
FIGS. 25A and 25B are energy band diagrams (schematic diagrams) of a cross section A-A' in FIG. 24.
Figure 25B:
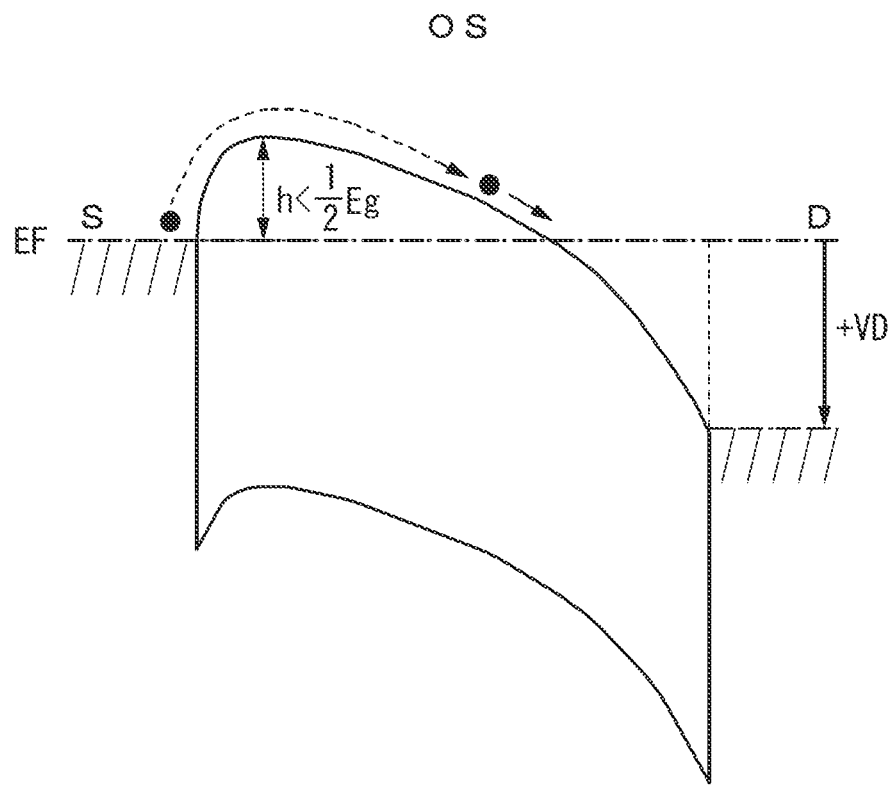

FIGS. 25A and 25B are energy band diagrams (schematic diagrams) of the cross section A-A' in FIG. 24. FIG. 25A illustrates the case where the potential difference between the source and the drain is zero (the source and the drain have the same potential, $V_D=0$ V). FIG. 25B illustrates the case where the potential of the drain is higher than that of the source ($V_D>0$).

Figure 26A:
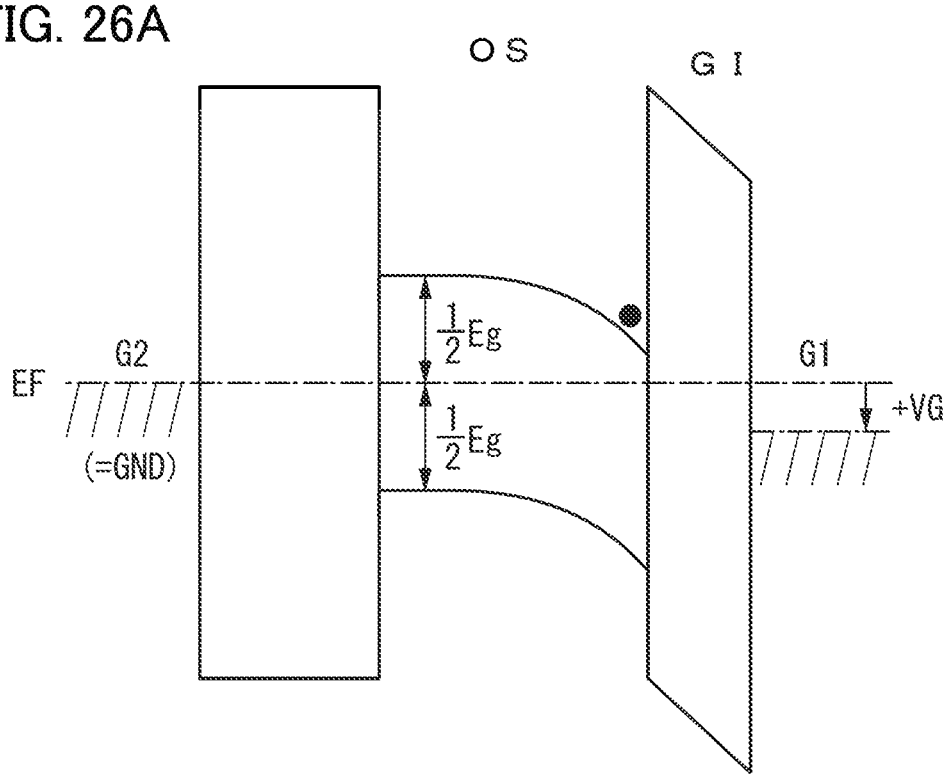
FIG. 26A illustrates a state in which a positive potential $(+V_G)$ is applied to a gate (G1)
Figure 26B:
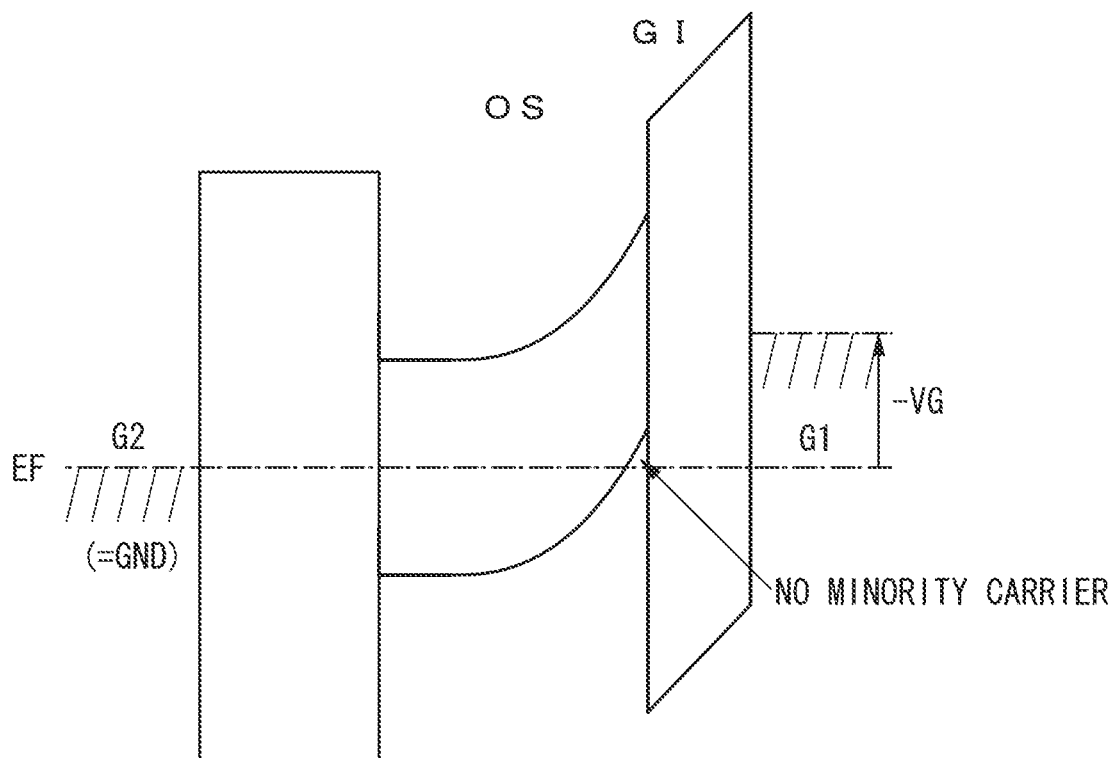
FIG. 26B illustrates a state in which a negative potential $(-V_G)$ is applied to the gate (G1)

FIGS. 26A and 26B are energy band diagrams (schematic diagrams) of the cross section B-B' in FIG. 24. FIG. 26A illustrates a state where a positive potential ($+V_G$) is applied to the gate (G1), that is, an on state where carriers (electrons)

flow between the source and the drain. FIG. 26B illustrates a state where a negative potential ($-V_G$) is applied to the gate (G1), that is, an off state (a state where minority carriers do not flow).

Figure 27:
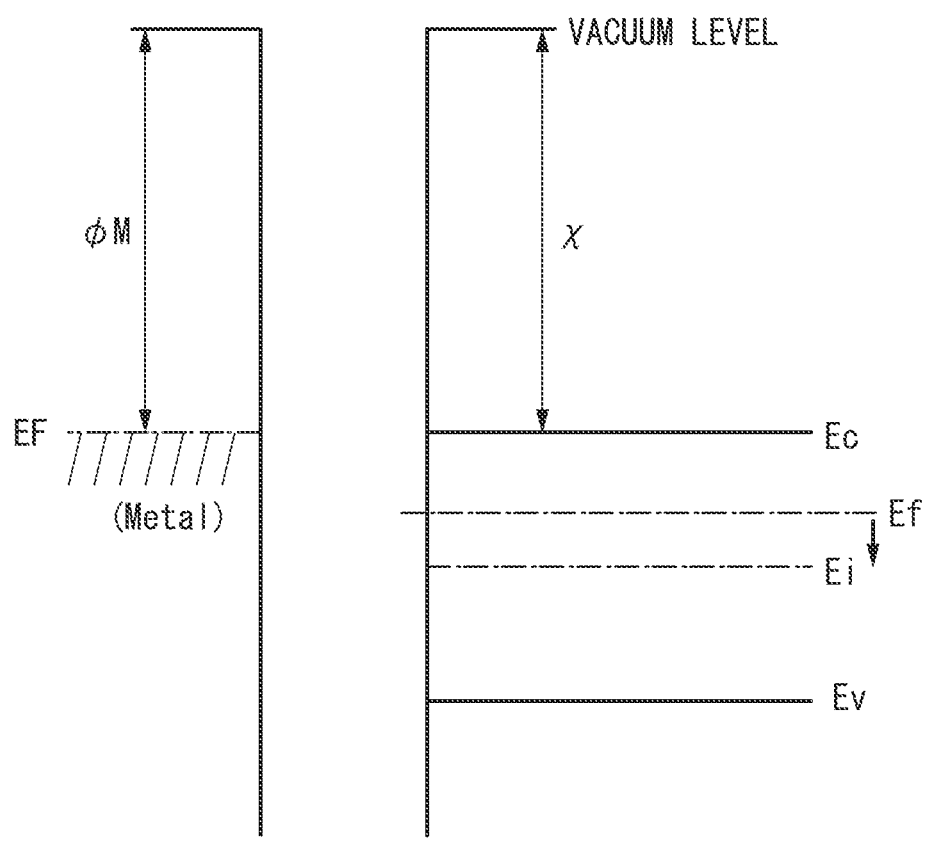
FIG. 27 illustrates a relation between the vacuum level, the work function $(\varphi_M)$ of a metal, and the electron affinity $(\chi)$ of an oxide semiconductor.

FIG. 27 illustrates the relation between the vacuum level, the work function ($\varphi_M$) of a metal, and the electron affinity ($\chi$) of an oxide semiconductor.

A conventional oxide semiconductor is an n-type semiconductor. The Fermi level ($E_f$) is distant from the intrinsic Fermi level ($E_i$) at the center of the band gap and is located near the conduction band. Note that it is known that part of hydrogen in an oxide semiconductor serves as a donor, which is one of the factors that make the oxide semiconductor an n-type semiconductor.

In contrast, the oxide semiconductor according to one embodiment of the invention disclosed herein is an intrinsic (an i-type) or substantially intrinsic oxide semiconductor obtained in the following manner: hydrogen, which is a factor that makes an n-type semiconductor, is removed from the oxide semiconductor for high purification so that the oxide semiconductor contains an element other than its main element (i.e., an impurity element) as little as possible. In other words, the oxide semiconductor according to one embodiment of the invention disclosed herein is a highly purified i-type (intrinsic) semiconductor or a substantially intrinsic semiconductor obtained by removing impurities such as hydrogen and water as much as possible, not by adding an impurity element. Thus, the Fermi level ($E_f$) can be comparable with the intrinsic Fermi level ($E_i$).

The electron affinity ($\chi$) of the oxide semiconductor is said to be 4.3 eV in the case where the band gap ($E_g$) is 3.15 eV. The work function of titanium (Ti) included in the source electrode and the drain electrode is substantially equal to the electron affinity ($\chi$) of the oxide semiconductor. In this case, the Schottky barrier for electrons is not formed at the interface between the metal and the oxide semiconductor.

That is to say, in the case where the work function ($\varphi_M$) of the metal is equal to the electron affinity ($\chi$) of the oxide semiconductor and the metal and the oxide semiconductor are in contact with each other, an energy band diagram (a schematic diagram) illustrated in FIG. 25A is obtained.

In FIG. 25B, a black dot (•) indicates an electron. When a positive potential is applied to the drain, the electron crosses over a barrier (h) and is injected into the oxide semiconductor, and flows toward the drain. The height of the barrier (h) changes depending on the gate voltage and drain voltage. When a positive drain voltage is applied, the height of the barrier is smaller than that of the barrier in FIG. 25A where no voltage is applied, that is, smaller than ½ of the band gap ($E_g$).

At this time, as illustrated in FIG. 26A, the electron travels in the vicinity of the interface between the gate insulating layer and the highly purified oxide semiconductor (the lowest part of the oxide semiconductor, which is energetically stable).

As illustrated in FIG. 26B, when a negative potential is applied to the gate electrode (G1), a hole which is a minority carrier does not exist substantially, so that the current value is substantially close to 0.

In such a manner, the oxide semiconductor layer becomes intrinsic (an i-type semiconductor) or substantially intrinsic by being highly purified so as to contain an element other than its main element (i.e., an impurity element) as little as possible. Thus, characteristics of the interface between the oxide semiconductor and the gate insulating layer become obvious. For that reason, the gate insulating layer needs to form a favorable interface with the oxide semiconductor. Specifically, it is preferable to use the following insulating layer, for example: an insulating layer formed by a CVD method using high-density plasma generated with a power supply frequency in the range of the VHF band to the microwave band, or an insulating layer formed by a sputtering method.

When the interface between the oxide semiconductor and the gate insulating layer is made favorable while the oxide semiconductor is highly purified, in the case where the transistor has a channel width W of $1\times10^4$ µm and a channel length L of 3 µm, for example, it is possible to realize an off-state current of $1\times10^{-13}$ A or less and a subthreshold swing (S value) of 0.1 V/dec at room temperature (with a 100-nm-thick gate insulating layer).

The oxide semiconductor is highly purified as described above so as to contain an element other than its main element (i.e., an impurity element) as little as possible, so that the thin film transistor can operate in a favorable manner.

Modification Example

FIG. 6, FIGS. 7A and 7B, FIGS. 8A and 8B, and FIGS. 9A and 9B illustrate modification examples of structures of semiconductor devices. The semiconductor devices in each of which the transistor 162 has a structure different from that described above will be described below as modification examples. That is, the structure of the transistor 160 is the same as the above.

Figure 6:
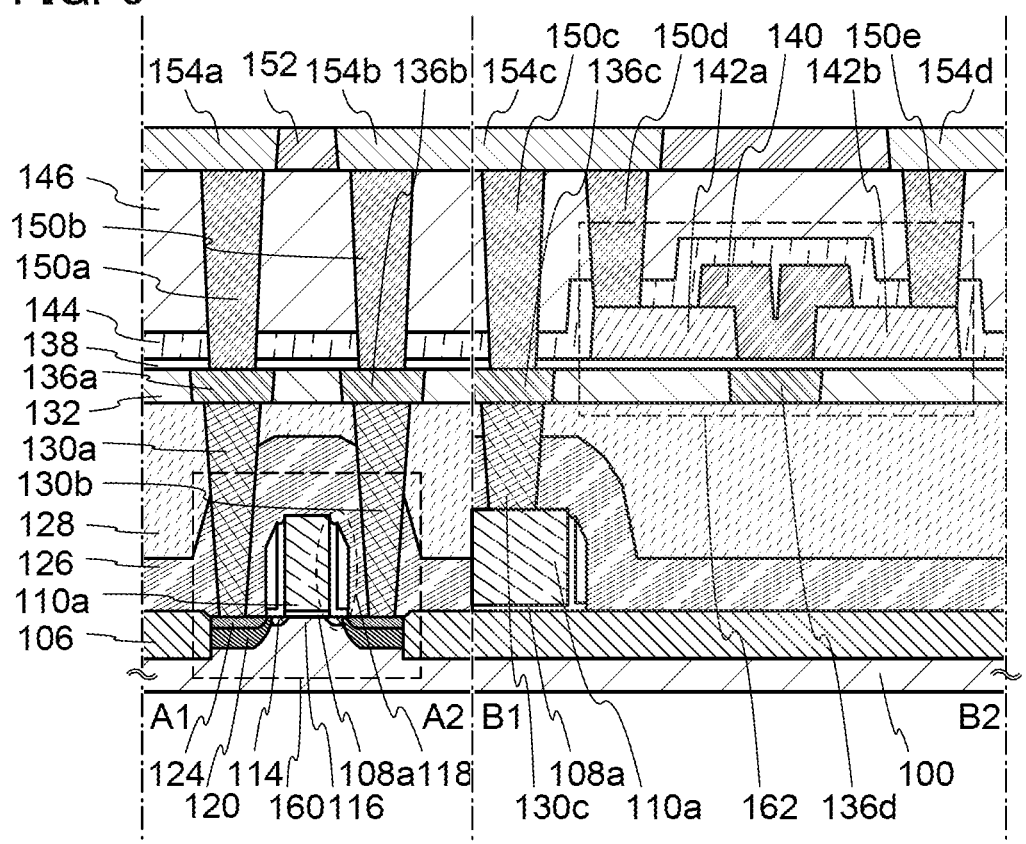
FIG. 6 is a cross-sectional view of a semiconductor device.

FIG. 6 illustrates an example of a semiconductor device including the transistor 162 in which the gate electrode 136d is placed below the oxide semiconductor layer 140 and the source/drain electrodes 142a and 142b are in contact with a bottom surface of the oxide semiconductor layer 140. Note that the planar structure can be changed as appropriate to correspond to the cross section; therefore, only the cross section is shown here.

A big difference between the structure in FIG. 6 and the structure in FIG. 2A is the position at which the oxide semiconductor layer 140 is connected to the source/drain electrodes 142a and 142b. That is, a top surface of the oxide semiconductor layer 140 is in contact with the source/drain electrodes 142a and 142b in the structure in FIG. 2A, whereas the bottom surface of the oxide semiconductor layer 140 is in contact with the source/drain electrodes 142a and 142b in the structure in FIG. 6. Moreover, the difference in the contact position results in a different arrangement of other electrodes, an insulating layer, and the like. The details of each component are the same as those of FIGS. 2A and 2B.

Specifically, the semiconductor device illustrated in FIG. 6 includes the gate electrode 136d provided over the interlayer insulating layer 128, the gate insulating layer 138 provided over the gate electrode 136d, the source/drain electrodes 142a and 142b provided over the gate insulating layer 138, and the oxide semiconductor layer 140 in contact with top surfaces of the source/drain electrodes 142a and 142b.

Here, the gate electrode 136d is provided so as to be embedded in the insulating layer 132 formed over the interlayer insulating layer 128. Like the gate electrode 136d, the electrode 136a, the electrode 136b, and the electrode 136c are formed in contact with the source/drain electrode 130a, the source/drain electrode 130b, and the electrode 130c, respectively.

The protective insulating layer 144 is provided over the transistor 162 so as to be in contact with part of the oxide semiconductor layer 140. The interlayer insulating layer 146 is provided over the protective insulating layer 144. Openings that reach the source/drain electrode 142a and the source/drain electrode 142b are formed in the protective insulating layer 144 and the interlayer insulating layer 146. The electrode 150d and the electrode 150e are formed in contact with the source/drain electrode 142a and the source/drain electrode 142b, respectively, through the respective openings. Like the electrodes 150d and 150e, the electrodes 150a, 150b, and 150c are formed in contact with the electrodes 136a, 136b, and 136c, respectively, through openings provided in the gate insulating layer 138, the protective insulating layer 144, and the interlayer insulating layer 146.

The insulating layer 152 is provided over the interlayer insulating layer 146. The electrodes 154a, 154b, 154c, and 154d are provided so as to be embedded in the insulating layer 152. The electrode 154a is in contact with the electrode 150a. The electrode 154b is in contact with the electrode 150b. The electrode 154c is in contact with the electrode 150c and the electrode 150d. The electrode 154d is in contact with the electrode 150e.

Figure 7A:
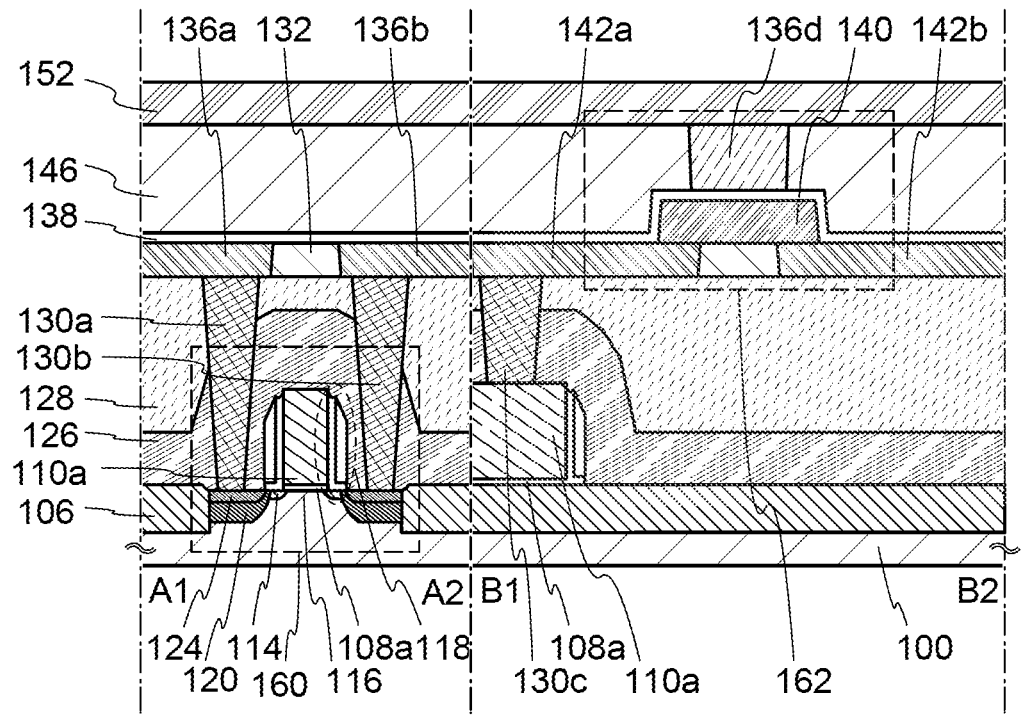
FIGS. 7A and 7B are cross-sectional views each illustrating a semiconductor device.
Figure 7B:
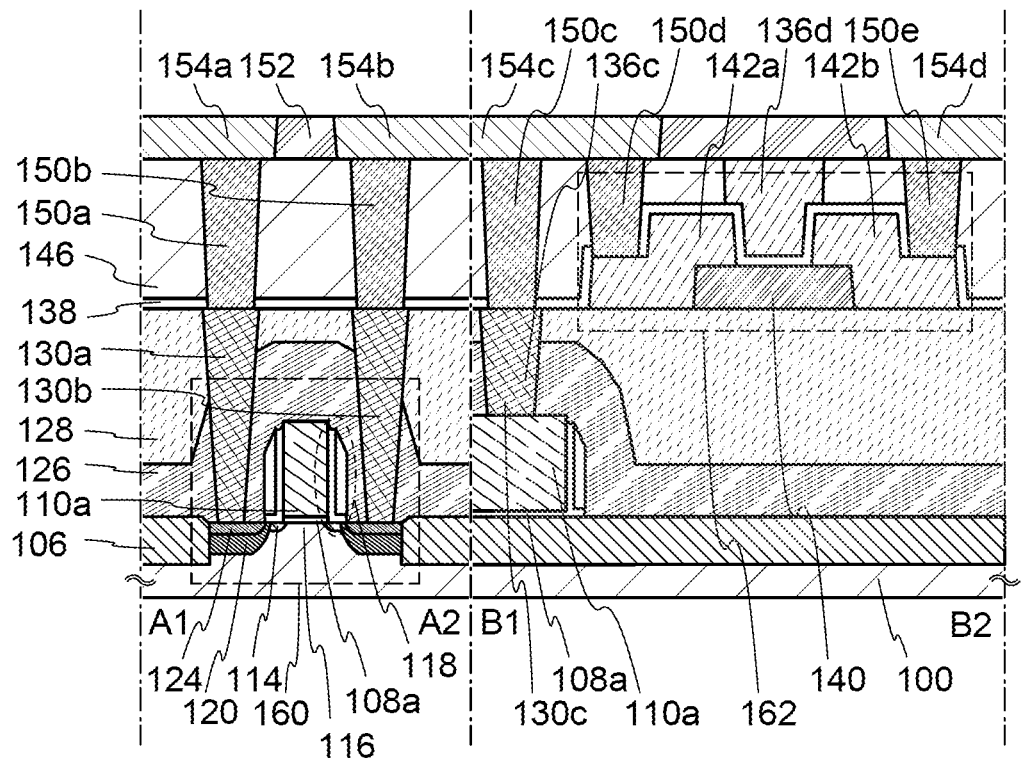

FIGS. 7A and 7B each illustrate an example of a structure of a semiconductor device in which the gate electrode 136d is placed over the oxide semiconductor layer 140. FIG. 7A illustrates an example of a structure in which the source/drain electrodes 142a and 142b are in contact with a bottom surface of the oxide semiconductor layer 140. FIG. 7B illustrates an example of a structure in which the source/drain electrodes 142a and 142b are in contact with a top surface of the oxide semiconductor layer 140.

A big difference between the structures in FIGS. 7A and 7B and those in FIG. 2A and FIG. 6 is that the gate electrode 136d is placed over the oxide semiconductor layer 140. Furthermore, a big difference between the structure in FIG. 7A and the structure in FIG. 7B is that the source/drain electrodes 142a and 142b are in contact with either the bottom surface or the top surface of the oxide semiconductor layer 140. Moreover, these differences result in a different arrangement of other electrodes, an insulating layer, and the like. The details of each component are the same as those of FIGS. 2A and 2B, and the like.

Specifically, the semiconductor device illustrated in FIG. 7A includes the source/drain electrodes 142a and 142b provided over the interlayer insulating layer 128, the oxide semiconductor layer 140 in contact with top surfaces of the source/drain electrodes 142a and 142b, the gate insulating layer 138 provided over the oxide semiconductor layer 140, and the gate electrode 136d over the gate insulating layer 138 in a region overlapping with the oxide semiconductor layer 140.

The semiconductor device in FIG. 7B includes the oxide semiconductor layer 140 provided over the interlayer insulating layer 128, the source/drain electrodes 142a and 142b provided to be in contact with a top surface of the oxide semiconductor layer 140, the gate insulating layer 138 provided over the oxide semiconductor layer 140 and the source/drain electrodes 142a and 142b, and the gate electrode 136d over the gate insulating layer 138 in a region overlapping with the oxide semiconductor layer 140.

Note that in the structures in FIGS. 7A and 7B, a component (e.g., the electrode 150a or the electrode 154a) is sometimes omitted from the structure in FIGS. 2A and 2B or the like. In this case, a secondary effect such as simplification of a manufacturing process can be obtained. It is needless to say that a nonessential component can be omitted in the structures in FIGS. 2A and 2B and the like.

Figure 8A:
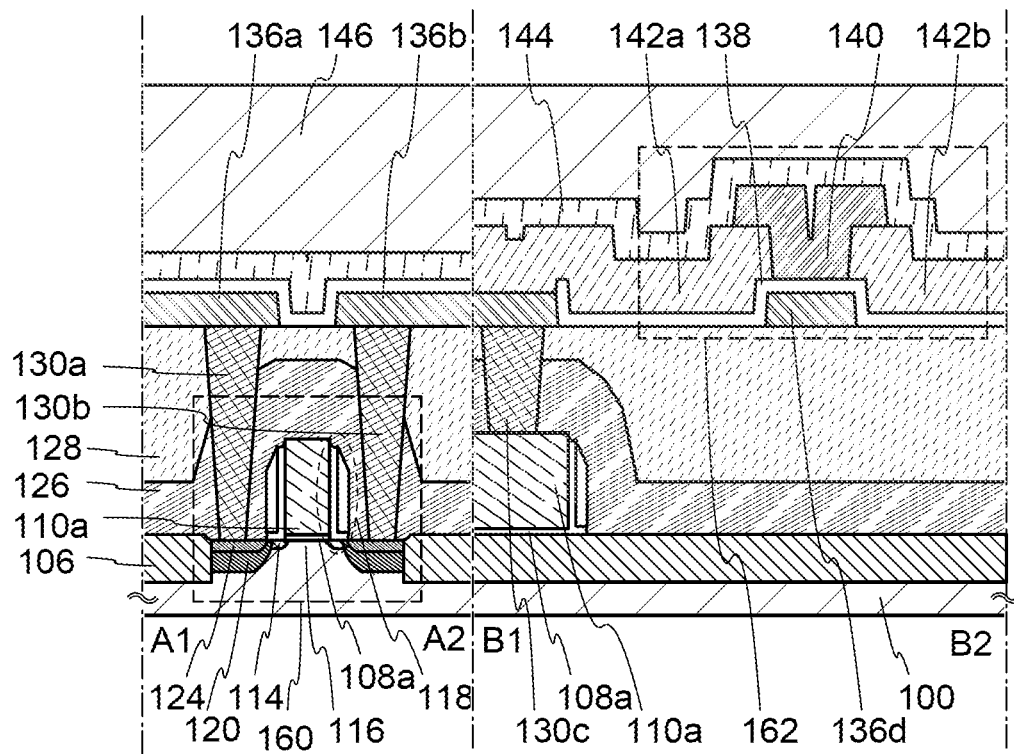
FIGS. 8A and 8B are cross-sectional views each illustrating a semiconductor device.
Figure 8B:
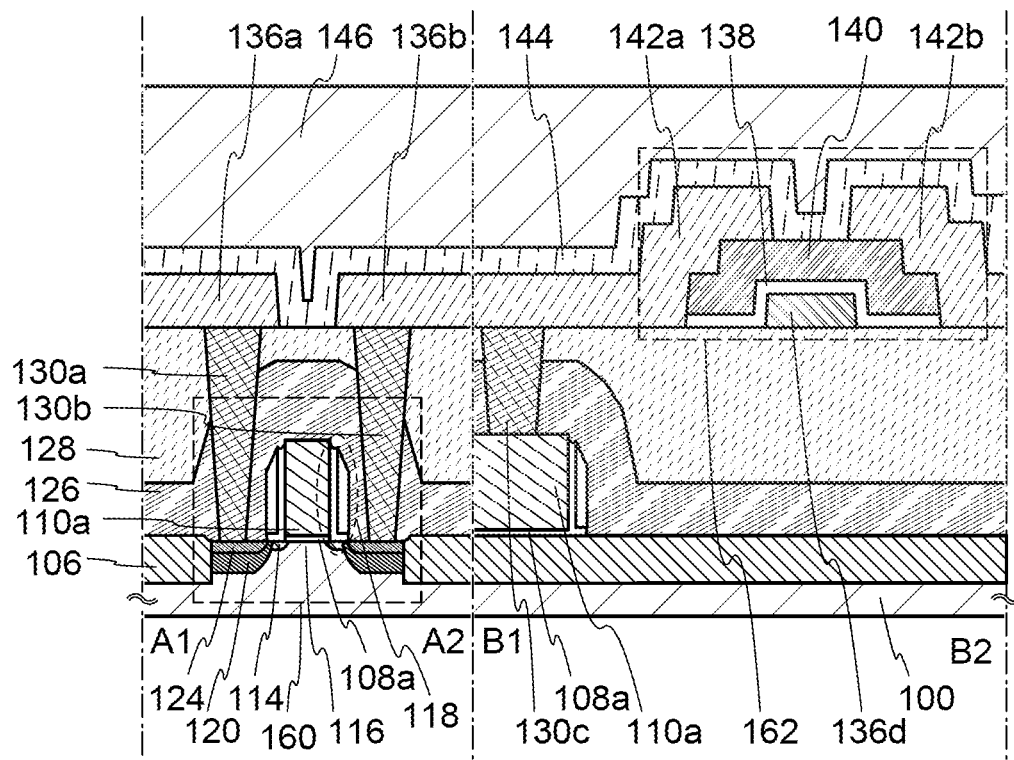

FIGS. 8A and 8B each illustrate an example of the case where the size of the element is relatively large and the gate electrode 136d is placed below the oxide semiconductor layer 140. In this case, a demand for the planarity of a surface and the coverage is relatively moderate, so that it is not necessary to form a wiring, an electrode, and the like to be embedded in an insulating layer. For example, the gate electrode 136d and the like can be formed by patterning after formation of a conductive layer. Note that although not illustrated here, the transistor 160 can be formed in a similar manner.

A big difference between the structure in FIG. 8A and the structure in FIG. 8B is that the source/drain electrodes 142a and 142b are in contact with either the bottom surface or the top surface of the oxide semiconductor layer 140. Moreover, this difference results in other electrodes, an insulating layer, and the like being arranged in a different manner. The details of each component are the same as those of FIGS. 2A and 2B, and the like.

Specifically, the semiconductor device in FIG. 8A includes the gate electrode 136d provided over the interlayer insulating layer 128, the gate insulating layer 138 provided over the gate electrode 136d, the source/drain electrodes 142a and 142b provided over the gate insulating layer 138, and the oxide semiconductor layer 140 in contact with top surfaces of the source/drain electrodes 142a and 142b.

The semiconductor device in FIG. 8B includes the gate electrode 136d provided over the interlayer insulating layer 128, the gate insulating layer 138 provided over the gate electrode 136d, the oxide semiconductor layer 140 provided over the gate insulating layer 138 overlapping with the gate electrode 136d, and the source/drain electrodes 142a and 142b provided to be in contact with a top surface of the oxide semiconductor layer 140.

Note that also in the structures in FIGS. 8A and 8B, a component is sometimes omitted from the structure in FIGS. 2A and 2B or the like. Also in this case, a secondary effect such as simplification of a manufacturing process can be obtained.

Figure 9A:
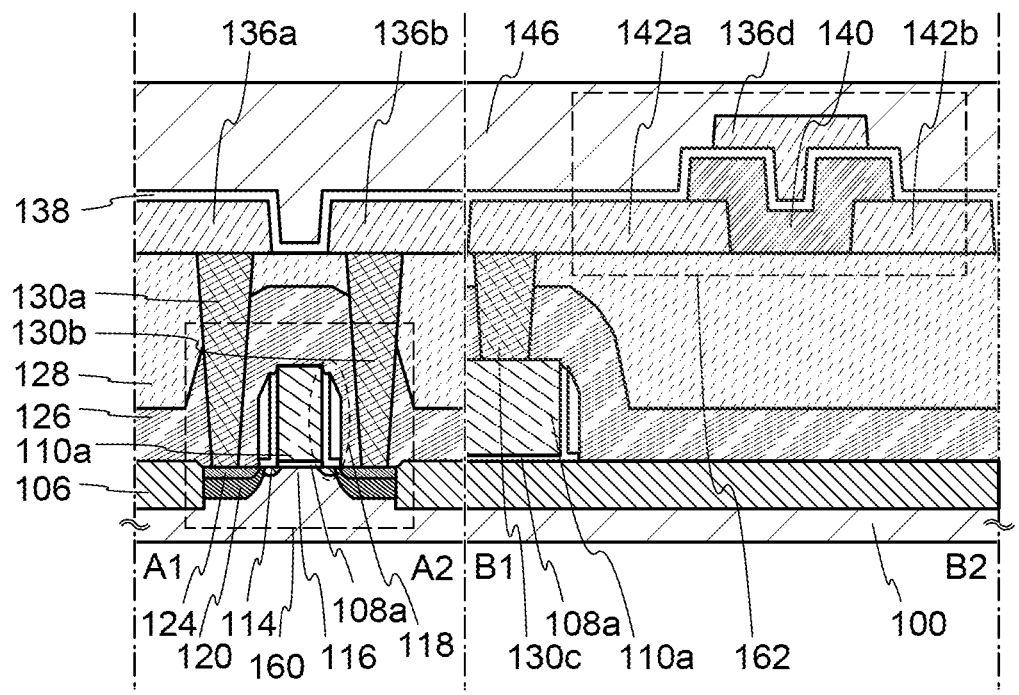
FIGS. 9A and 9B are cross-sectional views each illustrating a semiconductor device.
Figure 9B:
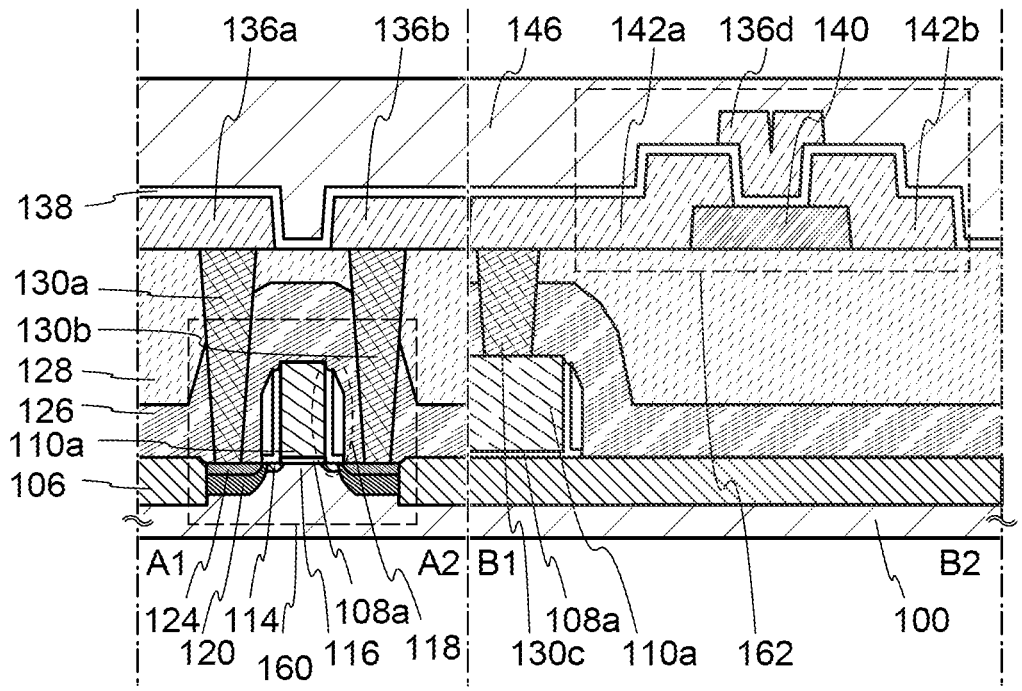

FIGS. 9A and 9B each illustrate an example of the case where the size of the element is relatively large and the gate electrode 136d is placed over the oxide semiconductor layer 140. Also in this case, a demand for the planarity of a surface and the coverage is relatively moderate, so that it is not necessary to form a wiring, an electrode, and the like to be embedded in an insulating layer. For example, the gate electrode 136d and the like can be formed by patterning after formation of a conductive layer. Note that although not illustrated here, the transistor 160 can be formed in a similar manner.

A big difference between the structure in FIG. 9A and the structure in FIG. 9B is that the source/drain electrodes 142a and 142b are in contact with either the bottom surface or the top surface of the oxide semiconductor layer 140. Moreover, this difference results in other electrodes, an insulating layer, and the like being arranged in a different manner. The details of each component are the same as those of FIGS. 2A and 2B, and the like.

Specifically, the semiconductor device in FIG. 9A includes the source/drain electrodes 142a and 142b provided over the interlayer insulating layer 128, the oxide semiconductor layer 140 in contact with top surfaces of the source/drain electrodes 142a and 142b, the gate insulating layer 138 provided over the source/drain electrodes 142a and 142b and the oxide semiconductor layer 140, and the gate electrode 136d provided over the gate insulating layer 138 in a region overlapping with the oxide semiconductor layer 140.

The semiconductor device in FIG. 9B includes the oxide semiconductor layer 140 provided over the interlayer insulating layer 128, the source/drain electrodes 142a and 142b provided to be in contact with a top surface of the oxide semiconductor layer 140, the gate insulating layer 138 provided over the source/drain electrodes 142a and 142b and the oxide semiconductor layer 140, and the gate electrode 136d provided over the gate insulating layer 138 in a region overlapping with the oxide semiconductor layer 140.

Note that also in the structures in FIGS. 9A and 9B, a component is sometimes omitted from the structure in FIGS. 2A and 2B or the like. Also in this case, a secondary effect such as simplification of a manufacturing process can be obtained.

As described above, a semiconductor device with a novel structure can be realized according to one embodiment of the invention disclosed herein. In this embodiment, the examples in each of which the semiconductor device is formed by stacking the transistor 160 and the transistor 162 are described; however, the structure of the semiconductor device is not limited to this structure. Moreover, this embodiment shows the examples in each of which the channel length direction of the transistor 160 is perpendicular to that of the transistor 162; however, the positional relation between the transistors 160 and 162 is not limited to this example. In addition, the transistor 160 and the transistor 162 may be provided to overlap with each other.

In this embodiment, the semiconductor device with a minimum storage unit (one bit) is described for simplification; however, the structure of the semiconductor device is not limited thereto. A more advanced semiconductor device can be formed by connecting a plurality of semiconductor devices as appropriate. For example, a NAND-type or NOR-type semiconductor device can be formed by using a plurality of the above-described semiconductor devices. The wiring configuration is not limited to that in FIG. 1 and can be changed as appropriate.

The semiconductor device according to this embodiment can store data for an extremely long time because the transistor 162 has low off-state current. That is, refresh operation which is necessary in a DRAM and the like is not needed, so that power consumption can be suppressed. Moreover, the semiconductor device according to this embodiment can be used as a substantially non-volatile semiconductor device.

Since writing or the like of data is performed with switching operation of the transistor 162, high voltage is not necessary and deterioration of the element does not become a problem. Furthermore, data is written and erased depending on on and off of the transistor, whereby high-speed operation can be easily realized. In addition, it is also advantageous in that there is no need of operation for erasing data, which is necessary in a flash memory and the like.

Since a transistor including a material other than an oxide semiconductor can operate at sufficiently high speed, stored data can be read out at high speed by using the transistor.

The structures and methods described in this embodiment can be combined as appropriate with any of the structures and methods described in the other embodiments.

Embodiment 2

In this embodiment, a circuit configuration and operation of a storage element in a semiconductor device according to one embodiment of the present invention will be described.

Figure 10:
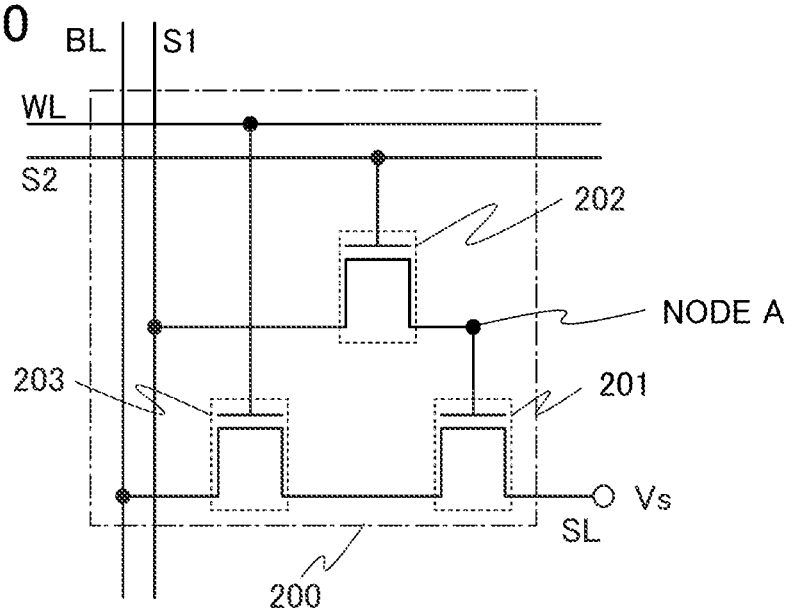
FIG. 10 is a circuit diagram of a storage element.

FIG. 10 illustrates an example of a circuit diagram of a storage element (hereinafter also referred to as a memory cell) included in a semiconductor device. A memory cell 200 illustrated in FIG. 10 includes a first wiring SL (a source line), a second wiring BL (a bit line), a third wiring S1 (a first signal line), a fourth wiring S2 (a second signal line), a fifth wiring WL (a word line), a transistor 201 (a first transistor), a transistor 202 (a second transistor), and a transistor 203 (a third transistor). The transistors 201 and 203 are formed using a material other than an oxide semiconductor. The transistor 202 is formed using an oxide semiconductor.

A gate electrode of the transistor 201 and one of a source electrode and a drain electrode of the transistor 202 are electrically connected to each other. The first wiring and a source electrode of the transistor 201 are electrically connected to each other. A drain electrode of the transistor 201 and a source electrode of the transistor 203 are electrically connected to each other. The second wiring and a drain electrode of the transistor 203 are electrically connected to each other. The third wiring and the other of the source electrode and the drain electrode of the transistor 202 are electrically connected to each other. The fourth wiring and a gate electrode of the transistor 202 are electrically connected to each other. The fifth wiring and a gate electrode of the transistor 203 are electrically connected to each other.

Next, operation of the circuit will be specifically described.

When data is written into the memory cell 200, the first wiring, the fifth wiring, and the second wiring are set to 0 V and the fourth wiring is set to 2 V. The third wiring is set to 2 V in order to write data "1" and set to 0 V in order to write data "0". At this time, the transistor 203 is turned off and the transistor 202 is turned on. Note that at the end of the writing, before the potential of the third wiring is changed, the fourth wiring is set to 0 V so that the transistor 202 is turned off.

Figure 11:
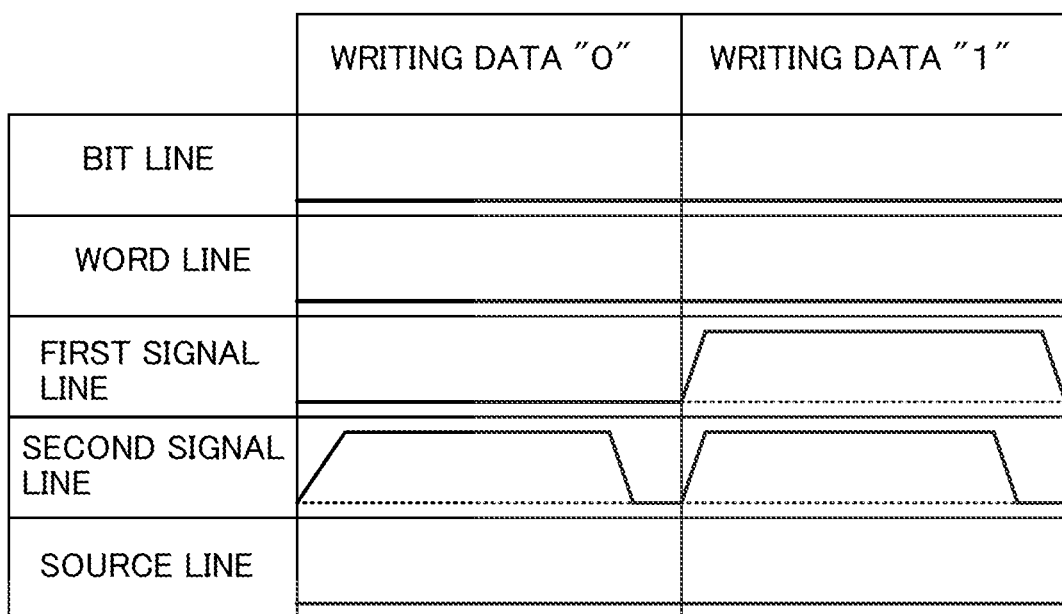
FIG. 11 is a timing chart for illustrating operation of a storage element.

As a result, a potential of a node (hereinafter referred to as a node A) connected to the gate electrode of the transistor 201 is set to approximately 2 V after the writing of the data "1" and set to approximately 0 V after the writing of the data "0". Electric charge corresponding to the potential of the third wiring is stored at the node A; since the off-state current of the transistor 202 is extremely low or substantially 0, the potential of the gate electrode of the transistor 201 is held for a ling time. FIG. 11 illustrates an example of a timing chart of writing operation.

Then, when data is read from the memory cell, the first wiring, the fourth wiring, and the third wiring are set to 0 V; the fifth wiring is set to 2 V; and a reading circuit connected to the second wiring is set to an operation state. At this time, the transistor 203 is turned on and the transistor 202 is turned off.

The transistor 201 is off when the data "0" has been written, that is, the node A is set to approximately 0 V, so that the resistance between the second wiring and the first wiring is high. On the other hand, the transistor 201 is on when the data "1" has been written, that is, the node A is set to approximately 2 V, so that the resistance between the second wiring and the first wiring is low. The reading circuit can read data "0" or data "1" from the difference of the resistance state of the memory cell. Note that the second wiring at the time of the writing is set to 0 V; alternatively, it may be in a floating state or may be charged to have a potential higher than 0 V. The third wiring at the time of the reading is set to 0 V; alternatively, it may be in a floating state or may be charged to have a potential higher than 0 V.

Note that data "1" and data "0" are defined for convenience and may be reversed. Moreover, the above-described operation voltages are one example. The operation voltages are set so that the transistor 201 is turned off in the case of data "0" and turned on in the case of data "1", the transistor 202 is turned on at the time of writing and turned off in periods except the time of writing, and the transistor 203 is turned on at the time of reading. In particular, a power supply potential VDD of a peripheral logic circuit may be used instead of 2 V.

Figure 12:
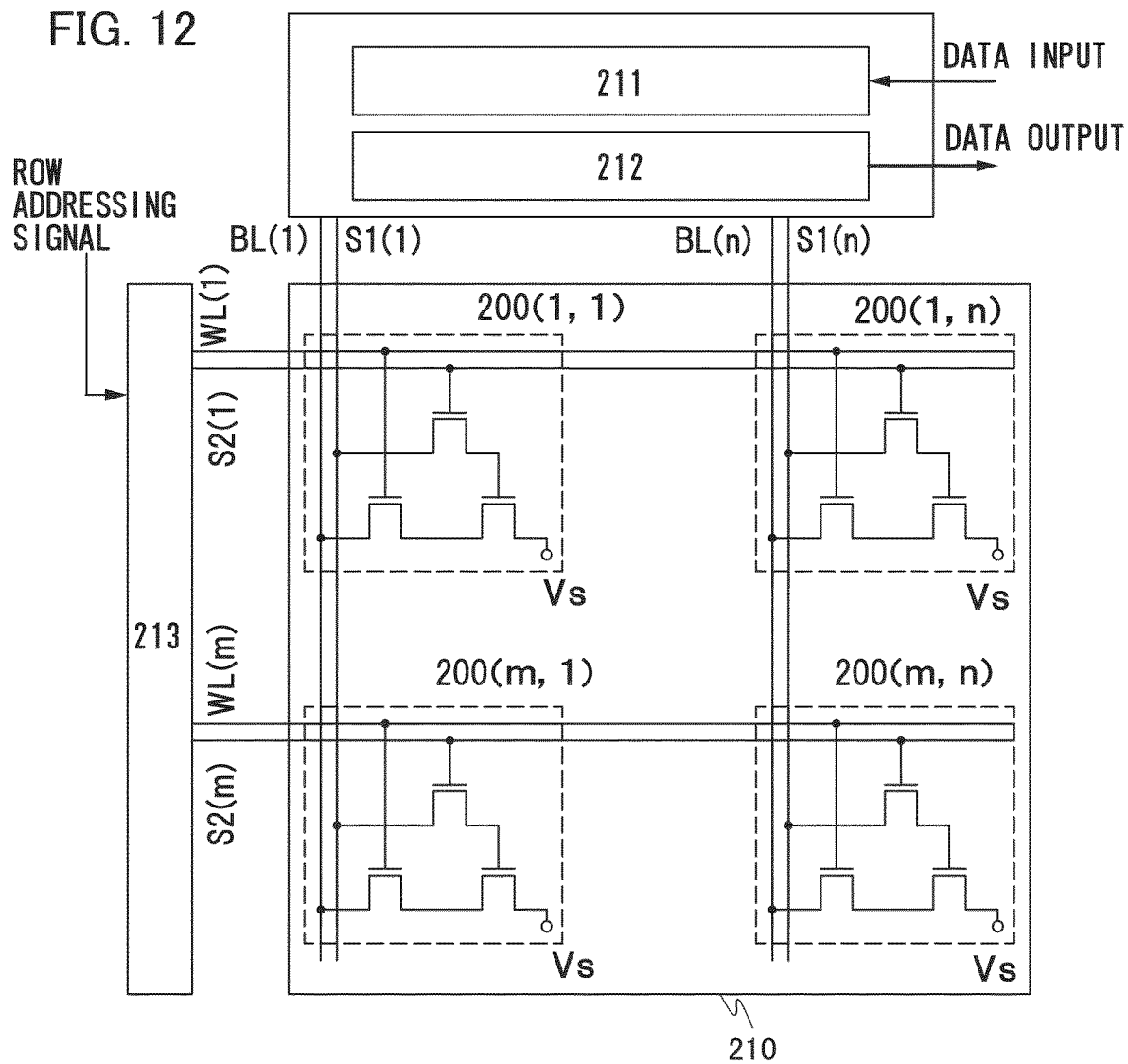
FIG. 12 is a circuit diagram of a semiconductor device.

FIG. 12 is a block circuit diagram of a semiconductor device with a storage capacity of (m×n) bits according to one embodiment of the present invention.

The semiconductor device according to one embodiment of the present invention includes in fourth wirings, in fifth wirings, n second wirings, n third wirings, a memory cell array 210 in which a plurality of memory cells 200(1,1) to 200(m,n) are arranged in a matrix of in rows by n columns (in and n are each a natural number), and peripheral circuits such as a circuit 211 for driving the second wirings and the third wirings, a circuit 213 for driving the fourth wirings and the fifth wirings, and a reading circuit 212. As another peripheral circuit, a refresh circuit or the like may be provided.

The memory cell 200(i,j) is considered as a typical example of the memory cells. Here, the memory cell 200(i,j) (i is an integer of 1 to in and j is an integer of 1 to n) is connected to the second wiring BL(j), the third wiring S1(j), the fifth wiring WL(i), the fourth wiring S2(i), and the first wiring. A first wiring potential Vs is supplied to the first wiring. The second wirings BL(1) to BL(n) and the third wirings S1(1) to S1(n) are connected to the circuit 211 for driving the second wirings and the third wirings and the reading circuit 212. The fifth wirings WL(1) to WL(m) and the fourth wirings S2(1) to S2(m) are connected to the circuit 213 for driving the fourth wirings and the fifth wirings.

Operation of the semiconductor device illustrated in FIG. 12 will be described. In this structure, data is written and read per row.

When data is written into the memory cells 200(i,1) to 200(i,n) of the i-th row, the first wiring potential Vs is set to 0 V; the fifth wiring WL(i) and the second wirings BL(1) to BL(n) are set to 0 V; and the fourth wiring S2(i) is set to 2 V. At this time, the transistor 202 is turned on. Among the third wirings S1(1) to S1(n), a column in which data "1" is to be written is set to 2 V and a column in which data "0" is to be written is set to 0 V. Note that at the end of the writing, before the potentials of the third wirings S1(1) to S1(n) are changed, the fourth wiring S2(i) is set to 0 V so that the transistor 202 is turned off. Moreover, a non-selected fifth wiring and a non-selected fourth wiring are set to 0 V.

As a result, the potential of the node (referred to as the node A) connected to the gate electrode of the transistor 201 in a memory cell to which data "1" has been written is set to approximately 2 V, and the potential of the node A in a memory cell to which data "0" has been written is set to approximately 0 V. The potential of the node A in a non-selected memory cell is not changed.

When data is read from the memory cells 200(i,1) to 200(i,n) of the i-th row, the first wiring potential Vs is set to 0 V; the fifth wiring WL(i) is set to 2 V; the fourth wiring S2(i) and the third wirings S1(1) to S1(n) are set to 0 V; and the reading circuit connected to the second wirings BL(1) to BL(n) is set to an operation state. The reading circuit can read data "0" or data "1" from the difference of the resistance state of the memory cell, for example Note that a non-selected fifth wiring and a non-selected fourth wiring are set to 0 V. Note that the second wiring at the time of the writing is set to 0 V; alternatively, it may be in a floating state or may be charged to have a potential higher than 0 V. The third wiring at the time of the reading is set to 0 V; alternatively, it may be in a floating state or may be charged to have a potential higher than 0 V.

Note that data "1" and data "0" are defined for convenience and may be reversed. Moreover, the above-described operation voltages are one example. The operation voltages are set so that the transistor 201 is turned off in the case of data "0" and turned on in the case of data "1", the transistor 202 is turned on at the time of writing and turned off in periods except the time of writing, and the transistor 203 is turned on at the time of reading. In particular, the power supply potential VDD of a peripheral logic circuit may be used instead of 2 V.

Next, another example of a circuit configuration and operation of the storage element according to one embodiment of the present invention will be described.

Figure 13:
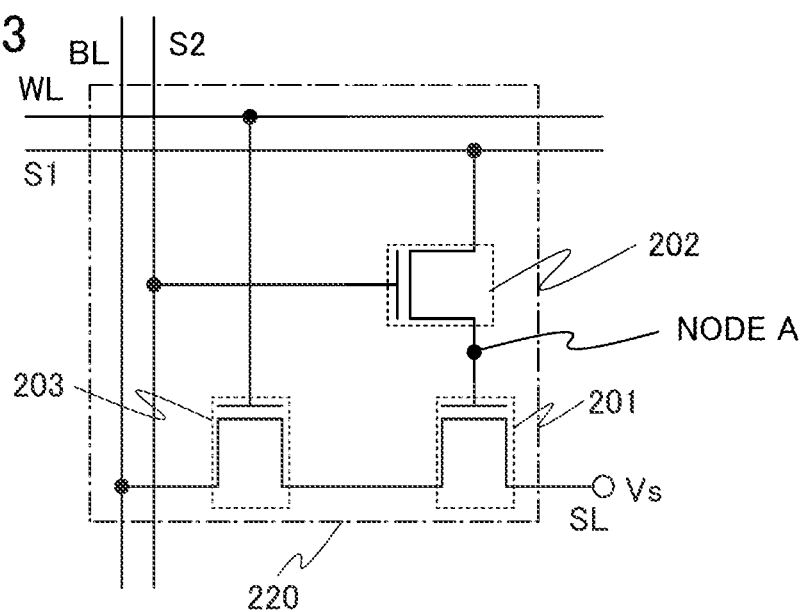
FIG. 13 is a circuit diagram of a storage element.

FIG. 13 illustrates an example of a memory cell circuit included in a semiconductor device. A memory cell 220 illustrated in FIG. 13 includes the first wiring SL, the second wiring BL, the third wiring S1, the fourth wiring S2, the fifth wiring WL, the transistor 201 (the first transistor), the transistor 202 (the second transistor), and the transistor 203 (the third transistor). The transistors 201 and 203 are formed using a material other than an oxide semiconductor. The transistor 202 is formed using an oxide semiconductor.

In the circuit of the memory cell 220 in FIG. 13, the directions of the third wiring and the fourth wiring are different from those in the circuit of the memory cell 200 in FIG. 10. In other words, in the circuit of the memory cell 220 in FIG. 13, the third wiring is placed in the direction of the fifth wiring (in the row direction) and the fourth wiring is placed in the direction of the second wiring (in the column direction).

A gate electrode of the transistor 201 and one of a source electrode and a drain electrode of the transistor 202 are electrically connected to each other. The first wiring and a source electrode of the transistor 201 are electrically connected to each other. A drain electrode of the transistor 201 and a source electrode of the transistor 203 are electrically connected to each other. The second wiring and a drain electrode of the transistor 203 are electrically connected to each other. The third wiring and the other of the source electrode and the drain electrode of the transistor 202 are electrically connected to each other. The fourth wiring and a gate electrode of the transistor 202 are electrically connected to each other. The fifth wiring and a gate electrode of the transistor 203 are electrically connected to each other.

Figure 14:
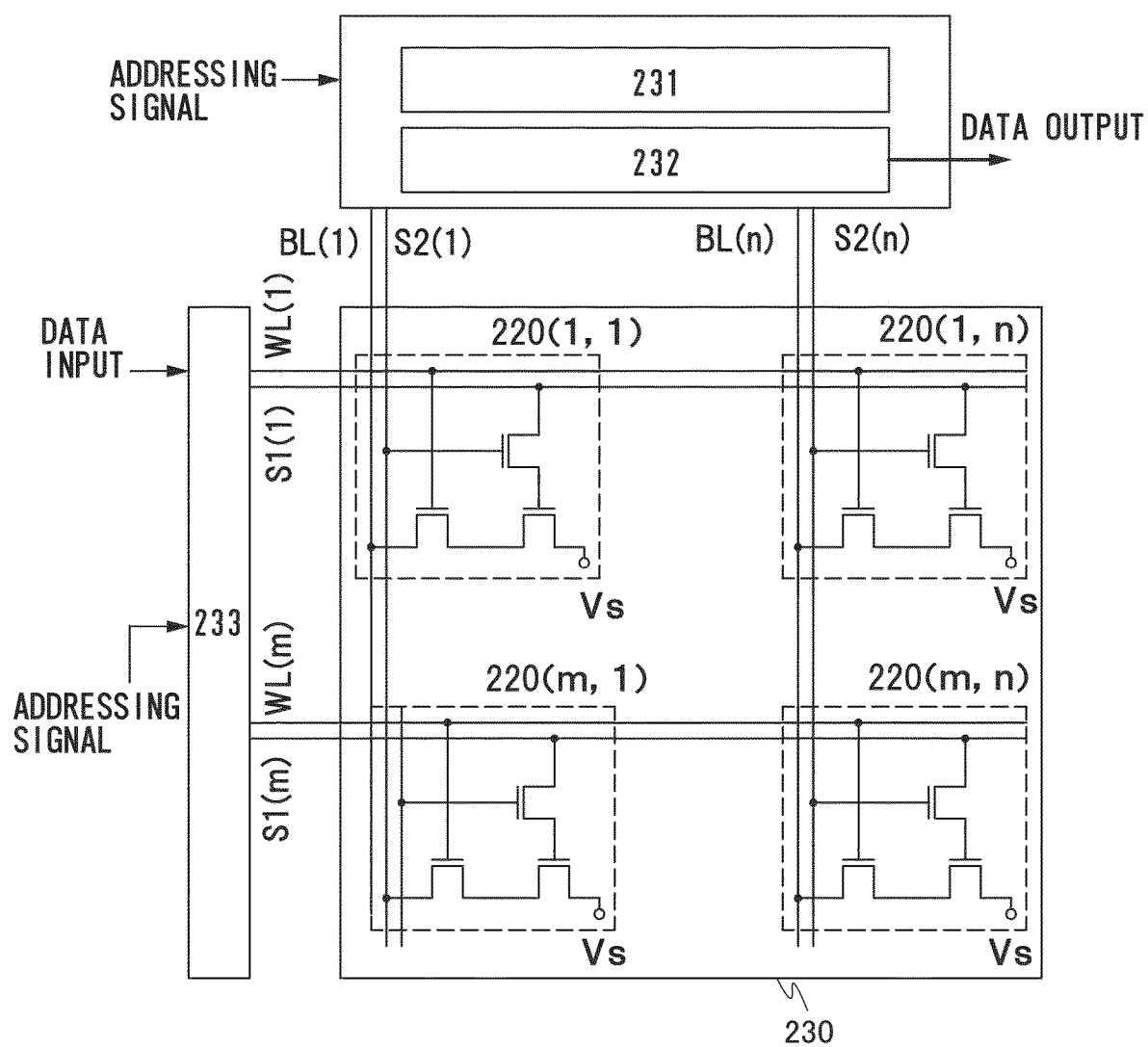
FIG. 14 is a circuit diagram of a semiconductor device.

The circuit operation of the memory cell 220 in FIG. 13 is similar to that of the memory cell 200 in FIG. 10; therefore, the detailed description is not repeated. FIG. 14 is a block circuit diagram of a semiconductor device with a storage capacity of (m×n) bits according to one embodiment of the present invention.

The semiconductor device according to one embodiment of the present invention includes m third wirings, m fifth wirings, n second wirings, n fourth wirings, a memory cell array 230 in which a plurality of memory cells 220(1,1) to 220(m,n) are arranged in a matrix of m rows by n columns (m and n are each a natural number), and peripheral circuits such as a circuit 231 for driving the second wirings and the fourth wirings, a circuit 233 for driving the third wirings and the fifth wirings, and a reading circuit 232. As another peripheral circuit, a refresh circuit or the like may be provided.

In the semiconductor device in FIG. 14, the directions of the third wiring and the fourth wiring are different from those in the semiconductor device in FIG. 12. In other words, in the semiconductor device in FIG. 14, the third wiring is placed in the direction of the fifth wiring (in the row direction) and the fourth wiring is placed in the direction of the second wiring (in the column direction).

The memory cell 220(i,j) is considered as a typical example of the memory cells. Here, the memory cell 220(i,j) (i is an integer of 1 to m and j is an integer of 1 to n) is connected to the second wiring BL(j), the fourth wiring S2(j), the fifth wiring WL(i), the third wiring S1(i), and the first wiring. The first wiring potential Vs is supplied to the first wiring. The second wirings BL(1) to BL(n) and the fourth wirings S2(1) to S2(n) are connected to the circuit 231 for driving the second wirings and the fourth wirings and the reading circuit 232. The fifth wirings WL(1) to WL(m) and the third wirings S1(1) to S1(m) are connected to the circuit 233 for driving the third wirings and the fifth wirings.

Operation of the semiconductor device illustrated in FIG. 14 will be described. In this structure, data is written per column and read per row.

When data is written into the memory cells 220(1,j) to 220(m,j) of the j-th column, the first wiring potential Vs is set to 0 V; the fifth wirings WL(1) to WL(m) and the second wiring BL(j) are set to 0 V; and the fourth wiring S2(j) is set to 2 V. Among the third wirings S1(1) to S1(m), a row in which data "1" is to be written is set to 2 V and a row in which data "0" is to be written is set to 0 V. Note that at the end of the writing, before the potentials of the third wirings S1(1) to S1(m) are changed, the fourth wiring S2(j) is set to 0 V so that the transistor 202 is turned off. Moreover, a non-selected second wiring and a non-selected fourth wiring are set to 0 V.

As a result, the potential of the node (referred to as the node A) connected to the gate electrode of the transistor 201 in a memory cell to which data "1" has been written is set to approximately 2 V, and the potential of the node A in a memory cell to which data "0" has been written is set to approximately 0 V. The potential of the node A in a non-selected memory cell is not changed.

When data is read from the memory cells 200(i,1) to 200(i,n) of the i-th row, the first wiring is set to 0 V; the fifth wiring WL(i) is set to 2 V; the fourth wirings S2(1) to S2(n) and the third wiring S1(i) are set to 0 V; and the reading circuit connected to the second wirings BL(1) to BL(n) is set to an operation state. The reading circuit can read data "0" or data "1" from the difference of the resistance state of the memory cell, for example Note that a non-selected fifth wiring and a non-selected third wiring are set to 0 V. Note that the second wiring at the time of the writing is set to 0 V; alternatively, it may be in a floating state or may be charged to have a potential higher than 0 V. The third wiring at the time of the reading is set to 0 V; alternatively, it may be in a floating state or may be charged to have a potential higher than 0 V.

Note that data "1" and data "0" are defined for convenience and may be reversed. Moreover, the above-described operation voltages are one example. The operation voltages are set so that the transistor 201 is turned off in the case of data "0" and turned on in the case of data "1", the transistor 202 is turned on at the time of writing and turned off in periods except the time of writing, and the transistor 203 is turned on at the time of reading. In particular, the power supply potential VDD of a peripheral logic circuit may be used instead of 2 V.

Since the off-state current of a transistor including an oxide semiconductor is extremely low, stored data can be retained for an extremely long time by using the transistor. In other words, power consumption can be adequately reduced because refresh operation becomes unnecessary or the frequency of refresh operation can be extremely low. Moreover, stored data can be retained for a long time even when power is not supplied.

Further, high voltage is not needed to write data, and deterioration of the element does not become a problem. Furthermore, data is written depending on the on state and the off state of the transistor, whereby high-speed operation can be easily realized. In addition, there is no need of operation for erasing data, which is necessary in a flash memory and the like.

Since a transistor including a material other than an oxide semiconductor can operate at sufficiently high speed, stored data can be read out at high speed by using the transistor.

Embodiment 3

In this embodiment, an example of a circuit configuration and operation of a storage element that is different from those in Embodiment 2 will be described.

Figure 15:
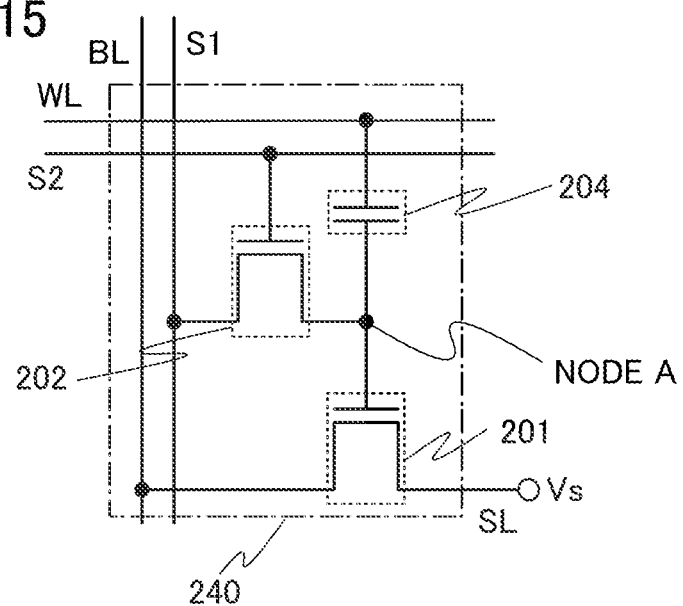
FIG. 15 is a circuit diagram of a storage element.

FIG. 15 illustrates an example of a circuit diagram of a memory cell included in a semiconductor device. A memory cell 240 illustrated in FIG. 15 includes the first wiring SL, the second wiring BL, the third wiring S1, the fourth wiring S2, the fifth wiring WL, the transistor 201 (the first transistor), the transistor 202 (the second transistor), and a capacitor 204. The transistor 201 is formed using a material other than an oxide semiconductor. The transistor 202 is formed using an oxide semiconductor.

A gate electrode of the transistor 201, one of a source electrode and a drain electrode of the transistor 202, and one of electrodes of the capacitor 204 are electrically connected to each other. The first wiring and a source electrode of the transistor 201 are electrically connected to each other. The second wiring and a drain electrode of the transistor 201 are electrically connected to each other. The third wiring and the other of the source electrode and the drain electrode of the transistor 202 are electrically connected to each other. The fourth wiring and a gate electrode of the transistor 202 are electrically connected to each other. The fifth wiring and the other of the electrodes of the capacitor 204 are electrically connected to each other.

Next, operation of the circuit will be specifically described.

When data is written into the memory cell 240, the first wiring, the fifth wiring, and the second wiring are set to 0 V and the fourth wiring is set to 2 V. The third wiring is set to 2 V in order to write data "1" and set to 0 V in order to write data "0". At this time, the transistor 202 is turned on. Note that at the end of the writing, before the potential of the third wiring is changed, the fourth wiring is set to 0 V so that the transistor 202 is turned off.

As a result, the potential of the node (referred to as the node A) connected to the gate electrode of the transistor 201 is set to approximately 2 V after the writing of the data "1" and set to approximately 0 V after the writing of the data "0".

When data is read from the memory cell 240, the first wiring, the fourth wiring, and the third wiring are set to 0 V; the fifth wiring is set to 2 V; and a reading circuit connected to the second wiring is set to an operation state. At this time, the transistor 202 is turned off.

The state of the transistor 201 in the case where the fifth wiring is set to 2 V will be described. The potential of the node A, which determines the state of the transistor 201, depends on a capacitance C1 between the fifth wiring and the node A and a capacitance C2 between the gate and the source and drain of the transistor 201.

Figure 16:
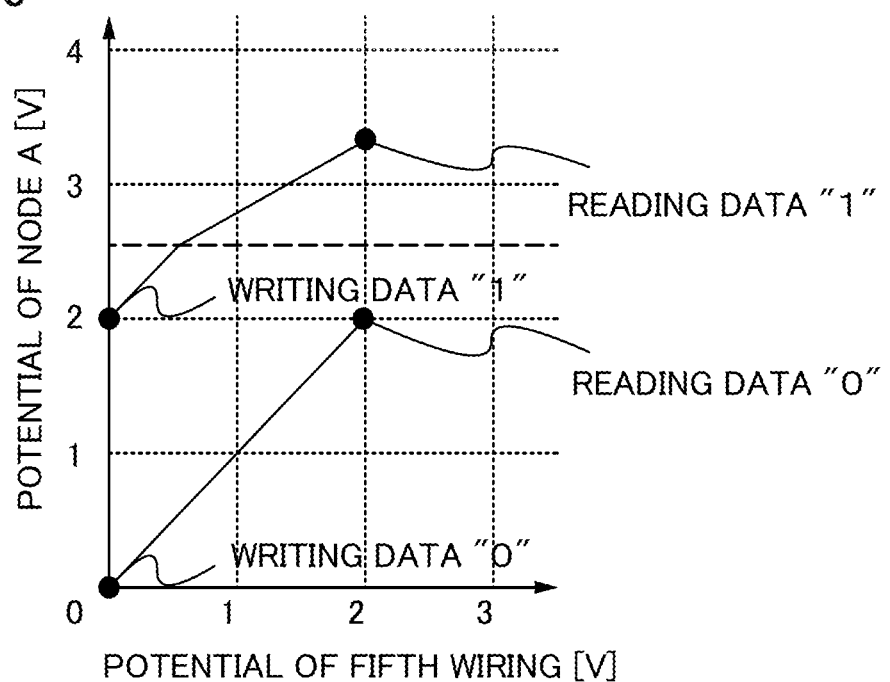
FIG. 16 illustrates a relation of potentials of a node A and a fifth wiring.

FIG. 16 illustrates a relation between the potential of the fifth wiring and the potential of the node A. Here, as an example, C1/C2>>1 is satisfied when the transistor 201 is off and C1/C2=1 is satisfied when the transistor 201 is on. The threshold voltage of the transistor 201 is 2.5 V. Under the condition where the fifth wiring is set to 2 V as in the graph illustrated in FIG. 16, the node A is set to approximately 2 V in the case where data "0" has been written, and the transistor 201 is off. On the other hand, the node A is set to approximately 3.25 V in the case where data "1" has been written, and the transistor 201 is on. The memory cell has a low resistance when the transistor 201 is on and has a high resistance when the transistor 201 is off. Therefore, the reading circuit can read data "0" or data "1" from the difference of the resistance state of the memory cell. Note that when data is not read out, that is, when the potential of the fifth wiring is 0 V, the node A is set to approximately 0 V in the case where data "0" has been written and set to approximately 2 V in the case where data "1" has been written, and the transistor 201 is off in both of the cases.

Note that the third wiring at the time of the reading is set to 0 V; alternatively, it may be in a floating state or may be charged to have a potential higher than 0 V. Data "1" and data "0" are defined for convenience and may be reversed.

The above-described operation voltages are one example. The potential of the third wiring at the time of writing can be selected from the potentials of data "0" and data "1" as long as the transistor 202 is turned off after the writing and the transistor 201 is off in the case where the potential of the fifth wiring is set to 0 V. The potential of the fifth wiring at the time of reading can be selected so that the transistor 201 is turned off in the case where data "0" has been written and is turned on in the case where data "1" has been written. Furthermore, the above-described threshold voltage of the transistor 201 is an example. The transistor 201 can have any threshold voltage as long as the above state of the transistor 201 is not changed.

Figure 17:
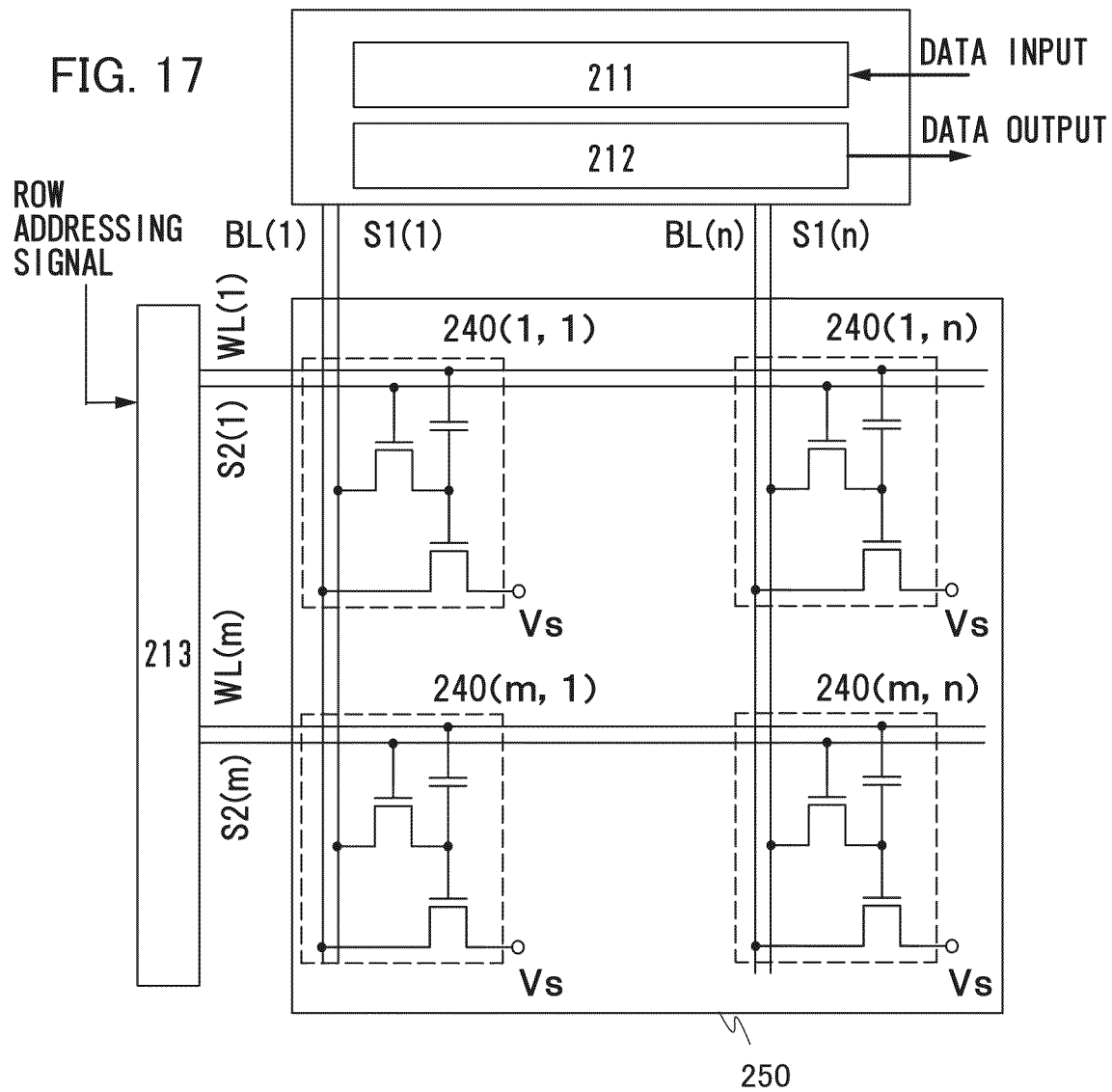
FIG. 17 is a circuit diagram of a semiconductor device.

A semiconductor device illustrated in FIG. 17 according to one embodiment of the present invention includes in fourth wirings, in fifth wirings, n second wirings, n third wirings, a memory cell array 250 in which a plurality of memory cells 240(1,1) to 240(m,n) are arranged in a matrix of in rows by n columns (in and n are each a natural number), and peripheral circuits such as the circuit 211 for driving the second wirings and the third wirings, the circuit 213 for driving the fourth wirings and the fifth wirings, and the reading circuit 212. As another peripheral circuit, a refresh circuit or the like may be provided.

The memory cell 240(i,j) is considered as a typical example of the memory cells. Here, the memory cell 240(i,j) (i is an integer of 1 to in and j is an integer of 1 to n) is connected to the second wiring BL(j), the third wiring S1(j), the fifth wiring WL(i), the fourth wiring S2(i), and the first wiring. The first wiring potential Vs is supplied to the first wiring. The second wirings BL(1) to BL(n) and the third wirings S1(1) to S1(n) are connected to the circuit 211 for driving the second wirings and the third wirings and the reading circuit 212. The fifth wirings WL(1) to WL(m) and the fourth wirings S2(1) to S2(m) are connected to the circuit 213 for driving the fourth wirings and the fifth wirings.

Operation of the semiconductor device illustrated in FIG. 17 will be described. In this structure, data is written and read per row.

When data is written into the memory cells 240(i,1) to 240(i,n) of the i-th row, the first wiring potential Vs is set to 0 V; the fifth wiring WL(i) and the second wirings BL(1) to BL(n) are set to 0 V; and the fourth wiring S2(i) is set to 2 V. At this time, the transistor 202 is turned on. Among the third wirings S1(1) to S1(n), a column in which data "1" is to be written is set to 2 V and a column in which data "0" is to be written is set to 0 V. Note that at the end of the writing, before the potentials of the third wirings S1(1) to S1(n) are changed, the fourth wiring S2(i) is set to 0 V so that the transistor 202 is turned off. Moreover, a non-selected fifth wiring and a non-selected fourth wiring are set to 0 V.

As a result, the potential of the node (referred to as the node A) connected to the gate electrode of the transistor 201 in a memory cell to which data "1" has been written is set to approximately 2 V, and the potential of the node A after data "0" is written is set to approximately 0 V. The potential of the node A in a non-selected memory cell is not changed.

When data is read from the memory cells 240(i,1) to 240(i,n) of the i-th row, the first wiring potential Vs is set to 0 V; the fifth wiring WL(i) is set to 2 V; the fourth wiring S2(i) and the third wirings S1(1) to S1(n) are set to 0 V; and the reading circuit connected to the second wirings BL(1) to BL(n) is set to an operation state. At this time, the transistor 202 is turned off. Note that a non-selected fifth wiring and a non-selected fourth wiring are set to 0 V.

The state of the transistor 201 at the time of reading will be described. Assuming that C1/C2>>1 is satisfied when the transistor 201 is off and C1/C2=1 is satisfied when the transistor 201 is on as has been described, the relation between the potential of the fifth wiring and the potential of the node A is represented by FIG. 16. The threshold voltage of the transistor 201 is 2.5 V. In non-selected memory cells, the potential of the fifth wiring is set to 0 V. Thus, the node A in a memory cell having data "0" is set to approximately 0 V and the node A in a memory cell having data "1" is set to approximately 2 V, and the transistor 201 is off in both of the cases. In the memory cells of the i-th row, the potential of the fifth wiring is set to 2 V. Thus, the node A in a memory cell having data "0" is set to approximately 2 V and the transistor 201 is off, whereas the node A in a memory cell having data "1" is set to approximately 3.25 V and the transistor 201 is on. The memory cell has a low resistance when the transistor 201 is on and has a high resistance when the transistor 201 is off. As a result, only a memory cell having data "0" has a low resistance among the memory cells of the i-th row. The reading circuit can read data "0" or data "1" depending on the difference of load resistance connected to the second wiring.

Note that the third wiring at the time of the reading is set to 0 V; alternatively, it may be in a floating state or may be charged to have a potential higher than 0 V. Data "1" and data "0" are defined for convenience and may be reversed.

The above-described operation voltages are one example. The potential of the third wiring at the time of writing can be selected from the potentials of data "0" and data "1" as long as the transistor 202 is turned off after the writing and the transistor 201 is off in the case where the potential of the fifth wiring is set to 0 V. The potential of the fifth wiring at the time of reading can be selected so that the transistor 201 is turned off in the case where data "0" has been written and is turned on in the case where data "1" has been written. Furthermore, the above-described threshold voltage of the transistor 201 is an example. The transistor 201 can have any threshold voltage as long as the above state of the transistor 201 is not changed.

Since the off-state current of a transistor including an oxide semiconductor is extremely low, stored data can be retained for an extremely long time by using the transistor. In other words, power consumption can be adequately reduced because refresh operation becomes unnecessary or the frequency of refresh operation can be extremely low. Moreover, stored data can be retained for a long time even when power is not supplied.

Further, high voltage is not needed to write data, and deterioration of the element does not become a problem. Furthermore, data is written depending on the on state and the off state of the transistor, whereby high-speed operation can be easily realized. In addition, there is no need of operation for erasing data, which is necessary in a flash memory and the like.

Since a transistor including a material other than an oxide semiconductor can operate at sufficiently high speed, stored data can be read out at high speed by using the transistor.

Next, another example of a circuit configuration and operation of the storage element according to one embodiment of the present invention will be described.

Figure 18:
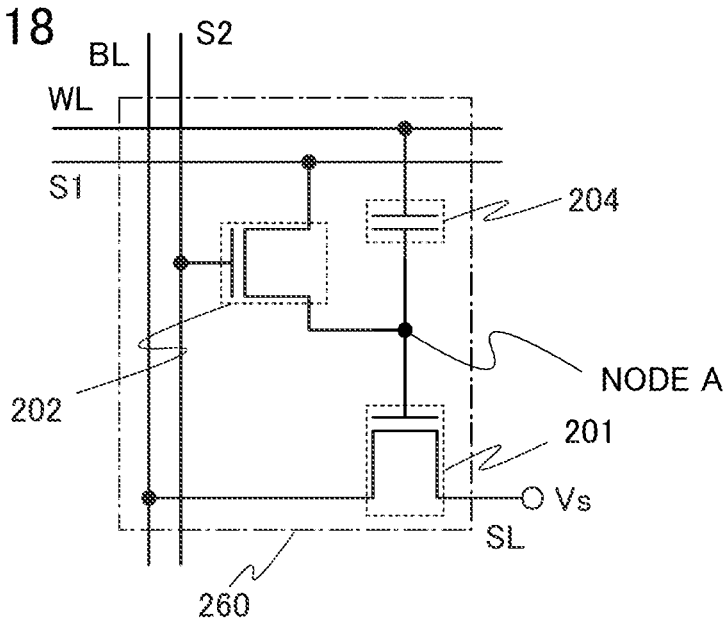
FIG. 18 is a circuit diagram of a storage element.

FIG. 18 illustrates an example of a memory cell circuit included in a semiconductor device. A memory cell 260 illustrated in FIG. 18 includes the first wiring SL, the second wiring BL, the third wiring S1, the fourth wiring S2, the fifth wiring WL, the transistor 201, the transistor 202, and the capacitor 204. The transistor 201 is formed using a material other than an oxide semiconductor. The transistor 202 is formed using an oxide semiconductor.

In the circuit of the memory cell 260 in FIG. 18, the directions of the third wiring and the fourth wiring are different from those in the circuit of the memory cell 240 in FIG. 15. That is, in the memory cell 260 in FIG. 18, the third wiring is placed in the direction of the fifth wiring (in the row direction) and the fourth wiring is placed in the direction of the second wiring (in the column direction).

A gate electrode of the transistor 201, one of a source electrode and a drain electrode of the transistor 202, and one electrode of the capacitor 204 are electrically connected to each other. The first wiring and a source electrode of the transistor 201 are electrically connected to each other. The second wiring and a drain electrode of the transistor 201 are electrically connected to each other. The third wiring and the other of the source electrode and the drain electrode of the transistor 202 are electrically connected to each other. The fourth wiring and a gate electrode of the transistor 202 are electrically connected to each other. The fifth wiring and the other electrode of the capacitor 204 are electrically connected to each other.

The circuit operation of the memory cell 260 in FIG. 18 is similar to that of the memory cell 240 in FIG. 15; therefore, the detailed description is not repeated.

Figure 19:
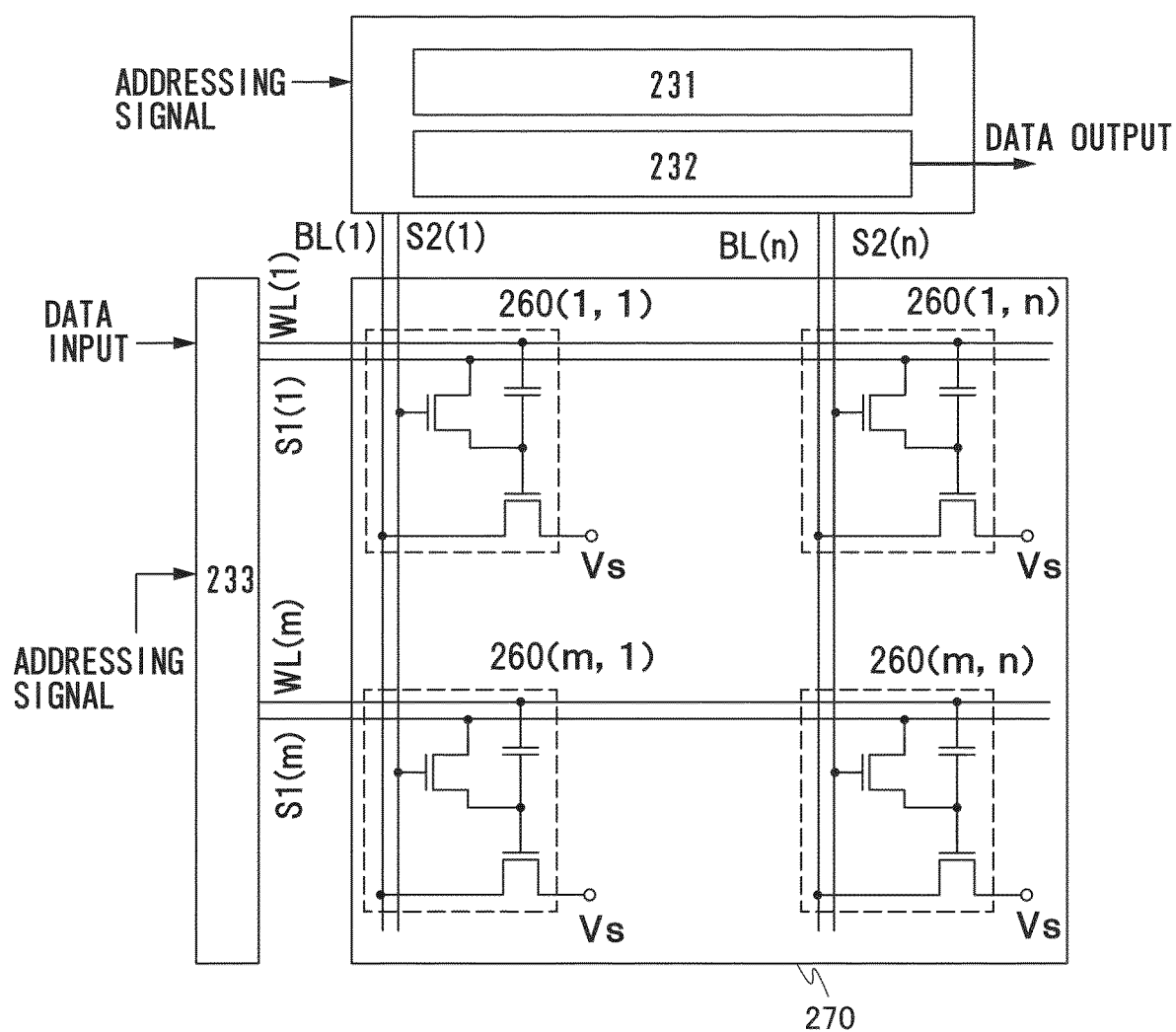
FIG. 19 is a circuit diagram of a semiconductor device.

FIG. 19 is a block circuit diagram of a semiconductor device with a storage capacity of (m×n) bits according to one embodiment of the present invention.

The semiconductor device according to one embodiment of the present invention includes in third wirings, in fifth wirings, n second wirings, n fourth wirings, a memory cell array 270 in which a plurality of memory cells 260(1,1) to 260(m,n) are arranged in a matrix of in rows by n columns (in and n are each a natural number), and peripheral circuits such as the circuit 231 for driving the second wirings and the fourth wirings, the circuit 233 for driving the third wirings and the fifth wirings, and the reading circuit 232. As another peripheral circuit, a refresh circuit or the like may be provided.

In the semiconductor device in FIG. 19, the directions of the third wiring and the fourth wiring are different from those in the semiconductor device in FIG. 17. That is, in the semiconductor device in FIG. 19, the third wiring is placed in the direction of the fifth wiring (in the row direction) and the fourth wiring is placed in the direction of the second wiring (in the column direction).

The memory cell 260(i,j) is considered as a typical example of the memory cells. Here, the memory cell 260(i,j) (i is an integer of 1 to m and j is an integer of 1 to n) is connected to the second wiring BL(j), the fourth wiring S2(i), the fifth wiring WL(i), the third wiring S1(i), and the first wiring. The first wiring potential Vs is supplied to the first wiring. The second wirings BL(1) to BL(n) and the fourth wirings S2(1) to S2(n) are connected to the circuit 231 for driving the second wirings and the fourth wirings and the reading circuit 232. The fifth wirings WL(1) to WL(m) and the third wirings S1(1) to S1(m) are connected to the circuit 233 for driving the third wirings and the fifth wirings.

The operation of the semiconductor device in FIG. 19 is similar to that of the semiconductor device in FIG. 17; therefore, the detailed description is not repeated.

Since the off-state current of a transistor including an oxide semiconductor is extremely low, stored data can be retained for an extremely long time by using the transistor. In other words, power consumption can be adequately reduced because refresh operation becomes unnecessary or the frequency of refresh operation can be extremely low. Moreover, stored data can be retained for a long time even when power is not supplied.

High voltage is not needed to write data, and deterioration of the element does not become a problem. Furthermore, data is written depending on the on state and the off state of the transistor, whereby high-speed operation can be easily realized. In addition, there is no need of operation for erasing data, which is necessary in a flash memory and the like.

Since a transistor including a material other than an oxide semiconductor can operate at sufficiently high speed, stored data can be read out at high speed by using the transistor.

Embodiment 4

In this embodiment, an example of a circuit configuration and operation of a storage element that is different from those in Embodiments 2 and 3 will be described.

Figure 20A:
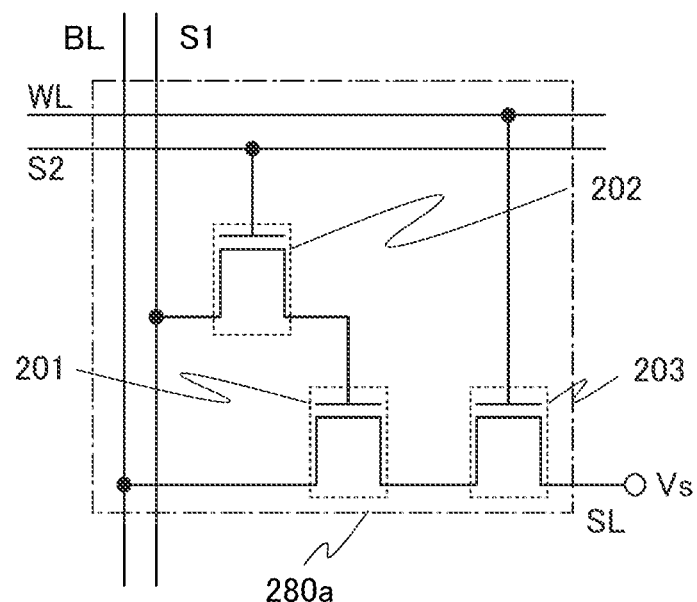
FIGS. 20A and 20B are circuit diagrams each illustrating a storage element.
Figure 20B:
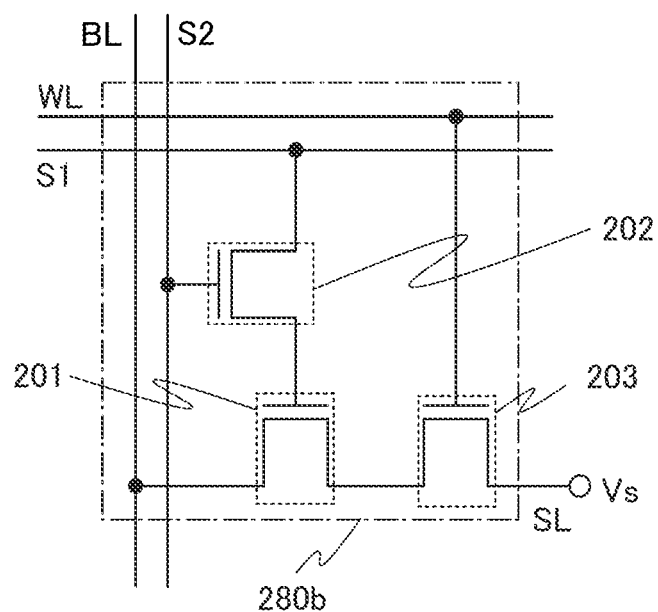

FIGS. 20A and 20B each illustrate an example of a circuit diagram of a memory cell included in a semiconductor device. In a memory cell 280a illustrated in FIG. 20A and a memory cell 280b illustrated in FIG. 20B, the first transistor and the third transistor that are connected in series are replaced with each other, as compared to those in the memory cell 200 in FIG. 10 and the memory cell 220 in FIG. 13, respectively.

In the memory cell 280a in FIG. 20A, a gate electrode of the transistor 201 and one of a source electrode and a drain electrode of the transistor 202 are electrically connected to each other. The first wiring and a source electrode of the transistor 203 are electrically connected to each other. A drain electrode of the transistor 203 and a source electrode of the transistor 201 are electrically connected to each other. The second wiring and a drain electrode of the transistor 201 are electrically connected to each other. The third wiring and the other of the source electrode and the drain electrode of the transistor 202 are electrically connected to each other. The fourth wiring and a gate electrode of the transistor 202 are electrically connected to each other. The fifth wiring and a gate electrode of the transistor 203 are electrically connected to each other.

In the memory cell 280b in FIG. 20B, the directions of the third wiring and the fourth wiring are different from those in the memory cell circuit in FIG. 20A. In other words, in the memory cell circuit in FIG. 20B, the fourth wiring is placed in the direction of the second wiring (in the column direction) and the third wiring is placed in the direction of the fifth wiring (in the row direction).

The circuit operations of the memory cell 280a in FIG. 20A and the memory cell 280b in FIG. 20B are similar to those of the memory cell 200 in FIG. 10 and the memory cell 220 in FIG. 13, respectively; therefore, the detailed description is not repeated.

Embodiment 5

In this embodiment, an example of a circuit configuration and operation of a storage element that is different from those in Embodiments 2 to 4 will be described.

Figure 21:
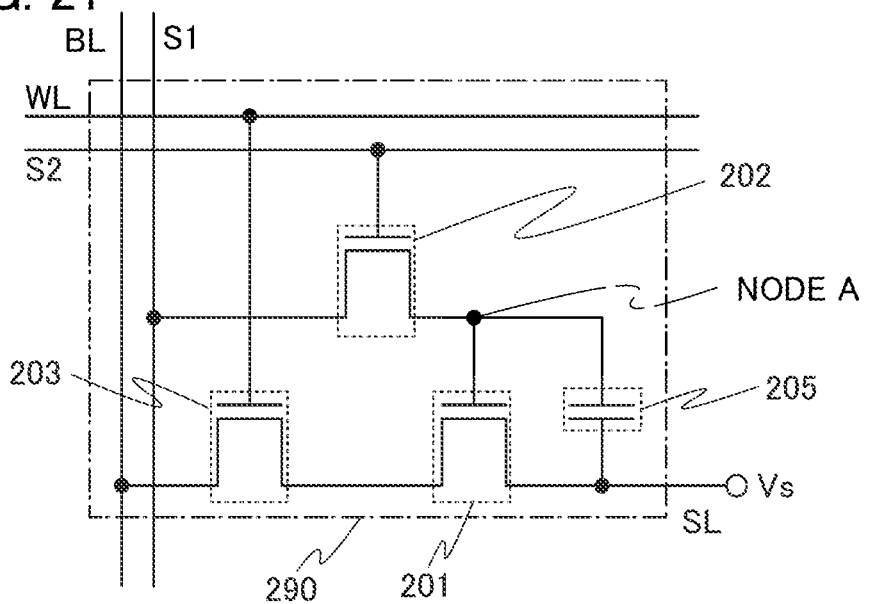
FIG. 21 is a circuit diagram of a storage element.

FIG. 21 illustrates an example of a circuit diagram of a memory cell included in a semiconductor device. A circuit of a memory cell 290 in FIG. 21 additionally includes a capacitor between the node A and the first wiring as compared to the memory cell 200 in FIG. 10.

The memory cell 290 illustrated in FIG. 21 includes the first wiring SL, the second wiring BL, the third wiring S1, the fourth wiring S2, the fifth wiring WL, the transistor 201, the transistor 202, the transistor 203, and a capacitor 205. The transistors 201 and 203 are formed using a material other than an oxide semiconductor. The transistor 202 is formed using an oxide semiconductor.

A gate electrode of the transistor 201, one of a source electrode and a drain electrode of the transistor 202, and one electrode of the capacitor 205 are electrically connected to each other. The first wiring, a source electrode of the transistor 201, and the other electrode of the capacitor 205 are electrically connected to each other. A drain electrode of the transistor 201 and a source electrode of the transistor 203 are electrically connected to each other. The second wiring and a drain electrode of the transistor 203 are electrically connected to each other. The third wiring and the other of the source electrode and the drain electrode of the transistor 202 are electrically connected to each other. The fourth wiring and a gate electrode of the transistor 202 are electrically connected to each other. The fifth wiring and a gate electrode of the transistor 203 are electrically connected to each other.

The operation of the memory cell circuit in FIG. 21 is similar to that of the memory cell circuit in FIG. 10; therefore, the detailed description is not repeated. When the memory cell includes the capacitor 205, data retention characteristics are improved.

Embodiment 6

An example of a reading circuit included in a semiconductor device according to one embodiment of the present invention will be described with reference to FIG. 22.

Figure 22:
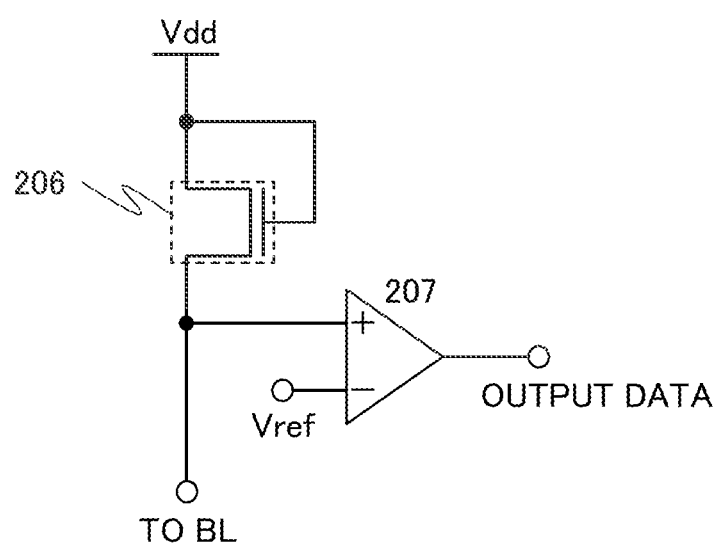
FIG. 22 is a circuit diagram of a reading circuit.

A reading circuit illustrated in FIG. 22 includes a transistor 206 and a differential amplifier 207.

At the time of reading, a terminal A is connected to a second wiring connected to a memory cell from which data is read. Moreover, a bias voltage Vbias is applied to a gate electrode of the transistor 206, and a predetermined current flows through the transistor 206.

A memory cell has a different resistance corresponding to data "1" or data "0" stored therein. Specifically, when the transistor 201 in a selected memory cell is on, the memory cell has a low resistance; whereas when the transistor 201 in a selected memory cell is off, the memory cell has a high resistance.

When the memory cell has a high resistance, the potential of the terminal A is higher than a reference potential Vref and data "1" is output from an output of the differential amplifier. On the other hand, when the memory cell has a low resistance, the potential of the terminal A is lower than the reference potential Vref and data "0" is output from the output of the differential amplifier.

In such a manner, the reading circuit can read data from the memory cell. Note that the reading circuit in this embodiment is an example, and a known circuit may be used. For example, the reading circuit may include a precharge circuit. A second wiring for reference may be connected instead of the reference potential Vref. A latch sense amplifier may be used instead of the differential amplifier.

Embodiment 7

In this embodiment, examples of electronic devices each including the semiconductor device according to any of the above-described embodiments will be described with reference to FIGS. 23A to 23F. The semiconductor device according to the above embodiment can retain data even when power is not supplied. Moreover, degradation due to writing or erasing does not occur. Furthermore, the semiconductor device can operate at high speed. For these reasons, an electronic device with a novel structure can be provided by using the semiconductor device. Note that the semiconductor devices according to the above embodiment are integrated and mounted on a circuit board or the like, and placed inside an electronic device.

Figure 23A:
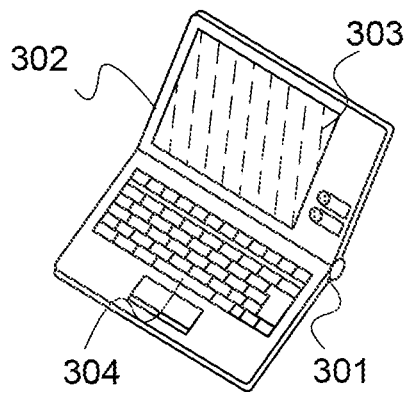
FIGS. 23A to 23F each illustrate an electronic device.

FIG. 23A illustrates a notebook personal computer including the semiconductor device according to the above embodiment. The notebook personal computer includes a main body 301, a housing 302, a display portion 303, a keyboard 304, and the like. The semiconductor device according to one embodiment of the present invention is applied to a notebook personal computer, whereby the notebook personal computer can hold data even when power is not supplied. Moreover, degradation due to writing or erasing does not occur. Further, the notebook personal computer can operate at high speed. For these reasons, it is preferable to apply the semiconductor device according to one embodiment of the present invention to a notebook personal computer.

Figure 23D:
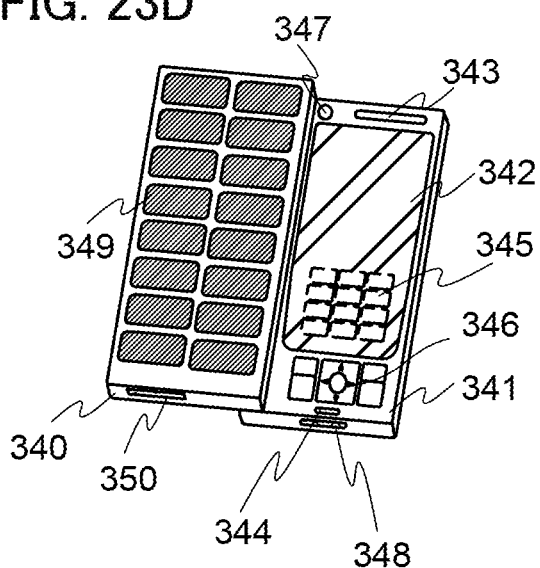
Figure 23B:
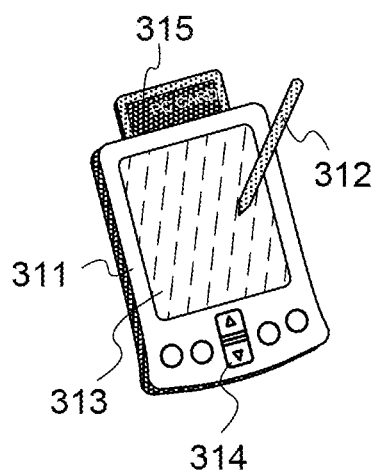

FIG. 23B illustrates a personal digital assistant (PDA) including the semiconductor device according to the above embodiment. A main body 311 is provided with a display portion 313, an external interface 315, operation buttons 314, and the like. A stylus 312 that is an accessory is used for operating the PDA. The semiconductor device according to one embodiment of the present invention is applied to a PDA, whereby the PDA can hold data even when power is not supplied. Moreover, degradation due to writing or erasing does not occur. Further, the PDA can operate at high speed. For these reasons, it is preferable to apply the semiconductor device according to one embodiment of the present invention to a PDA.

Figure 23E:
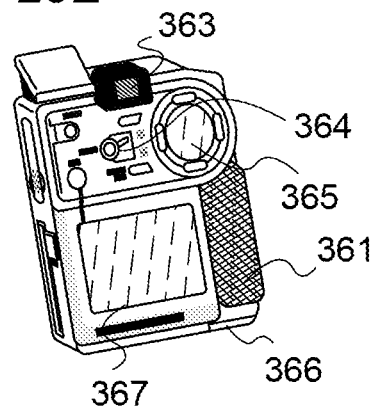
Figure 23C:
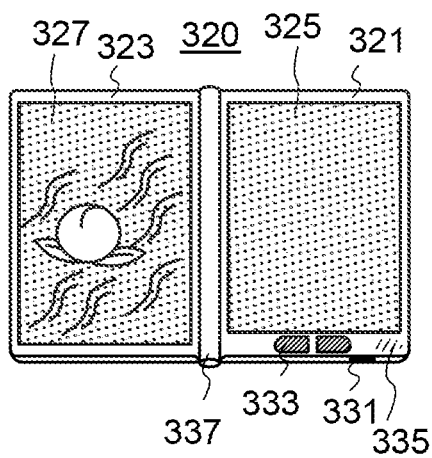

FIG. 23C illustrates an e-book reader 320 as an example of electronic paper including the semiconductor device according to the above embodiment. The e-book reader 320 includes two housings: a housing 321 and a housing 323. The housing 321 and the housing 323 are combined with a hinge 337 so that the e-book reader 320 can be opened and closed with the hinge 337 as an axis. With such a structure, the e-book reader 320 can be used like a paper book. The semiconductor device according to one embodiment of the present invention is applied to electronic paper, whereby the electronic paper can hold data even when power is not supplied. Moreover, degradation due to writing or erasing does not occur. Further, the electronic paper can operate at high speed. For these reasons, it is preferable to apply the semiconductor device according to one embodiment of the present invention to electronic paper.

A display portion 325 is incorporated in the housing 321 and a display portion 327 is incorporated in the housing 323. The display portion 325 and the display portion 327 may display one image or different images. When the display portion 325 and the display portion 327 display different images, for example, the right display portion (the display portion 325 in FIG. 23C) can display text and the left display portion (the display portion 327 in FIG. 23C) can display images.

FIG. 23C illustrates an example in which the housing 321 is provided with an operation portion and the like. For example, the housing 321 is provided with a power switch 331, operation keys 333, a speaker 335, and the like. Pages can be turned with the operation key 333. Note that a keyboard, a pointing device, or the like may also be provided on the surface of the housing, on which the display portion is provided. Furthermore, an external connection terminal (e.g., an earphone terminal, a USB terminal, or a terminal that can be connected to various cables such as an AC adapter and a USB cable), a recording medium insertion portion, and the like may be provided on the back surface or the side surface of the housing. Further, the e-book reader 320 may have a function of an electronic dictionary.

The e-book reader 320 may send and receive data wirelessly. Through wireless communication, desired book data or the like can be purchased and downloaded from an electronic book server.

Note that electronic paper can be applied to devices in a variety of fields as long as they display information. For example, electronic paper can be used for posters, advertisement in vehicles such as trains, display in a variety of cards such as credit cards, and the like in addition to e-book readers.

FIG. 23D illustrates a mobile phone including the semiconductor device according to the above embodiment. The mobile phone includes two housings: a housing 340 and a housing 341. The housing 341 is provided with a display panel 342, a speaker 343, a microphone 344, a pointing device 346, a camera lens 347, an external connection terminal 348, and the like. The housing 340 is provided with a solar cell 349 for charging the mobile phone, an external memory slot 350, and the like. In addition, an antenna is incorporated in the housing 341. The semiconductor device according to one embodiment of the present invention is applied to a mobile phone, whereby the mobile phone can hold data even when power is not supplied. Moreover, degradation due to writing or erasing does not occur. Further, the mobile phone can operate at high speed. For these reasons, it is preferable to apply the semiconductor device according to one embodiment of the present invention to a mobile phone.

The display panel 342 has a touch panel function. A plurality of operation keys 345 displayed as images are shown by dashed lines in FIG. 23D. Note that the mobile phone includes a booster circuit for boosting a voltage output from the solar cell 349 to a voltage necessary for each circuit. Moreover, the mobile phone can include a contactless IC chip, a small recording device, or the like in addition to the above structure.

The direction of display on the display panel 342 is changed as appropriate depending on applications. Further, the camera lens 347 is provided on the same surface as the display panel 342, so that the mobile phone can be used as a videophone. The speaker 343 and the microphone 344 can be used for videophone calls, recording and playing sound, and the like as well as voice calls. Moreover, the housings 340 and 341 in a state where they are developed as illustrated in FIG. 23D can be slid so that one is lapped over the other. Therefore, the size of the mobile phone can be reduced, which makes the mobile phone suitable for being carried.

The external connection terminal 348 can be connected to a variety of cables such as an AC adapter or a USB cable, so that the mobile phone can be charged or can perform data communication. Moreover, the mobile phone can store and move a larger amount of data by inserting a recording medium into the external memory slot 350. Further, the mobile phone may have an infrared communication function, a television reception function, or the like in addition to the above functions.

FIG. 23E illustrates a digital camera including the semiconductor device according to the above embodiment. The digital camera includes a main body 361, a display portion (A) 367, an eyepiece portion 363, an operation switch 364, a display portion (B) 365, a battery 366, and the like. The semiconductor device according to one embodiment of the present invention is applied to a digital camera, whereby the digital camera can hold data even when power is not supplied. Moreover, degradation due to writing or erasing does not occur. Further, the digital camera can operate at high speed. For these reasons, it is preferable to apply the semiconductor device according to one embodiment of the present invention to a digital camera.

Figure 23F:
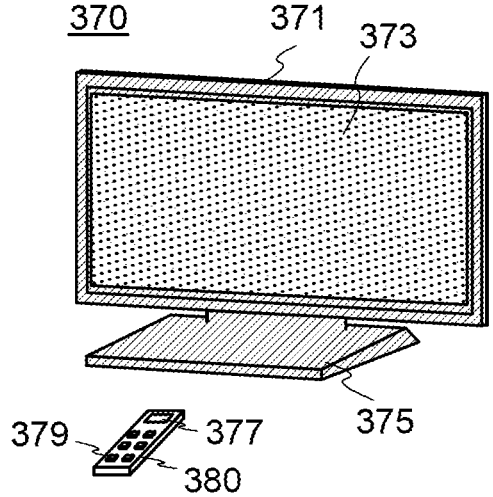

FIG. 23F illustrates a television set including the semiconductor device according to the above embodiment. In a television set 370, a display portion 373 is incorporated in a housing 371. Images can be displayed on the display portion 373. Here, the housing 371 is supported by a stand 375.

The television set 370 can be operated by an operation switch of the housing 371 or a separate remote controller 380. With operation keys 379 of the remote controller 380, channels and volume can be controlled and images displayed on the display portion 373 can be controlled. Moreover, the remote controller 380 may include a display portion 377 for displaying data output from the remote controller 380. The semiconductor device according to one embodiment of the present invention is applied to a television set, whereby the television set can hold data even when power is not supplied. Moreover, degradation due to writing or erasing does not occur. Furthermore, the television set can operate at high speed. For these reasons, it is preferable to apply the semiconductor device according to one embodiment of the present invention to a television set.

Note that the television set 370 is preferably provided with a receiver, a modem, and the like. A general television broadcast can be received with the receiver. Moreover, when the television set is connected to a communication network with or without wires via the modem, one-way (from a sender to a receiver) or two-way (between a sender and a receiver or between receivers) data communication can be performed.

The structures and methods described in this embodiment can be combined as appropriate with any of the structures and methods described in the other embodiments.

This application is based on Japanese Patent Application serial No. 2009-251261 filed with Japan Patent Office on Oct. 30, 2009, the entire contents of which are hereby incorporated by reference.

The invention claimed is:

1. A semiconductor device comprising:
a first transistor; and
a second transistor,
wherein a channel formation region of the first transistor comprises silicon,
wherein a channel formation region of the second transistor comprises an oxide semiconductor,
wherein a first insulating layer is provided over the channel formation region of the first transistor,
wherein a first gate electrode of the first transistor is provided over the first insulating layer,
wherein the first gate electrode of the first transistor is electrically connected to one of a source and a drain of the second transistor via a first opening in a second insulating layer, a second opening in a third insulating layer, a third opening in a fourth insulating layer, a fourth opening in a fifth insulating layer, a fifth opening in the fifth insulating layer, and a sixth opening in the fourth insulating layer,
wherein the one of the source and the drain of the second transistor is in contact with a top surface of a layer which comprises the oxide semiconductor,
wherein a second gate electrode of the second transistor is provided below the channel formation region of the second transistor, and
wherein, in a cross-sectional view, the layer which comprises the oxide semiconductor extends beyond an end portion of the second gate electrode.

2. The semiconductor device according to claim 1, wherein the second gate electrode of the second transistor is provided on the second insulating layer.

3. The semiconductor device according to claim 1, wherein the oxide semiconductor comprises indium, gallium, and zinc.

4. The semiconductor device according to claim 1,
wherein a conductor electrically connected to the channel formation region of the second transistor extends beyond an end portion of the fifth opening and the sixth opening, and
wherein the conductor overlaps with the first gate electrode of the first transistor.

5. A semiconductor device comprising:
a first transistor; and
a second transistor,
wherein a channel formation region of the first transistor comprises silicon,
wherein a channel formation region of the second transistor comprises an oxide semiconductor,
wherein a first insulating layer is provided over the channel formation region of the first transistor,
wherein a first gate electrode of the first transistor is provided over the first insulating layer,
wherein the first gate electrode of the first transistor is electrically connected to one of a source and a drain of the second transistor,
wherein the one of the source and the drain of the second transistor is in contact with a top surface of a layer which comprises the oxide semiconductor,
wherein a second gate electrode of the second transistor is provided below the channel formation region of the second transistor, and
wherein, in a cross-sectional view, the layer which comprises the oxide semiconductor extends beyond an end portion of the second gate electrode.

6. The semiconductor device according to claim 5, wherein the second gate electrode of the second transistor is provided on a second insulating layer provided over the first gate electrode.

7. The semiconductor device according to claim 5, wherein the oxide semiconductor comprises indium, gallium, and zinc.

8. A semiconductor device comprising:
a first transistor; and
a second transistor,
wherein a channel formation region of the first transistor comprises silicon,
wherein a channel formation region of the second transistor comprises an oxide semiconductor,
wherein a first insulating layer is provided over the channel formation region of the first transistor,
wherein a first gate electrode of the first transistor is provided over the first insulating layer,
wherein the first gate electrode of the first transistor is electrically connected to one of a source and a drain of the second transistor,
wherein a second insulating layer is in contact with a side surface of a layer which comprises the oxide semiconductor and a top surface of the layer which comprises the oxide semiconductor,
wherein a first opening and a second opening are provided in the second insulating layer,
wherein a second gate electrode of the second transistor is provided below the channel formation region of the second transistor, and
wherein, in a cross-sectional view, the layer which comprises the oxide semiconductor extends beyond an end portion of the second gate electrode.

9. The semiconductor device according to claim 8, wherein the second gate electrode of the second transistor is provided on a third insulating layer provided over the first gate electrode.

10. The semiconductor device according to claim 8, wherein the oxide semiconductor comprises indium, gallium, and zinc.

11. The semiconductor device according to claim 8,
wherein a third insulating layer is provided over the second insulating layer,
wherein a conductor is provided over the third insulating layer, and
wherein the conductor overlaps with the first gate electrode of the first transistor, the first opening, and the second opening.

12. A semiconductor device comprising:
a first transistor; and
a second transistor,
wherein a channel formation region of the first transistor comprises silicon,
wherein a channel formation region of the second transistor comprises an oxide semiconductor,
wherein a first insulating layer is provided over the channel formation region of the first transistor,
wherein a first gate electrode of the first transistor is provided over the first insulating layer,
wherein the first gate electrode of the first transistor is electrically connected to one of a source and a drain of the second transistor via a first opening in a second insulating layer, a second opening in a third insulating layer, a third opening in a fourth insulating layer, a fourth opening in a fifth insulating layer, a fifth opening in the fifth insulating layer, and a sixth opening in the fourth insulating layer, wherein the fourth insulating layer is in contact with a side surface of a layer which comprises the oxide semiconductor and a top surface of the layer which comprises the oxide semiconductor, wherein a second gate electrode of the second transistor is provided below the channel formation region of the second transistor, and wherein, in a cross-sectional view, the layer which comprises the oxide semiconductor extends beyond an end portion of the second gate electrode.

13. The semiconductor device according to claim 12, wherein the second gate electrode of the second transistor is provided on the second insulating layer.

14. The semiconductor device according to claim 12, wherein the oxide semiconductor comprises indium, gallium, and zinc.

15. The semiconductor device according to claim 12, wherein a conductor electrically connected to the channel formation region of the second transistor extends beyond an end portion of the fifth opening and the sixth opening, and wherein the conductor overlaps with the first gate electrode of the first transistor.

\* \* \* \* \*